United States Patent
Kim et al.

(10) Patent No.: US 12,032,223 B2
(45) Date of Patent: Jul. 9, 2024

(54) LENS DRIVING DEVICE CAPABLE OF IMPROVING CONVENIENCE AND INHIBITING DEFORMATION OF AN ELASTIC MEMBER, AND CAMERA MODULE AND OPTICAL DEVICE INCLUDING SAME

(71) Applicant: LG INNOTEK CO., LTD., Seoul (KR)

(72) Inventors: Hyun Soo Kim, Seoul (KR); Byung Wook Son, Seoul (KR); Sang Jun Min, Seoul (KR); Sang Ok Park, Seoul (KR); Seong Min Lee, Seoul (KR); Tae Jin Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 667 days.

(21) Appl. No.: 17/275,579

(22) PCT Filed: Sep. 19, 2019

(86) PCT No.: PCT/KR2019/012130
§ 371 (c)(1),
(2) Date: Mar. 11, 2021

(87) PCT Pub. No.: WO2020/060219
PCT Pub. Date: Mar. 26, 2020

(65) Prior Publication Data
US 2021/0364732 A1    Nov. 25, 2021

(30) Foreign Application Priority Data

Sep. 21, 2018  (KR) .................. 10-2018-0113576
Jul. 1, 2019    (KR) .................. 10-2019-0078585
Jul. 12, 2019   (KR) .................. 10-2019-0084339

(51) Int. Cl.
H04N 5/335   (2011.01)
G02B 7/09    (2021.01)
(Continued)

(52) U.S. Cl.
CPC ................ *G02B 7/09* (2013.01); *G03B 5/04* (2013.01); *G03B 17/12* (2013.01);
(Continued)

(58) Field of Classification Search
None
See application file for complete search history.

(56) References Cited

U.S. PATENT DOCUMENTS 9,955,086 B2 * 4/2018 Park .................... G03B 3/10
2009/0303621 A1 12/2009 Sue et al.
(Continued)

FOREIGN PATENT DOCUMENTS

CN   101223000 A   7/2008
CN   106067939 A   11/2016
(Continued)

*Primary Examiner* — Gary C Vieaux
(74) *Attorney, Agent, or Firm* — Birch, Stewart, Kolasch & Birch, LLP

(57) ABSTRACT

An embodiment comprises: a housing; a bobbin disposed in the hosing; a first coil disposed in the bobbin; a magnet disposed opposite to the first coil in the housing; a base disposed under the housing; a lower elastic member comprising a first elastic member and a second elastic member coupled to the bobbin and disposed on the base; a second coil disposed in the base so as to generate an inductive voltage by interaction with the first coil; and a first terminal and a second terminal arranged in the base and spaced apart from the first and second elastic members, wherein one end of the first coil is coupled to the first elastic member, the other end of the first coil is coupled to the second elastic member, one end of the second coil is coupled to the first terminal, and the other end of the second coil is coupled to the second terminal.

18 Claims, 43 Drawing Sheets

(51) Int. Cl.
*G03B 5/04* (2021.01)
*G03B 17/12* (2021.01)
*H02K 41/035* (2006.01)
*H04N 23/54* (2023.01)
*H04N 23/55* (2023.01)

(52) U.S. Cl.
CPC ......... *H02K 41/0354* (2013.01); *H04N 23/54* (2023.01); *H04N 23/55* (2023.01); *G03B 2205/0007* (2013.01); *G03B 2205/0069* (2013.01)

(56) References Cited

U.S. PATENT DOCUMENTS

| | | | |
|---|---|---|---|
| 2016/0011394 A1 | 1/2016 | Cho et al. | |
| 2016/0316121 A1* | 10/2016 | Park | H04N 23/55 |
| 2017/0146773 A1 | 5/2017 | Park | |

FOREIGN PATENT DOCUMENTS

| | | | |
|---|---|---|---|
| CN | 108474924 A | 8/2018 |
| JP | 2001-188155 A | 7/2001 |
| JP | 5784483 B2 | 9/2015 |
| KR | 10-2008-0046627 A | 5/2008 |
| KR | 10-2015-0101676 A | 9/2015 |
| KR | 10-2016-0019217 A | 2/2016 |
| KR | 10-2016-0126587 A | 11/2016 |
| KR | 10-2017-0024671 A | 3/2017 |
| KR | 10-2018-0010471 A | 1/2018 |
| KR | 10-2018-0010472 A | 1/2018 |
| KR | 10-2018-0037690 A | 4/2018 |
| KR | 10-2018-0037691 A | 4/2018 |

* cited by examiner

1

LENS DRIVING DEVICE CAPABLE OF IMPROVING CONVENIENCE AND INHIBITING DEFORMATION OF AN ELASTIC MEMBER, AND CAMERA MODULE AND OPTICAL DEVICE INCLUDING SAME

CROSS REFERENCE TO RELATED APPLICATIONS

This application is the National Phase of PCT International Application No. PCT/KR2019/012130, filed on Sep. 19, 2019, which claims priority under 35 U.S.C. 119(a) to Patent Application Nos. 10-2018-0113576, filed in the Republic of Korea on Sep. 21, 2018; 10-2019-0078585, filed in the Republic of Korea on Jul. 1, 2019; and 10-2019-0084339, filed in the Republic of Korea on Jul. 12, 2019, all of which are hereby expressly incorporated by reference into the present application.

TECHNICAL FIELD

Embodiments relate to a lens moving apparatus, and a camera module and optical instrument including the same.

BACKGROUND ART

It is difficult to apply technology of a voice coil motor (VCM) used in existing general camera modules to a subminiature, low-power camera module, and therefore research related thereto has been actively conducted.

Demand for and production of electronic products, such as smartphones and mobile phones equipped with cameras, have increased. A camera for mobile phones is on a trend of increased resolution and miniaturization. As a result, an actuator has also been miniaturized, increased in diameter, and increased in functionality. In order to realize a high-resolution camera for mobile phones, improvement in performance of the camera for mobile phones and additional functions thereof, such as autofocus, handshake compensation, and zooming, are required.

DISCLOSURE

Technical Problem

Embodiments provide a lens moving apparatus capable of improving convenience in soldering and inhibiting deformation of an elastic member and a camera module and optical instrument including the same.

In addition, embodiments provide a lens moving apparatus capable of preventing the occurrence of electrical short circuit between a terminal of a lower elastic member and a sensing coil, a camera module, and an optical instrument including the same.

In addition, embodiments provide a lens moving apparatus capable of preventing the number of turns of a sensing coil from being limited by spatial interference with terminals disposed on a base, a camera module, and an optical instrument including the same.

Technical Solution

In one embodiment, a lens moving apparatus includes a bobbin, a first coil coupled to the bobbin, a magnet opposite the first coil, a base disposed spaced apart from the bobbin, a lower elastic member coupled to the bobbin, the lower elastic member including a first elastic member and a second elastic member disposed on the base, a second coil disposed on the base, the second coil being configured to generate induced voltage through interaction with the first coil, and a first terminal and a second terminal coupled to the base, the first terminal and the second terminal being spaced apart from the first and second elastic members, wherein one end of the first coil is coupled to the first elastic member while the other end of the first coil is coupled to the second elastic member, and one end of the second coil is coupled to the first terminal while the other end of the second coil is coupled to the second terminal.

Each of the first and second terminals may include a first portion exposed from an upper surface of the base and a second portion connected to the first portion, the second portion being bent in a lateral direction of the base, and one end of the second coil may be coupled to the first portion of the first terminal while the other end of the second coil may be coupled to the second portion of the second terminal.

Each of the first and second elastic members may include an inner portion coupled to a lower portion of the bobbin, an outer portion coupled to a lower portion of the housing, a connection portion configured to connect the inner portion and the outer portion to each other, and a connection terminal connected to the outer portion, the connection terminal being disposed on a first outer surface of the base.

The second portion of the first terminal and the second portion of the second terminal may be disposed on the first outer surface of the base.

The second coil may be disposed between the base and the lower elastic member.

The base may be provided in an outer surface thereof with a recess, and the second coil may be disposed in the recess of the base.

The first portion of each of the first and second terminals may include a first region overlapping the second coil in an optical-axis direction and a second region not overlapping the second coil in the optical-axis direction.

The second portion of the first terminal and the second portion of the second terminal may be disposed between the connection terminal of the first elastic member and the connection terminal of the second elastic member.

The lens moving apparatus may further include a first solder configured to couple the second region of the first terminal and one end of the second coil to each other and a second solder configured to couple the second region of the second terminal and the other end of the second coil to each other.

Each of the first and second terminals may further include a bent portion configured to connect the first portion and the second portion to each other, and the bent portion may be disposed in the base.

In another embodiment, a lens moving apparatus includes a bobbin, a first coil coupled to the bobbin, a magnet opposite the first coil, a base disposed spaced apart from the bobbin, a lower elastic member including a first elastic member and a second elastic member coupled to the bobbin, a second coil coupled to the base, and a first terminal and a second terminal coupled to the base, the first terminal and the second terminal being spaced apart from the first and second elastic members, wherein one end of the first coil is coupled to the first elastic member while the other end of the first coil is coupled to the second elastic member, one end of the second coil is coupled to the first terminal while the other end of the second coil is coupled to the second terminal, the first elastic member includes a first connection terminal, the second elastic member includes a second connection terminal, and the first terminal, the second terminal, the first connection terminal, and the second connection terminal are disposed on a first side portion of the base.

The second coil may include a shape corresponding to the shape of the first coil.

The second coil may be larger than the outer diameter of the bobbin, and may be disposed under the bobbin.

In a further embodiment, a lens moving apparatus includes a base, a bobbin disposed on the base, a first coil coupled to the bobbin, a magnet opposite the first coil, a second coil disposed on the base, the second coil being configured to generate induced voltage through interaction with the first coil, and a first terminal and a second terminal coupled to the base, wherein one end of the second coil is coupled to the first terminal while the other end of the second coil is coupled to the second terminal.

Advantageous Effects

According to embodiments, it is possible to improve convenience in soldering and to inhibit deformation of an elastic member.

In addition, according to embodiments, it is possible to prevent the occurrence of electrical short circuit between a terminal of a lower elastic member and a sensing coil.

In addition, according to embodiments, it is possible to prevent the number of turns of a sensing coil from being limited by spatial interference with terminals disposed on a base.

BEST MODE

Figure 1:
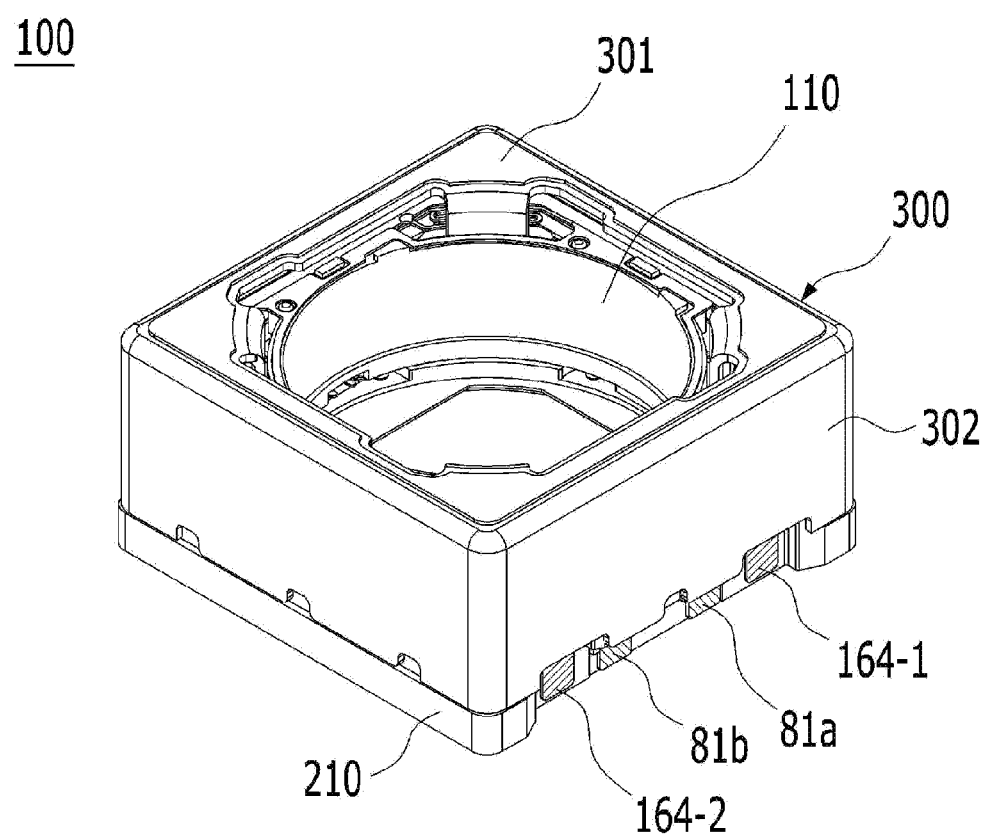
FIG. 1 is a perspective view of a lens moving apparatus according to an embodiment.

Reference will now be made in detail to embodiments, examples of which are illustrated in the accompanying drawings.

However, the technical idea of the disclosure is not limited to the embodiments described below but may be embodied in various other forms, and one or more components may be selectively coupled or substituted between embodiments within the scope of the technical idea of the disclosure.

In addition, terms, (including technical and scientific terms) used in embodiments have the same meanings as those commonly understood by a person having ordinary skill in the art to which the disclosure pertains, unless otherwise defined, and it will be further understood that commonly used terms, such as those defined in dictionaries, should be interpreted as having meanings consistent with their meanings in the context of the relevant art.

In addition, the terms used in embodiments are provided to explain embodiments, but are not intended to restrict the disclosure. In this specification, a singular representation may include a plural representation unless otherwise defined, and in the case in which "at least one (or one or more) of A, B, and C" is described, one or more of all combinations constituted by A, B, and C may be included.

Also, in describing the components of the disclosure, terms such as "first," "second," "A," "B," "(a)," and "(b)" may be used. These terms are used only for the purpose of distinguishing one constituent from another, and the terms do not limit the nature, order or sequence of the components.

When one component is said to be "connected," "coupled," or "linked" to another, this may mean not only that the one component is directly connected, coupled, or linked to the other one but also that the one component is "connected," "coupled," or "linked" to the other one via yet another component interposed therebetween. In addition, it will be understood that when an element is referred to as being "on" or "under" another element, it can be directly on/under the element, and one or more intervening elements may also be present. When an element is referred to as being "on" or "under," "under the element" as well as "on the element" can be included based on the element.

"Autofocus" means automatically focusing a subject to form an image of the subject on the surface of an image sensor. A lens moving apparatus according to an embodiment may perform an autofocus operation to move an optical module including at least one lens in a first direction.

Also, in the following description, the term "terminal" may refer to a pad, an electrode, a conductive layer, or a bonding portion.

For convenience of description, a lens moving apparatus according to an embodiment will be described using a Cartesian coordinate system (x, y, z). However, other different coordinate systems may be used, and the disclosure is not limited thereto. In the drawings, an x-axis direction and a y-axis direction are directions perpendicular to a z-axis direction, which is an optical-axis direction. The z-axis direction, which is the optical-axis direction, may also be referred to as a "first direction," the x-axis direction may also be referred to as a "second direction," and the y-axis direction may also be referred to as a "third direction."

An "autofocus apparatus" is an apparatus that automatically focuses a subject to form an image of the subject on the surface of an image sensor. A handshake compensation apparatus and an autofocus apparatus may be variously configured. A lens moving apparatus according to an embodiment may perform an autofocus operation to move an optical module including at least one lens in a first direction parallel to an optical axis.

Figure 2:
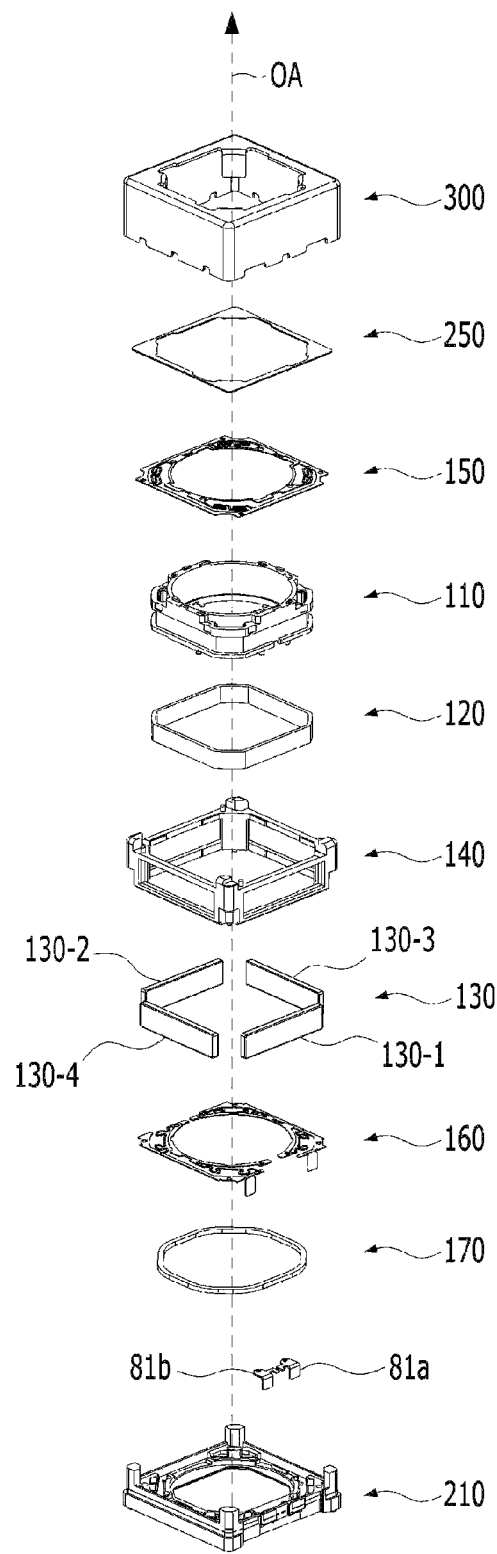
FIG. 2 is an exploded perspective view of the lens moving apparatus shown in FIG. 1.
Figure 3:
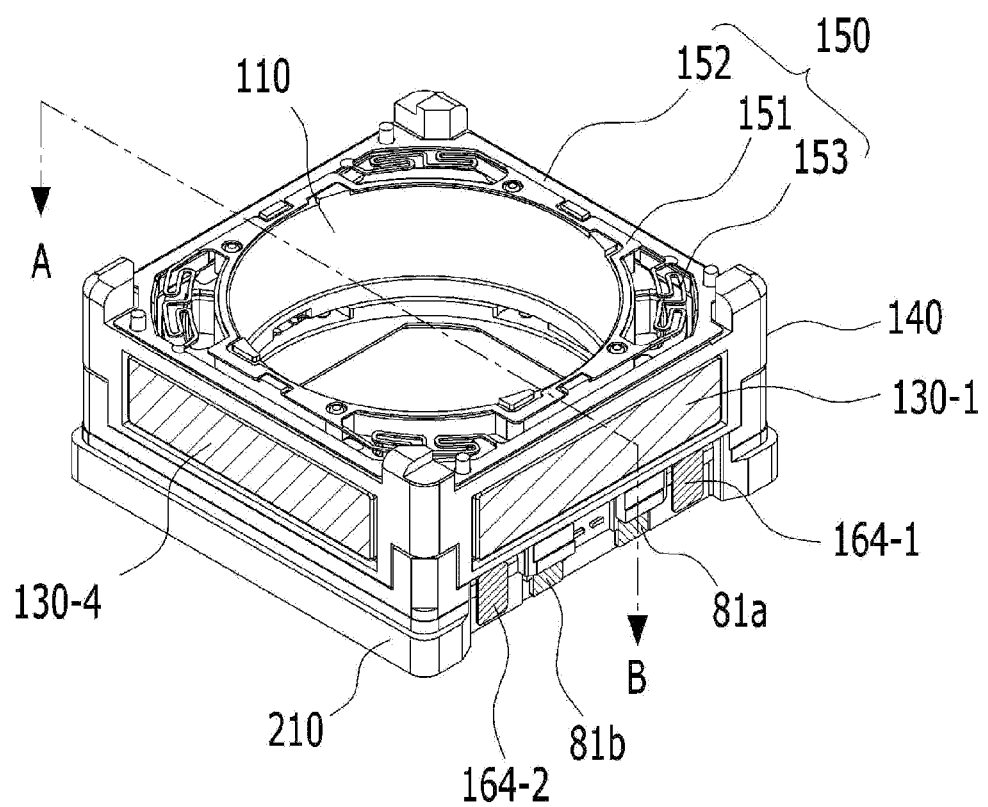
FIG. 3 is a coupled perspective view of the lens moving apparatus of FIG. 1 with a cover member removed.

FIG. 1 is a perspective view of a lens moving apparatus 100 according to an embodiment, FIG. 2 is an exploded perspective view of the lens moving apparatus 100 shown in FIG. 1, and FIG. 3 is a coupled perspective view of the lens moving apparatus 100 of FIG. 1 with a cover member 300 removed.

Referring to FIGS. 1 to 3, the lens moving apparatus 100 may include a bobbin 110, a first coil 120, a magnet 130, a housing 140, a base 210, a second coil 170, a first terminal 81a, and a second terminal 81b.

In addition, the lens moving apparatus 100 may further include at least one of an upper elastic member 150, a lower elastic member 160, and a cover member 300. In addition, the lens moving apparatus 100 may further include an electromagnetic blocking unit 250.

First, the cover member 300 will be described.

The cover member 300 may receive the bobbin 110, the first coil 120, the magnet 130, the housing 140, the upper elastic member 150, the lower elastic member 160, the second coil 170, and the first and second terminals 81a and 81b in a receiving space formed together with the base 210.

The cover member 300 may be formed in the shape of a box, the lower portion of which is open and which includes an upper plate 301 and side plates 302. The lower ends of the side plates 302 of the cover member 300 may be coupled to stairs 211 of the base 210. When viewed from above, the shape of the upper plate 301 of the cover member 300 may be polygonal, for example, quadrangular or octagonal.

The cover member 300 may be provided in the upper plate 301 thereof with an opening (or a hollow portion), through which a lens (not shown) coupled to the bobbin 110 is exposed to external light.

The cover member 300 may be made of a nonmagnetic material, such as SUS, in order to prevent a phenomenon in which the magnet 130 attracts the cover member. Alternatively, the cover member may be made of a magnetic material so as to perform the function of a yoke.

Next, the bobbin 110 will be described.

Figure 4A:
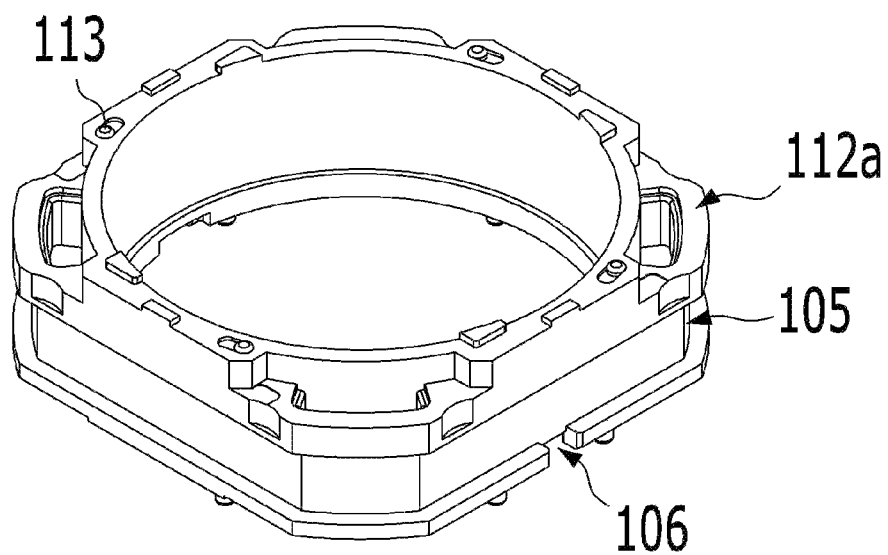
FIG. 4A is a first perspective view of a bobbin shown in FIG. 2.
Figure 4B:
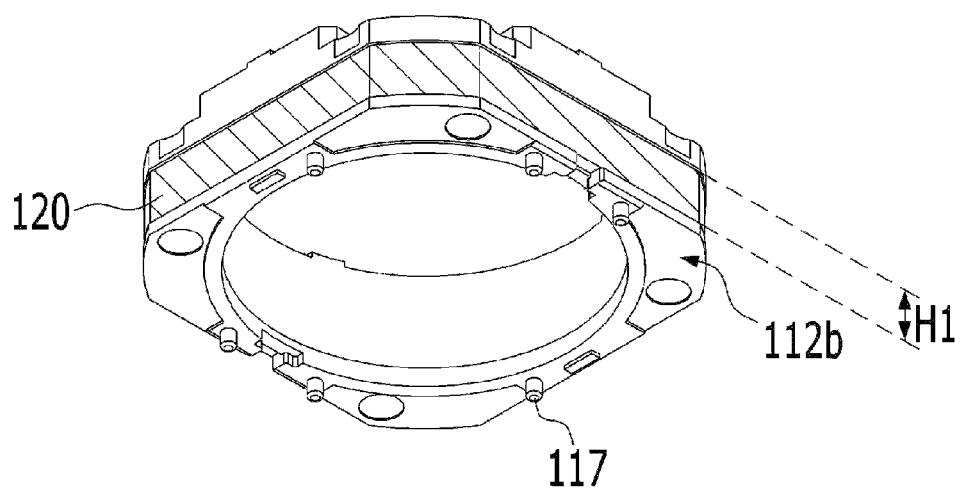
FIG. 4B is a coupled perspective view of the bobbin and a first coil shown in FIG. 2.

FIG. 4A is a first perspective view of the bobbin 110 shown in FIG. 2, and FIG. 4B is a coupled perspective view of the bobbin 110 and the first coil 120 shown in FIG. 2.

Referring to FIGS. 4A and 4B, the bobbin 110 may be disposed inside the housing 140, and may be moved in an optical-axis (OA) direction or a direction parallel to the optical axis as the result of electromagnetic interaction between the first coil 120 and the magnet 130.

The bobbin 110 may have an opening or a hollow portion, in which a lens or a lens barrel is mounted. The shape of the opening (or the hollow portion) of the bobbin 110 may coincide with the shape of the lens or the lens barrel mounted therein, and may be circular, oval, or polygonal. However, the disclosure is not limited thereto. For example, the opening of the bobbin 110 may be a through-hole formed through the bobbin 110 in the optical-axis direction.

The lens or the lens module may be directly coupled to the inner surface of the bobbin 110. However, the disclosure is not limited thereto. For example, the bobbin 110 may include a lens barrel (not shown), in which at least one lens is installed, and the lens barrel may be coupled to the inner surface of the bobbin 110 in various manners. For example, a screw thread for coupling with the lens or the lens module may be provided in the inner surface of the bobbin 110.

The bobbin 110 may be provided at the upper surface, the upper portion, or the upper end thereof with at least one first coupling portion 113 configured to be coupled and fixed to an inner frame 151 of the upper elastic member 150.

The bobbin 110 may be provided at the lower surface, the lower portion, or the lower end thereof with at least one second coupling portion 117 configured to be coupled and fixed to an inner frame 161 of the lower elastic member 160.

For example, in FIGS. 4A and 4B, each of the first coupling portion 113 and the second coupling portion 117 of the bobbin 110 is a protrusion. However, the disclosure is not limited thereto. In another embodiment, at least one of the first and second coupling portions of the bobbin 110 may be a coupling recess or a flat surface.

A first escape recess 112a may be provided in a region of the upper surface of the bobbin 110 corresponding to or aligned with a first frame connection portion 153 of the upper elastic member 150.

In addition, a second escape recess 112b may be provided in a region of the lower surface of the bobbin 110 corresponding to or aligned with a second frame connection portion 163 of the lower elastic member 160.

When the bobbin 110 is moved in a first direction, spatial interference between the first and second frame connection portions 153 and 163 and the bobbin 110 may be avoided by the first escape recess 112a and the second escape recess 112b of the bobbin 110, whereby the first and second frame connection portions 153 and 163 of the upper and lower elastic members 150 and 160 may be more easily elastically deformed.

In another embodiment, the first frame connection portion of the upper elastic member and the bobbin may be designed so as not to interfere with each other, and the first escape recess and/or the second escape recess may not be provided in the bobbin.

The bobbin 110 may be provided in the outer surface thereof with at least one recess 105, in which the first coil 120 is disposed.

The first coil 120 may be disposed or seated in the recess 105 of the bobbin 110. Alternatively, the first coil 120 may be directly wound or turned in the recess 105 of the bobbin 110 so as to be rotated in the clockwise direction or in the counterclockwise direction based on the optical axis (OA).

The shape and number of recesses 105 of the bobbin 110 may correspond to the shape and number of coils disposed on the outer surface of the bobbin 110. In another embodiment, the bobbin 110 may have no recess in which the coil is seated, and the first coil 120 may be directly wound or turned around the outer circumferential surface of the bobbin 110 having no recess so as to be fixed thereto.

The bobbin 110 may be provided in the lower end of the outer surface thereof with a recess 106, through which the start line or the end line of the first coil extends.

Next, the first coil 120 will be described.

The first coil 120 may be disposed on the bobbin 110, may be coupled or connected to the bobbin 110, or may be supported by the bobbin 110. For example, the first coil 120 may be disposed on the outer surface of the bobbin 110 and performs electromagnetic interaction with the magnet 130 disposed on the housing 140.

In order to generate electromagnetic force due to interaction with the magnet 130, power or a driving signal may be applied to the first coil 120.

In order to generate induced voltage due to mutual induction with the second coil 170, the driving signal provided to the first coil 120 may include an alternating-current signal or may include an alternating-current signal and a direct-current signal.

For example, the alternating-current signal provided to the first coil 120 may be a sinusoidal signal or a pulse signal (for example, a pulse width modulation (PWM) signal). For example, the driving signal may have the form of current or voltage.

The bobbin 110 elastically supported by the upper and lower elastic members 150 and 160 may be moved in the optical-axis direction or the first direction by electromagnetic force due to electromagnetic interaction between the first coil 120 and the magnet 130.

The driving signal provided to the first coil 120 may be controlled, whereby movement of the bobbin 110 in the first direction may be controlled, and therefore an autofocus function may be performed.

The first coil 120 may be disposed so as to wrap the outer surface of the bobbin 110 so as to be rotated about the optical axis in the clockwise direction or the counterclockwise direction. For example, the first coil 120 may be disposed or wound in the recess 105 provided in the outer surface of the bobbin 110.

For example, the first coil 120 may have a closed-curved shape or a ring shape.

In another embodiment, the first coil 120 may be realized in the form of a coil ring wound about an axis perpendicular to the optical axis in the clockwise direction or the counterclockwise direction, and the number of coil rings may be equal to the number of magnets 130. However, the disclosure is not limited thereto.

The first coil 120 may be connected to at least one of the upper and lower elastic members 150 and 160. A driving signal may be applied to the first coil 120 through at least one of the upper and lower elastic members 150 and 160. For example, a driving signal may be provided to the first coil 120 through first and second elastic members 160-1 and 160-2.

Next, the housing 140 will be described.

Figure 5A:
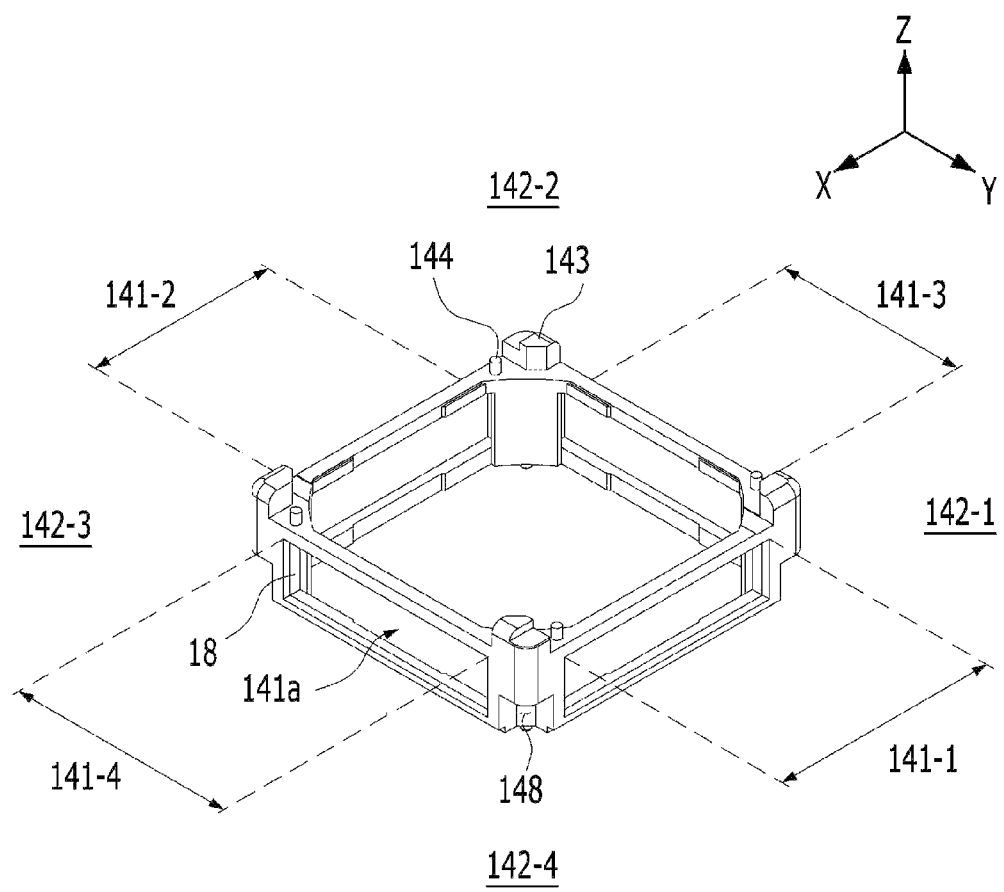
FIG. 5A is a perspective view of a housing shown in FIG. 2.
Figure 5B:
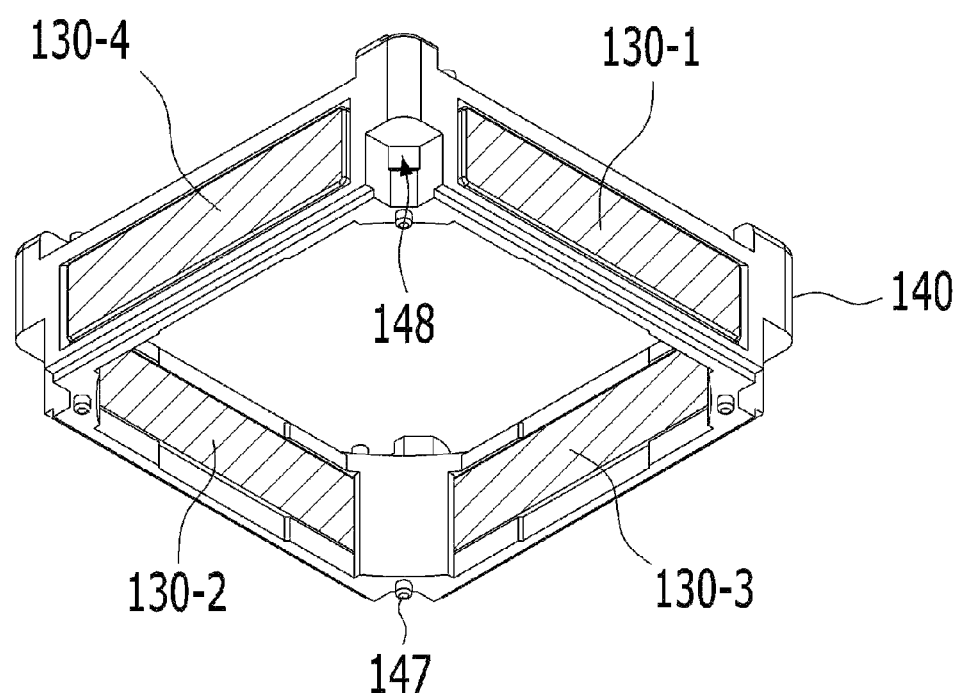
FIG. 5B is a coupled perspective view of the housing and a magnet.

FIG. 5A is a perspective view of the housing 140 shown in FIG. 2, and FIG. 5B is a coupled perspective view of the housing 140 and the magnet 130.

Referring to FIGS. 5A and 5B, the housing 140 supports the magnet 130, and receives the bobbin 110 therein such that the bobbin 110 can be moved in the first direction.

The housing 140 may generally have a hollow pillar shape.

The housing 140 may be provided with an opening (or a hollow portion) in which the bobbin 110 is received, and the opening of the housing 140 may be a through-hole formed through the housing 130 in the optical-axis direction.

The housing 140 may include side portions (or "first side portions") 141-1 to 141-4 and corner portions (or "second side portions") 142-1 to 142-4.

For example, the housing 140 may include a plurality of side portions 141-1 to 141-4 and a plurality of corner portions 142-1 to 142-4 disposed so as to form a polygonal (e.g. quadrangular or octagonal) or circular opening. Here, the corner portions of the housing 140 may also be referred to as "pillar portions."

For example, the housing 140 may include first side portions 141 spaced apart from each other and second side portions 142 spaced apart from each other.

For example, the side portions 141-1 to 141-4 of the housing 140 may be disposed on positions corresponding to the side plates 302 of the cover member 300, and corresponding ones of the side portions of the housing 140 and the side plates of the cover member 300 may be parallel to each other.

For example, the side portions 141-1 to 141-4 of the housing 140 may be portions corresponding to sides of the housing 140, and the corner portions 142-1 to 142-4 of the housing 140 may be portions corresponding to corners of the housing 140.

The inner surface of each of the corner portions 142-1 to 142-4 of the housing 140 may be a flat surface, a chamfered surface, or a curved surface.

The magnet 130 may be disposed or installed at at least one of the side portions 141-1 to 141-4 of the housing 140. For example, seating portions 141a, in which magnets 130-1 to 130-4 are seated, disposed, or fixed, may be provided at the first to fourth side portions 141-1 to 141-4 of the housing 140.

In FIG. 5A, the seating portions 141a may be openings or through-holes formed through the side portions 141-1 to 141-4 of the housing 140. However, the disclosure is not limited thereto. In another embodiment, the seating portions may be recesses or concave recesses.

The housing 140 may include a supporting portion 18 adjacent to the seating portion 141a in order to support the edge of a first surface of the magnet 130 opposite the first coil 120.

The supporting portion 18 may be located adjacent to the inner surface of the housing 140, and may protrude from the side surface of the seating portion 141a in a horizontal direction. In addition, for example, the supporting portion 18 may include a tapered portion or an inclined surface. In another embodiment, the housing 140 may include no supporting portion 18.

The housing 140 may be provided on the upper portion, the upper surface, or the upper end thereof with a stopper 143 in order to prevent direct collision with the inner surface of the upper plate of the cover member 300. Here, the stopper 143 may also be referred to as a "boss" or a "protrusion."

For example, the stoppers 143 may be provided at the corner portions of the housing 140. However, the disclosure is not limited thereto. In another embodiment, the stoppers 143 may be provided at at least one of the side portions and the corner portions of the housing 140.

For example, the upper surface of the stopper 143 of the housing 140 may contact the inner surface of the upper plate 301 of the cover member 300. However, the disclosure is not limited thereto. In another embodiment, there may be no contact therebetween.

In addition, the housing 140 may be provided on the upper surface, the upper end, or the upper portion thereof with at least one first coupling portion 144 coupled to an outer frame 152 of the upper elastic member 150. In addition, the housing 140 may be provided on the lower surface, the lower portion, or the lower end thereof with at least one second coupling portion 147 coupled to an outer frame 162 of the lower elastic member 160.

In FIGS. 5A and 5B, each of the first and second coupling portions 144 and 147 of the housing 140 is a protrusion. However, the disclosure is not limited thereto. In another embodiment, at least one of the first and second coupling portions 144 and 147 may be a recess or a flat surface.

In addition, the housing 140 may be provided in the lower portions of the corner portions 142-1 to 142-4 thereof with guide recesses 148, into which bosses 216 of the base 210 are inserted, fastened, or coupled.

The guide recesses 148 of the housing 140 and the bosses 216 of the base 210 may coupled to each other using an adhesive member (not shown), such as epoxy or silicone, whereby the housing 140 may be coupled to the base 210.

Next, the magnet 130 will be described.

At an initial position of an AF operation unit (e.g. the bobbin 110), the magnet 130 may be disposed on the side portions 141-1 to 141-4 of the housing 140 so as to correspond to or to be aligned with the first coil 120.

Here, the initial position of the AF operation unit (e.g. the bobbin 110) may be the original position of the AF operation unit in the state in which no power is applied to the first coil 120 or the position at which the AF operation unit is located as the result of the upper and lower elastic members 150 and 160 being elastically deformed due only to the weight of the AF operation unit.

In addition, the initial position of the AF operation unit (e.g. the bobbin 110) may be the position at which the AF operation unit is located when gravity acts in the direction from the bobbin 110 to the base 210 or when gravity acts in the direction from the base 210 to the bobbin 110.

The AF operation unit may include the bobbin 110 and components coupled to the bobbin 110.

For example, the AF operation unit may include the bobbin 110 and the coil 120. In the case in which a lens or a lens barrel is mounted, the AF operation unit may include the lens or the lens barrel.

At the initial position of the AF operation unit, magnet 130 may be disposed in the seating portion 141a of the housing 140 so as to overlap the first coil 120 in a second direction or a third direction perpendicular to the optical-axis direction.

In another embodiment, no seating portion 141a may be formed in the side portions 141-1 to 141-4 of the housing 140, and the magnet 130 may be disposed on the outer surfaces or the inner surfaces of the side portions 141-1 to 141-4 of the housing 140.

In the embodiment, the magnet 130 includes first to fourth magnets 130-1 to 130-4 disposed on the first to fourth side portions 141-1 to 141-4 of the housing 140. However, the disclosure is not limited thereto. The number of magnets 130 may be two or more. In another embodiment, two magnets may be disposed on two opposite side portions of the housing 140.

Each of the magnets 130-1 to 130-4 may have a shape corresponding to the outer surface of a corresponding one of the side portions 141-1 to 141-4 of the housing 140, for example a polyhedral shape (e.g. a rectangular parallelepiped shape). However, the disclosure is not limited thereto.

Each of the magnets 130-1 to 130-4 may be a monopolar magnetized magnet having two different polarities and a border surface naturally formed between the different polarities.

For example, each of the magnets 130-1 to 130-4 may be a monopolar magnetized magnet disposed such that a first surface thereof facing the first coil 120 has an N pole and a second surface opposite the first surface has an S pole. However, the disclosure is not limited thereto. The N pole and the S pole may be reversely disposed.

In another embodiment, in order to increase electromagnetic force, each of the magnets 130-1 to 130-4 may be a bipolar magnetized magnet divided into two parts in a direction perpendicular to the optical axis. Here, each of the magnets 130-1 to 130-4 may be realized by a ferrite, alnico, or rare-earth magnet. However, the disclosure is not limited thereto.

In the case in which each of the magnets 130-1 to 130-4 is a bipolar magnetized magnet, each of the magnets 130-1 to 130-4 may include a first magnet portion, a second magnet portion, and a partition disposed between the first magnet portion and the second magnet portion.

The first magnet portion may include an N pole, an S pole, and a first border surface between the N pole and the S pole. Here, the first border surface may be a portion having substantially no magnetism, may include a section having little polarity, and may be a portion that is naturally generated in order to form a magnet including a single N pole and a single S pole.

The second magnet portion may include an N pole, an S pole, and a second border surface between the N pole and the S pole. Here, the second border surface may be a portion having substantially no magnetism, may include a section having little polarity, and may be a portion that is naturally generated in order to form a magnet including a single N pole and a single S pole.

The partition may be a portion that separates or isolates the first magnet portion and the second magnet portion, may be a portion having substantially no magnetism, and may be a portion having little polarity. For example, the partition may be a nonmagnetic material or air. For example, the nonmagnetic partition may also be referred to as a "neutral zone."

The partition is a portion that is artificially formed when the first magnet portion and the second magnet portion are magnetized, and the width of the partition may be greater than the width of each of the first border surface and the second border surface. Here, the width of the partition may be the length of the partition in the direction from the first magnet portion to the second magnet portion.

The first surface of each of the magnets 130-1 to 130-4 may be a flat surface. However, the disclosure is not limited thereto. The first surface of each of the magnets 130-1 to 130-4 may include a curved surface, an inclined surface, or a tapered portion. For example, the first surface of each of the magnets 130-1 to 130-4 may be a surface opposite the outer surface of the bobbin 110 and/or the first coil 120.

Next, the upper elastic member 150 and the lower elastic member 160 will be described.

Figure 6:
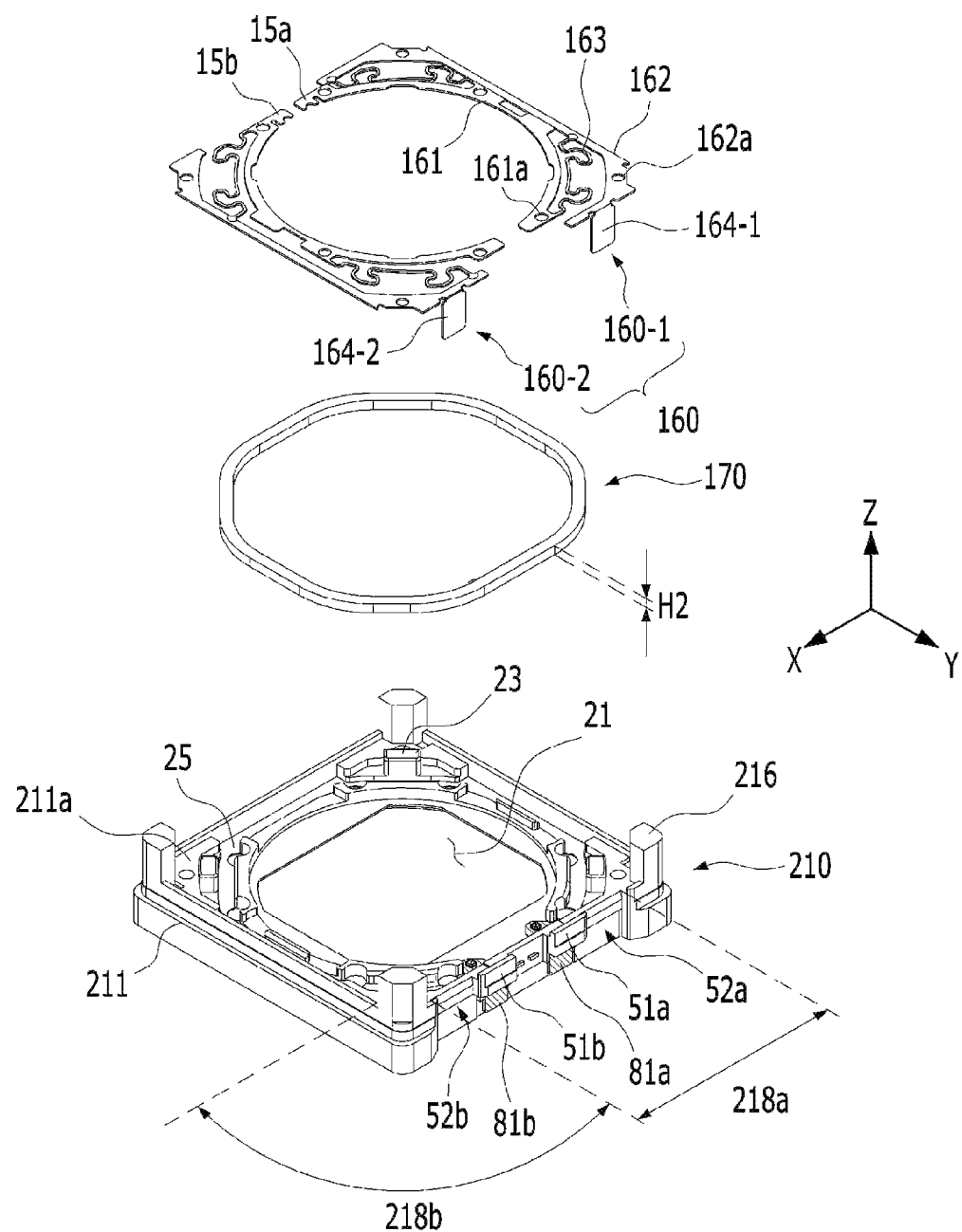
FIG. 6 is a separated perspective view of a base having first and second terminals coupled thereto, a second coil, and a lower elastic member.
Figure 7:
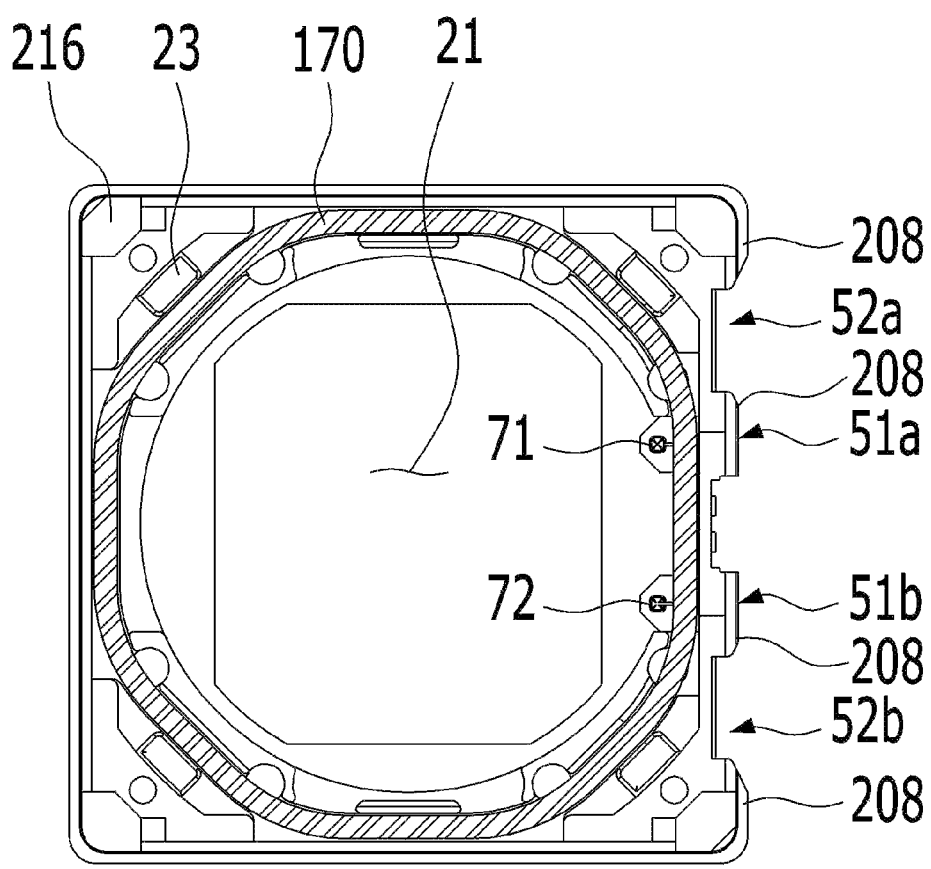
FIG. 7 is a plan view of the second coil, the base, and the first and second terminals.
Figure 8:
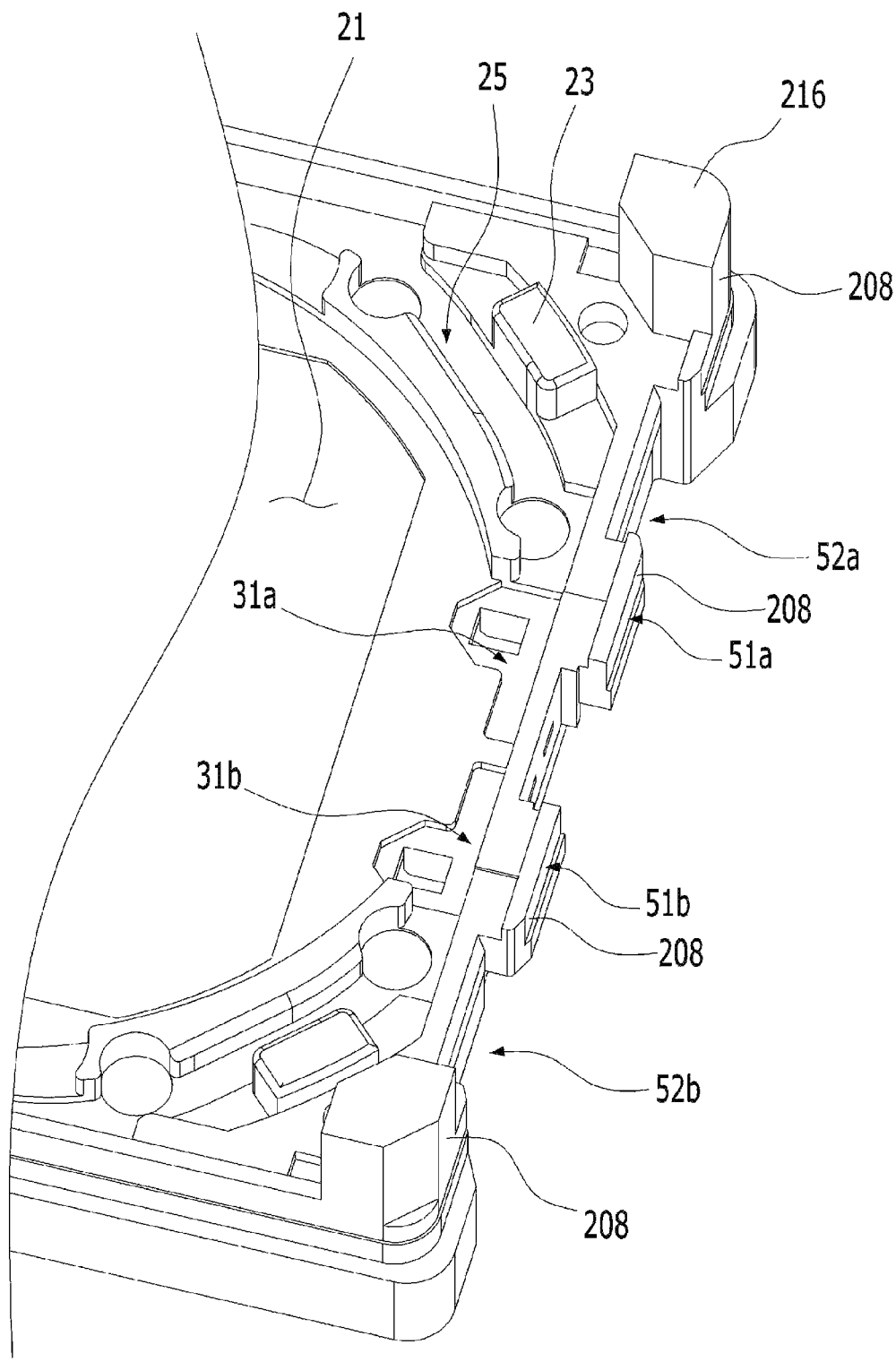
FIG. 8 is a partial enlarged view of the base of FIG. 6.
Figure 9:
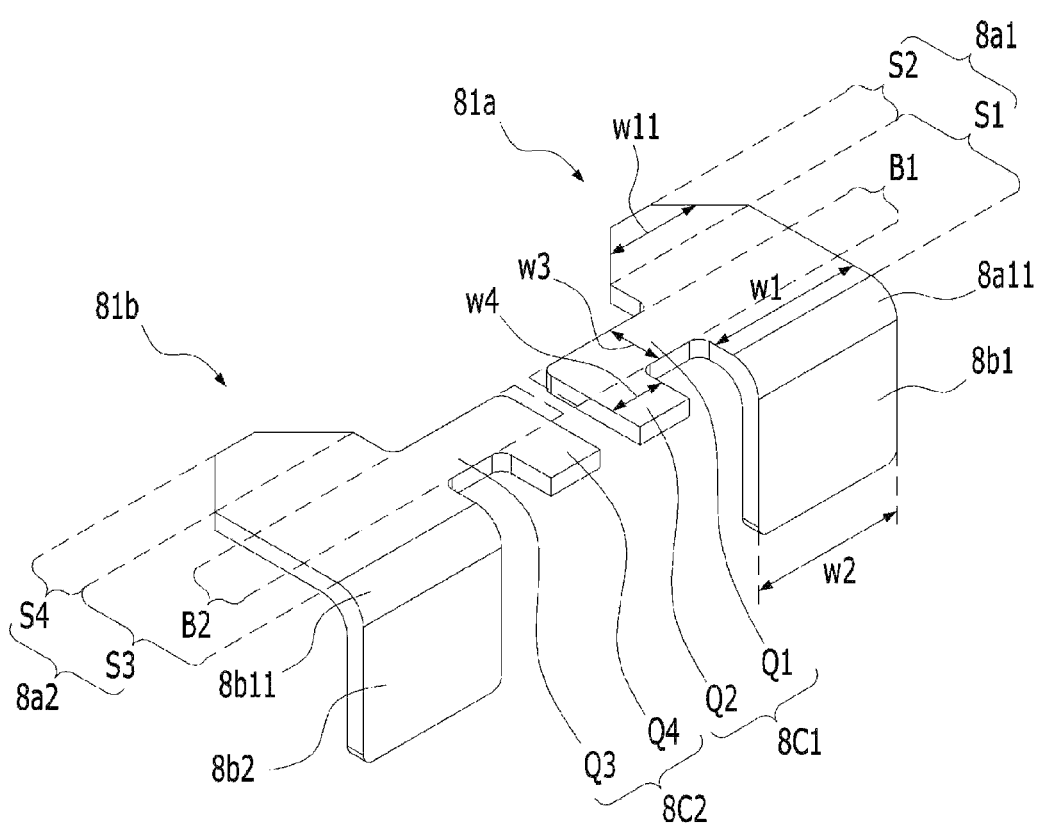
FIG. 9 is a perspective view of the first and second terminals.
Figure 10:
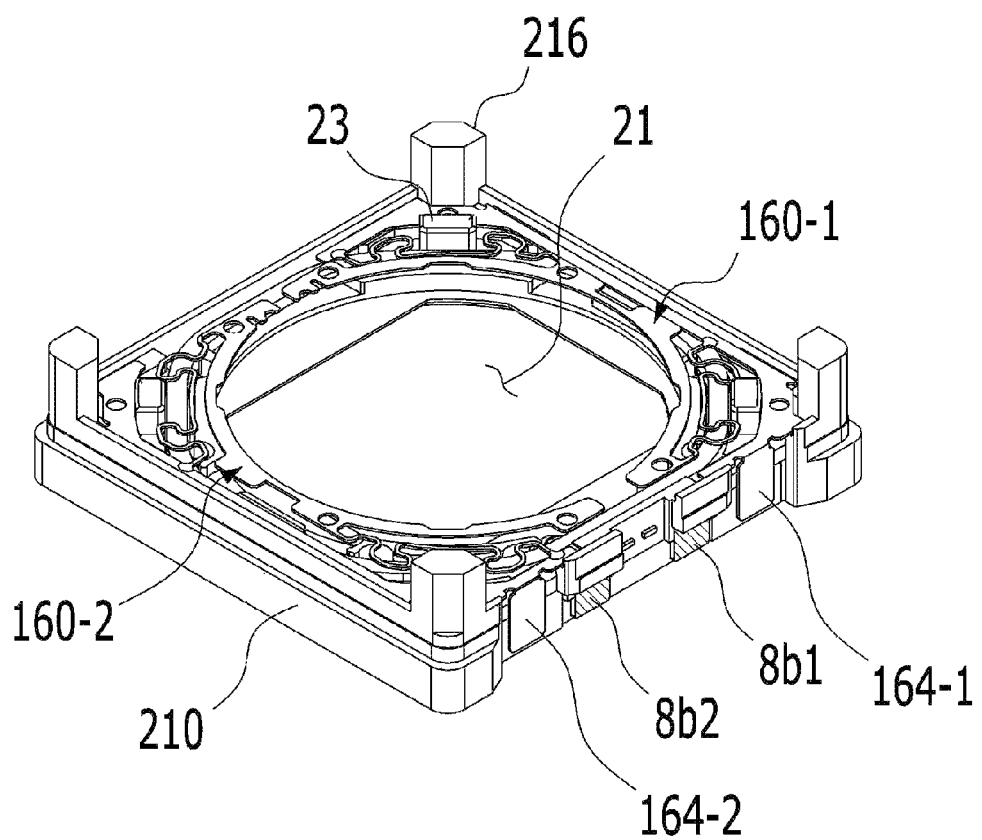
FIG. 10 is a coupled perspective view of the first and second terminals, the base, the second coil, and the lower elastic member.

FIG. 6 is a separated perspective view of the base 210 having the first and second terminals coupled thereto, the second coil 170, and the lower elastic member 160, FIG. 7 is a plan view of the second coil 170, the base 210, and the first and second terminals, FIG. 8 is a partial enlarged view of the base 210 of FIG. 6, FIG. 9 is a perspective view of the first and second terminals 81a and 81b, and FIG. 10 is a coupled perspective view of the first and second terminals 81a and 81b, the base 210, the second coil 170, and the lower elastic member 160.

Referring to FIGS. 3 and 6 to 10, the upper elastic member 150 and the lower elastic member 160 are coupled to the bobbin 110 and to the housing 140, and flexibly support the bobbin 110.

For example, the upper elastic member 150 may be coupled to the upper portion (or the upper surface or the upper end) of the bobbin 110 and/or to the upper portion (or the upper surface or the upper end) of the housing 140.

The lower elastic member 160 may be coupled to the lower portion (or the lower surface or the lower end) of the bobbin 110 and/or to the upper portion (or the lower surface or the lower end) of the housing 140.

In FIG. 3, the upper elastic member 150 is not divided into a plurality of parts. However, the disclosure is not limited thereto. In another embodiment, the upper elastic member 150 may include a plurality of elastic units spaced apart from each other.

The upper elastic member 150 may include a first inner frame 151 coupled to the upper portion of the bobbin 110, a first outer frame 152 coupled to the upper portion of the housing 140, and a first frame connection portion 153 configured to connect the first inner frame 151 and the first outer frame 152 to each other. In the following description, the inner frame may also be referred to as an "inner portion," the outer frame may also be referred to as an "outer portion," and the frame connection portion may also be referred to as a "connection portion."

A hole 151a, to which the first coupling portion 113 of the bobbin 110 is coupled by soldering or using a conductive adhesive member, may be provided in the first inner frame 151 of the upper elastic member 150, and a hole 152a, to which the first coupling portion 144 of the housing 140 is coupled, may be provided in the first outer frame 152.

The lower elastic member 160 may include two or more divided or separated elastic members, and may be coupled to the bobbin 110. For example, the elastic members may also be referred to as "lower elastic members," "elastic units," or "springs."

For example, the lower elastic member 160 may include first and second elastic members 160-1 and 160-2 spaced apart from each other, and the first and second elastic members 160-1 and 160-2 may be separated from each other.

The first coil 120 may be connected to the first and second elastic members 160-1 and 160-2. For example, one end (or the first end) of the first coil 120 may be coupled to the first elastic member 160-1, and the other end (or the second end) of the first coil 120 may be coupled to the second elastic member 160-2.

Each of the first and second elastic members 160-1 and 160-2 may include a second inner frame 161 coupled to the lower portion of the bobbin 110, a second outer frame 162 coupled to the lower portion of the housing 140, and a second frame connection portion 163 configured to connect the second inner frame 161 and the second outer frame 162 to each other.

A hole 161a, to which the second coupling portion 117 of the bobbin 110 is coupled by soldering or using a conductive adhesive member, may be provided in the second inner frame 161 of the lower elastic member 160, and a hole 162a, to which the second coupling portion 147 of the housing 140 is coupled, may be provided in the second outer frame 162.

For example, a first bonding portion (or a "first boding region") 15a, to which one end of the first coil 120 is coupled, may be provided at one end of the second inner frame 161 of the first elastic member 160-1, and a second bonding portion (or a "second boding region") 15*b*, to which the other end of the first coil 120 is coupled, may be provided at one end of the second inner frame 161 of the second elastic member 160-2.

For example, one end of the first coil 120 may be coupled to the first bonding portion 15*a* of the inner frame 161 of the first elastic member 160-1, and the other end of the first coil 120 may be coupled to the second bonding portion 15*b* of the inner frame 161 of the second elastic member 160-2, by soldering or using a conductive member.

The reason that the first and second bonding portions 15*a* and 15*b* are provided at the second inner frame 161 is that, since the second inner frame 161 is closer to the bobbin 110 than the second outer frame 162, bonding with the first coil 120 can be more easily performed.

For example, guide recesses configured to guide one end and the other end of the first coil 120 may be provided in the first and second bonding portions 15*a* and 15*b*.

For the first and second bonding portions 15*a* and 15*b*, the "bonding portions" may also be referred to as pad portions, connection terminal portions, solder portions, or electrode portions.

Each of the upper elastic member 150 and the lower elastic member 160 may be realized as a leaf spring; however, the disclosure is not limited thereto. Each elastic member may be realized as a coil spring or a suspension wire.

Each of the first and second frame connection portions 153 and 163 may be formed so as to be bent or curved at least once in order to form a predetermined pattern. Upward and/or downward movement of the bobbin 110 in the first direction may be flexibly (or elastically) supported through displacement and microscopic deformation of the first and second frame connection portions 153 and 163.

For example, in order to prevent an oscillation phenomenon when the bobbin 110 is moved, a damper may be disposed between the first frame connection portion 153 of the upper elastic member 150 and the upper surface of the bobbin 110 (e.g. the first escape recess 112*a*). Alternatively, a damper (not shown) may also be disposed between the second frame connection portion 163 of the lower elastic member 160 and the lower surface of the bobbin 110 (e.g. the second escape recess 112*b*).

Alternatively, for example, a damper may be coated on a coupling portion between the upper elastic member 150 and each of the bobbin 110 and the housing 140 or on a coupling portion between the lower elastic member 160 and each of the bobbin 110 and the housing 140. For example, the damper may be gel-type silicone.

For example, the first and second elastic members 160-1 and 160-2 may be separated or spaced apart from each other at the first side portion 141-1 of the housing 140.

The first elastic member 160-1 may include a first connection terminal 164-1 connected to the outer surface of the second outer frame 162 of the first elastic member 160-1, bent from the second outer frame 162 of the first elastic member 160-1 in a direction toward the base 210, and extending toward the base.

In addition, the second elastic member 160-2 may include a second connection terminal 164-2 connected to the outer surface of the second outer frame 162 of the second elastic member 160-2, bent from the second outer frame 162 of the second elastic member 160-2 in a direction toward the base 210, and extending toward the base.

For example, the first connection terminal 164-1 of the first elastic member 160-1 may extend from the second outer frame 162 of the first elastic member 160-1 to the first outer surface of the base 210. In addition, the second connection terminal 164-2 of the second elastic member 160-2 may extend from the second outer frame 162 of the second elastic member 160-2 to the first outer surface of the base 210.

For example, the first and second connection terminals 164-1 and 164-2 of the first and second elastic members 160-1 and 160-2 may be disposed on the first outer surface of the base 210 so as to be spaced apart from each other, and may abut the first outer surface of the base 210.

For example, the first connection terminal 164-1 of the first elastic member 160-1 may be disposed, seated, or inserted in a first depressed portion 52*a* provided in the base 210. In addition, the second connection terminal 164-2 of the second elastic member 160-2 may be disposed, seated, or inserted in a second depressed portion 52*b* provided in the base 210.

The first and second connection terminals 164-1 and 164-2 of the first and second elastic members 160-1 and 160-2 may be exposed from the base 210, and the first and second connection terminals 164-1 and 164-2 may be separated from each other.

For example, the inner surface of the first connection terminal 164-1 disposed in the first depressed portion 52*a* of the base 210 may abut one surface (e.g. the bottom surface) of the first depressed portion 52*a*, and the outer surface of the first connection terminal 164-1 may be exposed from the outer surface (e.g. the first outer surface) of the base 210. The outer surface of the first connection terminal 164-1 may be the surface opposite the inner surface of the first connection terminal 164-1.

In addition, the inner surface of the second connection terminal 164-2 disposed in the second depressed portion 52*b* of the base 210 may abut one surface (e.g. the bottom surface) of the second depressed portion 52*b*, and the outer surface of the second connection terminal 164-2 may be exposed from the outer surface (e.g. the first outer surface) of the base 210. The outer surface of the second connection terminal 164-2 may be the surface opposite the inner surface of the second connection terminal 164-2.

For example, the lower end of each of the first and second connection terminals 164-1 and 164-2 may be exposed from the lower surface of the base 210.

The depth of the depressed portions 52*a* and 52*b* may be greater than the thickness of the connection terminals 164-1 and 164-2, and the outer surfaces of the connection terminals 164-1 and 164-2 disposed in the depressed portions 52*a* and 52*b* may not protrude out of the depressed portions 52*a* and 52*b*. However, the disclosure is not limited thereto. In another embodiment, the outer surfaces of the connection terminals 164-1 and 164-2 may protrude out of the depressed portions 52*a* and 52*b*.

Referring to FIGS. 5A and 6, the first elastic member 160-1 and the second elastic member 160-2 may be disposed so as to be opposite each other in a first-axis direction (e.g. an X-axis direction).

For example, the first elastic member 160-1 may be disposed on one side of a first side portion 218*a* of the base 210, one side of a second side portion of the base 210, a third side portion of the base 210, a first corner portion 218*b* of the base 210, and a second corner portion of the base 210.

For example, the first and second side portions of the base 210 may be opposite each other in a second-axis direction (e.g. a Y-axis direction), the third side portion of the base 210 may be disposed between the first side portion 218*a* and the second side portion of the base 210, the first corner portion 218*b* of the base 210 may connect the first side portion 218*a* of the base 210 and one side of the third side portion of the base 210 to each other, and the second corner portion of the base 210 may connect the second side portion of the base 210 and the other side of the third side portion of the base 210 to each other. The second-axis direction may be perpendicular to the first-axis direction.

For example, the second elastic member 160-2 may be disposed on the other side of the first side portion 218*a* of the base 210, the other side of the second side portion of the base 210, a fourth side portion of the base 210, a third corner portion of the base 210, and a fourth corner portion of the base 210.

For example, the fourth side portion of the base 210 may be opposite the third side portion of the base 210 in the first-axis direction, the third corner portion of the base 210 may connect the second side portion of the base 210 and one side of the fourth side portion of the base 210 to each other, and the fourth corner portion of the base 210 may connect the first side portion 218*a* of the base 210 and the other side of the fourth side portion of the base 210 to each other.

The first and second connection terminals 164-1 and 164-2 and the first and second terminals 81*a* and 81*b* may be disposed on the first side portion 218*a* of the base 210.

The first and second connection terminals 164-1 and 164-2 may be connected to external wires or external elements using a conductive adhesive member (e.g. solder) such that power or a driving signal is received from the outside.

In the case in which the solder bonded to the first and second connection terminals 164-1 and 164-2 protrudes out of the outer surface of the base 210, contact or collision between the solder bonded to the first and second connection terminals 164-1 and 164-2 and the cover member 300 may be prevented, whereby electrical short circuit or open circuit may occur. In the embodiment, the depth of the depressed portions 52*a* and 52*b* is sufficiently secured such that the solder bonded to the connection terminals 164-1 and 164-2 does not protrude out of the outer surface of the base 210, whereby it is possible to prevent the occurrence of electrical short circuit or open circuit.

In addition, the first and second connection terminals 164-1 and 164-2 may be disposed on the second outer frames 162 of the first and second elastic members 160-1 and 160-2 disposed under the first side portion 141-1 of the housing 140 and/or the corner portions 142-1 and 142-4 of the housing 140 adjacent to the first side portion 141-1. Furthermore, the first and second bonding portions 15*a* and 15*b*, to which the first coil 120 is coupled, may be disposed on the first inner frames 151 of the first and second elastic members 160-1 and 160-2 disposed under the side portion of the bobbin 110 corresponding to the second side portion 141-2 of the housing 140.

As described above, the first and second bonding portions 15*a* and 15*b* may be disposed spaced apart from the first and second connection terminals 164-1 and 164-2. When the first and second connection terminals 164-1 and 164-2 are soldered for connection with the outside, it is possible to prevent the solder, by which the first coil 120 is connected to the first and second bonding portions 15*a* and 15*b*, from melting due to heat generated by soldering, whereby it is possible to prevent the first coil 120 from being separated from the first and second bonding portions 15*a* and 15*b*.

For the first and second connection terminals 164-1 and 164-2, the "connection terminals" may also be referred to as pad portions, bonding portions, solder portions, or electrode portions.

The first and second connection terminals 164-1 and 164-2 of the first and second elastic members 160-1 and 160-2 may be connected to the first coil 120, and power or a driving signal for driving the first coil 120 may be provided to the first and second connection terminals 164-1 and 164-2.

In FIG. 6, the first connection terminal 164-1 is formed integrally with the first elastic member 160-1, and the second connection terminal 164-2 is formed integrally with the second elastic member 160-2. However, the disclosure is not limited thereto. In another embodiment, the first connection terminal may be formed separately from the first elastic member and disposed on the first outer surface of the base 210, the second connection terminal may be formed separately from the second elastic member and disposed on the first outer surface of the base 210, the first elastic member and the first connection terminal may be connected to each other by soldering, and the second elastic member and the second connection terminal may be connected to each other by soldering.

Next, the electromagnetic blocking unit 250 will be described.

The electromagnetic blocking unit 250 may be disposed on the upper elastic member 150, and may serve to block electromagnetic interference introduced from an external device (e.g. a mobile phone).

For example, the electromagnetic blocking unit 250 may be disposed between the inner surface of the upper plate 301 of the cover member 300 and the upper elastic member 150. Alternatively, the electromagnetic blocking unit 250 may be disposed between the inner surface of the upper plate 301 of the cover member 300 and the magnet 130 disposed on the housing 140.

The electromagnetic blocking unit 250 may be made of a material capable of blocking electromagnetic waves, for example an electromagnetic blocking metal (e.g. copper (Cu)). For example, the electromagnetic blocking unit 250 may be a copper tape, and may be attached to the inner surface of the upper plate 301 of the cover member 300. In another embodiment, the electromagnetic blocking unit 250 may be omitted.

Next, the base 210 will be described.

The base 210 may be coupled to the housing 140, and may form a receiving space configured to receive the bobbin 110 and the housing 140 together with the cover member 300. The base 210 may have an opening 21 corresponding to the opening of the bobbin 110 and/or the opening of the housing 140, and may be configured in a shape coinciding with or corresponding to the shape of the cover member 300, such as a quadrangular shape.

The base 210 may be provided at the lower end of the outer surface thereof with a stair 211, which may be coated with an adhesive when fixing the cover member 300 by adhesion. In this case, the stair 211 may guide the cover member 300 coupled to the upper side thereof, and may be opposite the lower end of the side plate 302 of the cover member 300. An adhesive member and/or a sealing member may be disposed or coated between the lower end of the side plate 302 of the cover member 300 and the stair 211 of the base 210.

The base 210 may be disposed under the bobbin 110 and the housing 140.

For example, the base 210 may be disposed under the lower elastic member 160.

The base 210 may include bosses 216 protruding from the four corners or corner portions thereof by a predetermined height in an upward direction. Each of the bosses 216 of the base 210 may have a multilateral pillar shape protruding from an upper surface 211a of the base 210 so as to be perpendicular to the upper surface 211a of the base 210. However, the disclosure is not limited thereto.

The bosses 216 of the base 210 may be inserted, fastened, or coupled to the guide recesses 148 of the housing 140 using an adhesive member, such as epoxy or silicone.

In order to prevent the lower surface or the lower end of the bobbin 210 from directly colliding with the upper surface 211a of the base 210 when external impact occurs, the base 210 may be provided with stoppers 23 protruding from the upper surface 211a thereof. The stoppers 23 of the base 210 may be disposed so as to correspond to the bosses 216 of the base 210. However, the disclosure is not limited thereto.

In order to avoid spatial interference between the bobbin 110 and the lower elastic member 160, the stoppers 23 of the base 210 may be located higher than the first and second elastic members 160-1 and 160-2 coupled to the base 210 (e.g. the second frame connection portion 163).

The base 210 may be provided with a seating portion 25 located between the opening 21 and the outer surface of the base 210 such that the second coil 170 is disposed in the seating portion.

The seating portion 25 of the base 210 may be a recess depressed from the upper surface 211a of the base 210. However, the disclosure is not limited thereto. It is sufficient to provide a shape (e.g. a protrusion) at which the second coil 170 wrapping the opening 21 of the base 210 can be disposed.

A first recess 31a, in which at least a portion of the first terminal 81a is disposed, and a second recess 31b, in which at least a portion of the second terminal 81b is disposed, may be formed in the upper surface of the base 210.

For example, the first and second recesses 31a and 31b may be formed between the opening 21 of the base 210 and the outer surface of the base 210. Here, the outer surface of the base 210 may be the outer surface of the first side portion of the base 210 corresponding to the first side portion 141-1 of the housing 140 in the optical-axis direction or the first direction.

The base 210 may include side portions corresponding to the side portions 141-1 to 141-4 of the housing 140 and corner portions corresponding to the corner portions 142-1 to 142-4 of the housing 140.

For example, the base 210 may include side portions (e.g. 218a) corresponding to or opposite the side portions 141-1 to 141-4 of the housing 140 and corner portions (e.g. 218b) corresponding to or opposite the corner portions 142-1 to 142-4 of the housing 140.

For example, the first and second depressed portions 52a and 52b may be formed in the outer surface 208 of the first side portion (e.g. 218a) of the base 210.

For example, each of the first and second depressed portions 52a and 52b may include an upper opening that is open to the upper surface of the base 210 and a lower opening that is open to the lower surface of the base 210.

In addition, escape recesses 14a configured to avoid spatial interference with coupling portions between the second inner frames 161 of the first and second elastic members 160-1 and 160-2 and the second coupling portion 117 of the bobbin 110 may be provided in the upper surface 211a of the base 210.

Next, the first terminal 81a and the second terminal 81b will be described.

Referring to FIG. 9, the first terminal 81a may be disposed on the base 210, may be coupled or connected to the base 210, or may be supported by the base 210.

The first terminal 81a may include a first portion 8a1 and a second portion 8b1.

The first portion 8a1 of the first terminal 81a may be exposed from the upper surface of the base 210, and may be a portion to which one end of the second coil 170 is coupled.

The second portion 8b1 of the first terminal 81a may be connected to the first portion 8a1, and may be bent from the first portion 8a1 in a direction toward the lower surface of the base 210 or toward the side surface (or the first side surface) of the base 210.

In addition, for example, the first terminal 81a may include a bent portion 8a11 configured to connect the first portion 8a1 and the second portion 8b1 to each other. The bent portion 8a11 may be round. However, the disclosure is not limited thereto. In another embodiment, the bent portion may be angled.

The bent portion 8a11 may be disposed in the base 210, and may not be exposed from the base 210.

For example, the interior angle between the first portion 8a1 and the second portion 8b1 may be a right angle. However, the disclosure is not limited thereto. In another embodiment, the interior angle may be an acute angle or an obtuse angle.

For example, the second portion 8b1 of the first terminal 81a may be bent and extend from a region of the first portion 8a1 in a downward direction.

In addition, the first terminal 81a may further include a third portion 8c1 extending from the first portion 8a1 in a first horizontal direction. Here, the first horizontal direction may be a direction that is parallel to a plane perpendicular to the optical axis OA and that is from the first portion 8a1 of the first terminal 81a to a first portion 8a2 of the second terminal 81b.

For example, the third portion 8c1 of the first terminal 81a may extend in the direction from the first portion 8a1 of the first terminal 81a to the first portion 8a2 of the second terminal 81b.

For example, the third portion 8c1 of the first terminal 81a may include a first extension portion Q1 and a second extension portion Q2.

The first extension portion Q1 may be connected to another region of the first portion 8a1 of the first terminal 81a, and may extend in the direction from the first portion 8a1 of the first terminal 81a to the first portion 8a2 of the second terminal 81b.

In addition, the second extension portion Q2 may be connected to one end of the first extension portion Q1, and may extend in a direction from one end of the first extension portion Q1 to the outer surface of the base 210. For example, the interior angle between the first extension portion Q1 and the second extension portion Q2 may be a right angle. However, the disclosure is not limited thereto. In another embodiment, the interior angle therebetween may be an acute angle or an obtuse angle.

In addition, for example, the distal end of the second extension portion Q2 may be exposed out of the outer surface of the base 210. However, the disclosure is not limited thereto. In another embodiment, the distal end of the second extension portion Q2 may not be exposed out of the outer surface of the base 210.

The third portion 8c1 of the first terminal 81a may increase coupling area or contact area with the base 210, whereby force of coupling between the first terminal 81a and the base 210 may be increased.

The first portion 8a1 of the first terminal 81a may include a portion having a width W1 equal to the width W2 of the second portion 8b1.

For example, the width W1 of a first region S1 of the first terminal 81a may be equal to the width W2 of the second portion 8b1 (W1=W2). In another embodiment, W1>W2 or W1<W2. The first region S1 may be a region adjacent to or abutting the second portion 8b1.

The first terminal 81a may further include a second region S2 having a width W11 gradually decreasing with increasing distance from the first region S1. The second region S2 may be spaced apart from the second portion 8b1.

For example, each of the width W3 of the first extension portion Q1 of the first terminal 81a and the width W4 of the second extension portion Q2 may be less than the width W1 of the first region S1 of the first portion of the first terminal 81a (W3<W1 and W4<W1). However, the disclosure is not limited thereto. In another embodiment, W3≥W1 and W4≥W1.

In addition, the width W3 of the first extension portion Q1 of the first terminal 81a and the width W4 of the second extension portion Q2 may be different from each other. For example, W3<W4.

In another embodiment, the width W3 of the first extension portion Q1 of the first terminal 81a and the width W4 of the second extension portion Q2 may be equal to each other.

For example, when viewed from above, the second region S2 of the first portion 8a1 may have a trapezoidal shape. However, the disclosure is not limited thereto.

Contact area or coupling area between the first terminal 81a and the base 210 may be increased by the second region S2 of the first terminal 81a, whereby force of coupling between the first terminal 81a and the base 210 may be increased.

The second terminal 81b may be disposed on the base 210 in the state of being spaced apart from the first terminal 81a, may be coupled or connected to the base 210, or may be supported by the base 210.

The second terminal 81b may include a first portion 8a2 and a second portion 8b2.

The first portion 8a2 of the second terminal 81b may be exposed from the upper surface of the base 210, and may be a portion to which the other end of the second coil 170 is coupled.

The second portion 8b2 of the second terminal 81b may be connected to the first portion 8a2, and may be bent from the first portion 8a2 in a direction toward the lower surface of the base 210 or toward the side surface (or the first side surface) of the base 210.

In addition, for example, the second terminal 81b may include a bent portion 8b11 configured to connect the first portion 8a2 and the second portion 8b2 to each other. The bent portion 8b11 may be round. However, the disclosure is not limited thereto. In another embodiment, the bent portion may be angled.

The bent portion 8b11 may be disposed in the base 210, and may not be exposed from the base 210.

For example, the interior angle between the first portion 8a2 and the second portion 8b2 may be a right angle. However, the disclosure is not limited thereto. In another embodiment, the interior angle may be an acute angle or an obtuse angle.

For example, the second portion 8b2 of the second terminal 81b may be bent and extend from a region of the first portion 8a2 in the downward direction.

In addition, the second terminal 81b may further include a third portion 8c2 extending from the first portion 8a2 in a second horizontal direction. Here, the second horizontal direction may be a direction that is parallel to a plane perpendicular to the optical axis OA and that is from the first portion 8a2 of the second terminal 81b to the first portion 8a1 of the first terminal 81a.

For example, the third portion 8c2 of the second terminal 81b may extend in the direction from the first portion 8a2 of the second terminal 81b to the first portion 8a1 of the first terminal 81a.

For example, the third portion 8c2 of the second terminal 81b may include a first extension portion Q3 and a second extension portion Q4.

The first extension portion Q3 may be connected to another region of the first portion 8a2 of the second terminal 81b, and may extend in the direction from the first portion 8a2 of the second terminal 81b to the first portion 8a1 of the first terminal 81a.

In addition, the second extension portion Q4 may be connected to one end of the first extension portion Q3, and may extend in a direction from one end of the first extension portion Q3 to the outer surface of the base 210. For example, the interior angle between the first extension portion Q3 and the second extension portion Q4 may be a right angle. However, the disclosure is not limited thereto. In another embodiment, the interior angle therebetween may be an acute angle or an obtuse angle.

In addition, for example, the distal end of the second extension portion Q4 may be exposed out of the outer surface of the base 210. However, the disclosure is not limited thereto. In another embodiment, the distal end of the second extension portion Q4 may not be exposed out of the outer surface of the base 210.

The third portion 8c2 of the second terminal 81b may increase coupling area or contact area with the base 210, whereby force of coupling between the second terminal 81b and the base 210 may be increased.

The first portion 8a2 of the second terminal 81b may include a first region S3 having a width equal to the width of the second portion 8b2.

For example, the width of the first region S3 of the second terminal 81b may be equal to the width of the second portion 8b2. In another embodiment, the width of the first region S3 of the second terminal 81b may be greater or less than the width of the second portion 8b2 of the second terminal 81b. The first region S3 of the second terminal 81b may be a region adjacent to or abutting the second portion 8b2.

The second terminal 81b may further include a second region S4 having a width gradually decreasing with increasing distance from the first region S3. The second region S4 may be spaced apart from the second portion 8b2.

For example, when viewed from above, the second region S4 of the first portion 8a2 may have a trapezoidal shape. However, the disclosure is not limited thereto.

The above description of W1, W3, and W4 is applicable to the relationship between the width of the first extension portion Q3, the width of the second extension portion Q4, and the width of the first portion 8a2 of the second terminal 81b.

Contact area or coupling area between the second terminal 81b and the base 210 may be increased by the second region S4 of the second terminal 81b, whereby force of coupling between the second terminal 81b and the base 210 may be increased.

For example, third portions 8c1 and 8c2 of the first and second terminals 81a and 81b may not overlap the second coil 170 in the optical-axis direction.

In addition, for example, the first and second connection terminals 164-1 and 164-2 may not overlap the second coil 170 in the optical-axis direction.

The thickness of the first portion 8a1, the thickness of the second portion 8b1, and the thickness of the third portion 8c1 of the first terminal 81a may be equal to each other. However, the disclosure is not limited thereto. At least one of the thickness of the first portion 8a1, the thickness of the second portion 8b1, and the thickness of the third portion 8c1 of the first terminal 81a may be different from the others.

In addition, the thickness of the first portion 8a2, the thickness of the second portion 8b2, and the thickness of the third portion 8c2 of the second terminal 81b may be equal to each other. However, the disclosure is not limited thereto. At least one of the thickness of the first portion 8a2, the thickness of the second portion 8b2, and the thickness of the third portion 8c2 of the second terminal 81b may be different from the others.

In addition, the thicknesses of the first terminal 81a and the second terminal 81b may be equal to each other. However, the disclosure is not limited thereto.

The first terminal 81a and the second terminal 81b of FIG. 9 may be configured as follows.

The first terminal 81a may include a first body portion B1, a first extension portion extending from a region of the first body portion B1 to one side, and a second extension portion extending from another region of the first body portion B1 to the one side and the other side.

For example, the first body portion B1 may be a portion of the first region S1 of the first portion 8a1 of the first terminal 81a. In addition, the first extension portion of the first terminal 81a may be the second extension portion Q2 of the first terminal 81a. In addition, the second extension portion of the first terminal 81a may include the remaining portion of the first region S1 of the first portion 8a1 of the first terminal 81a, the second region S2, the bent portion 8a11, and the second portion 8b1.

For example, a portion of the second extension portion of the first terminal 81a extending to the other side of the first body portion B1 may be bent and extend from the outer surface of the base 210.

In addition, the second terminal 81b may include a second body portion B2, a first extension portion extending from a region of the second body portion B2 to one side, and a second extension portion extending from another region of the second body portion B2 to the one side and the other side.

For example, the second body portion B2 may be a portion of the first region S3 of the first portion 8a2 of the second terminal 81b. In addition, the first extension portion of the second terminal 81b may be the second extension portion Q4 of the second terminal 81b. In addition, the second extension portion of the second terminal 81b may include the remaining portion of the first region S3 of the first portion 8a2 of the second terminal 81b, the second region S4, the bent portion 8b11, and the second portion 8b2.

For example, a portion of the second extension portion of the second terminal 81b extending to the other side of the second body portion B2 may be bent and extend from the outer surface of the base 210.

For example, the second coil may overlap the first and second body portions B1 and B2 of the first and second terminals 81a and 81b in a third-axis direction.

For example, first solder 71 may couple another portion of the second extension portion of the first terminal 81a extending to the other side of the first body portion B1 to one end of the second coil 170.

In addition, for example, second solder 72 may couple another portion of the second extension portion of the second terminal 81b extending to the other side of the second body portion B2 to the other end of the second coil 170.

In another embodiment, one end of the second coil 170 may be coupled to the second extension portion Q2 of the first terminal 81a by the first solder, and the other end of the second coil 170 may be coupled to the second extension portion Q4 of the second terminal 81b by the second solder.

The base 210 may be made of an injection molded material. The first terminal 81a and the second terminal 81b may be located in the base 210 by insert injection molding. For this reason, each of the first terminal 81a and the second terminal 81b may also be referred to as an insert terminal.

However, at least a portion of each of the first portions 8a1 and 8a2 of the first and second terminals 81a and 81b may be exposed from the upper surface of the base 210 so as to be soldered to the second coil 170, and at least a portion of each of the second portions 8b1 and 8b2 of the first and second terminals 81a and 81b may be exposed from the outer surface of the base 210 so as to be connected to the outside (e.g. by soldering).

Each of the first and second terminals 81a and 81b may be made of a conductor, such as a metal. For example, each of the first and second terminals 81a and 81b may be made of copper, gold, silver, nickel, or an alloy including at least one thereof.

In addition, for the first and second terminals, the terminals may also be referred to as "pads," "pad portions," "connection terminal portions," "solder portions," or "electrode portions."

Referring to FIGS. 7 to 10, the base 210 may be provided on the outer surface 208 thereof with first and second bosses 51a and 51b protruding from the center of the opening 21 of the base 210 toward the outer surface 208 of the base 210 based on the first and second depressed portions 52a and 52b.

For example, the first and second bosses 51a and 51b may be disposed between the first depressed portion 52a and the second depressed portion 52b.

For example, the bent portion 8a11 of the first terminal 81a may be located in the first boss 51a, and the bent portion 8b11 of the second terminal 81b may be located in the second boss 51b. Since the bent portions 8a11 and 8b11 are located in the bosses 51a and 51b, it is possible to protect the bent portions 8a11 and 8b11 from external impact and to increase force of coupling between the bent portions 8a11 and 8b11 and the base 210.

In addition, for example, a region of the second portion 8b1 of the first terminal 81a exposed from the outer surface of the base 210 may be located under the first boss 51a, and a region of the second portion 8b2 of the second terminal 81b exposed from the outer surface of the base 210 may be located under the second boss 51b. As a result, it is possible to easily perform soldering between terminals of a circuit board of a camera module and the first and second terminals 81a and 81b of the lens moving apparatus 100 according to the embodiment, The first connection terminal 164-1 of the first elastic member 160-1, the second connection terminal 164-2 of the second elastic member 160-1, the second portion 8b1 of the first terminal 81a, and the second portion 8b2 of the second terminal 81b may be disposed on one side portion (e.g. 218a) of the base 210.

For example, the first connection terminal 164-1, the second connection terminal 164-2, the second portion 8b1 of the first terminal 81a, and the second portion 8b2 of the second terminal 81b may be disposed on the first outer surface 208 of the base 210. As a result, it is possible to easily perform soldering for connection between the first connection terminal 164-1, the second connection terminal 164-2, the first and second terminals 81a and 81b, and an external device (e.g. a circuit board).

For example, the second portion 8b1 of the first terminal 81a and the second portion 8b2 of the second terminal 81b may be arranged in a space between the first connection terminal 164-1 and the second connection terminal 164-2.

For example, when the first outer surface of the base 210 is viewed from the front, the second portion 8b1 of the first terminal 81a and the second portion 8b2 of the second terminal 81b may be disposed between the first connection terminal 164-1 and the second connection terminal 164-2.

Next, the second coil 170 will be described.

The second coil 170 may be disposed under the lower elastic member 160.

The second coil 170 may generate induced voltage due to mutual induction with the first coil 120 to which a driving signal is provided. The second coil 170 is configured to sense displacement of the AF operation unit, and may also be referred to as a "sensing coil."

For example, the second coil 170 may be disposed between the lower elastic member 160 and the base 210.

For example, the second coil 170 may be disposed under the circumference of the bobbin 110. For example, a ring portion of the second coil 170 may not overlap the bobbin 110 in the optical-axis direction. However, the disclosure is not limited thereto. In another embodiment, a portion of the ring portion of the second coil 170 may overlap the bobbin 110 in the optical-axis direction.

For example, the second coil 170 may be disposed in the seating portion 25 of the base 210. The second coil 170 may have a closed-curved shape, such as a ring shape, disposed around the opening 21 of the base 210. For example, the second coil 170 may have a ring shape wound so as to be rotated in the clockwise direction or the counterclockwise direction based on the optical axis.

At the initial position of the AF operation unit (e.g. the bobbin 110), the second coil 170 may be located spaced apart from the first coil 120 by a predetermined distance in the optical-axis direction, and may not overlap the first coil 120 in a direction perpendicular to the optical axis. The reason that the predetermined distance between the first coil 120 and the second coil 170 is maintained in the optical-axis direction is that it is necessary to secure linearity of induced voltage induced in the second coil 170 due to current in the first coil 120.

At least a portion of the second coil 170 may overlap the first coil 120 in the optical-axis direction.

At the initial position of the AF operation unit, at least a portion of the second coil 170 may overlap at least one of the first to fourth magnets in the optical-axis direction. However, the disclosure is not limited thereto. In another embodiment, there may be no overlap thereamong in the optical-axis direction.

The second coil 170 may overlap the first portion 8a1 of the first terminal 81a in the optical-axis direction. In addition, the second coil 170 may overlap the first portion 8a2 of the second terminal 81b in the optical-axis direction.

Referring to FIGS. 7 and 9, for example, a region of the ring portion of the second coil 170 may overlap the first region S1 of the first portion 8a1 of the first terminal 81a in the optical-axis direction, and may not overlap the second region S2.

In addition, for example, another region of the ring portion of the second coil 170 may overlap the first region S3 of the first portion 8a2 of the second terminal 81b in the optical-axis direction, and may not overlap the second region S4.

Figure 11:
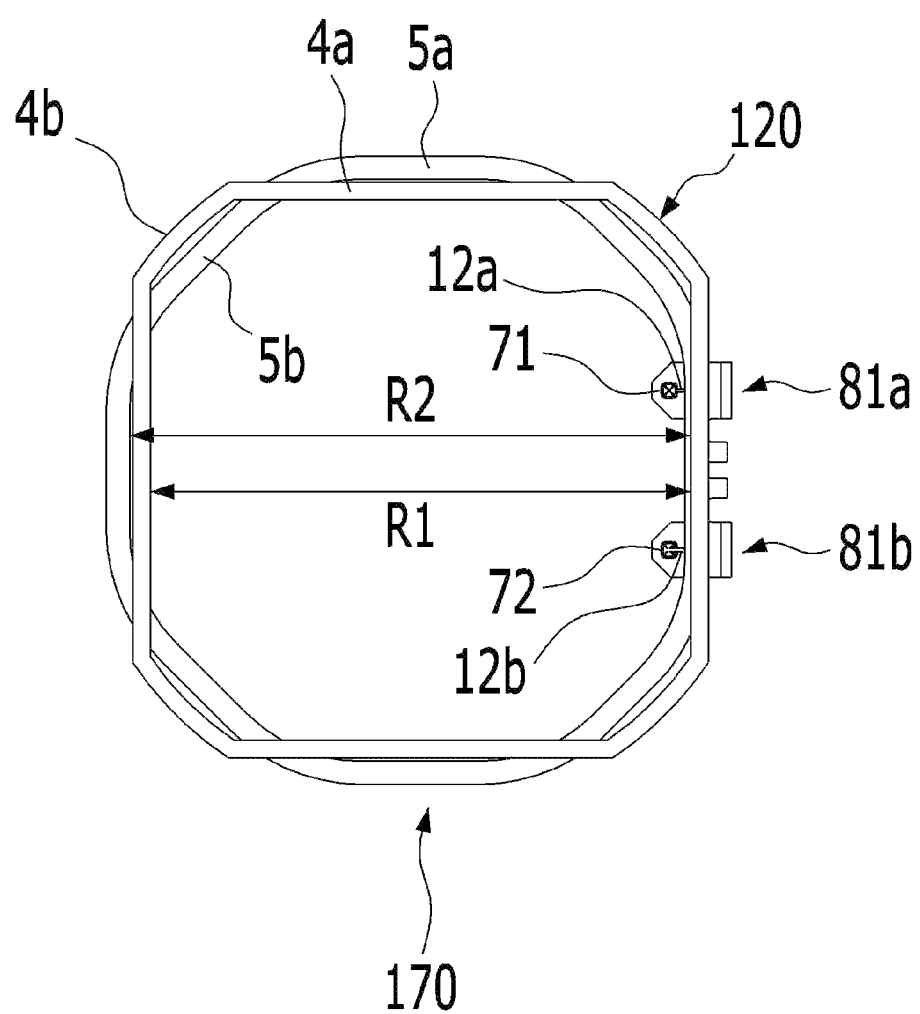
FIG. 11 is a plan view of the first coil, the second coil, and the first and second terminals.
Figure 12:
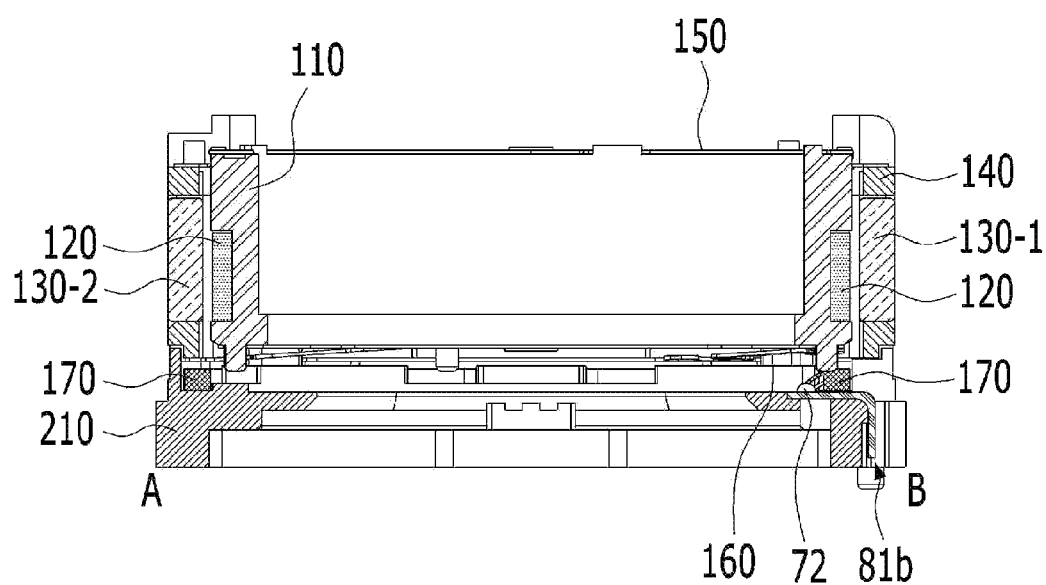
FIG. 12 is a sectional view of the lens moving apparatus in an AB direction of FIG. 3.

FIG. 11 is a plan view of the first coil 120, the second coil 170, and the first and second terminals 81a and 81b, and FIG. 12 is a sectional view of the lens moving apparatus 100 in an AB direction of FIG. 3.

Referring to FIGS. 7, 11, and 12, for example, the lens moving apparatus 100 may include first solder 71 configured to couple one end (or the start line) 12a of the second coil 170 and the first portion 8a1 of the first terminal 81a to each other. For example, the first solder 71 may be coupled to at least one of the first region S1 and the second region S2 of the first terminal 81a.

In addition, the lens moving apparatus 100 may include second solder 72 configured to couple the other end (or the end line) 12b of the second coil 170 and the first portion 8a2 of the second terminal 81b to each other. For example, the second solder 72 may be coupled to at least one of the first region S3 and the second region S4 of the second terminal 81b.

At least a portion of the second coil 170 may be disposed on the first portion 8a1 of the first terminal 81a and the first portion 8a2 of the second terminal 81b.

For example, at least a portion of the second coil 170 may overlap the first portion 8a1 of the first terminal 81a and the first portion 8a2 of the second terminal 81b in the optical-axis direction. In addition, for example, one end (or the start line) 12a or the other end 12b (e.g. the end line) of the second coil 170 of the second coil 170 may be located at a portion of the second coil 170 overlapping the first portion 8a1 of the first terminal 81a and the first portion 8a2 of the second terminal 81b in the optical-axis direction. In this case, the distance between the opposite ends 12a and 12b of the second coil 170 and the first portions 8a1 and 8a2 of the first and second terminals 81a and 81b is reduced, whereby soldering is easily performed and solderability is improved.

Unlike FIGS. 7 and 11, in another embodiment, the first solder may be coupled to the third portion 8c1 of the first terminal 81a, and may couple the third portion 8c1 of the first terminal 81a and one end of the second coil 170 to each other. Also, in another embodiment, the first solder may be coupled to the third portion 8c2 of the second terminal 81b, and may couple the third portion 8c2 of the second terminal 81b and the other end of the second coil 170 to each other.

In addition, for example, at least a portion of the first coil 120 may overlap the first portion 8a1 of the first terminal 81a and the first portion 8a2 of the second terminal 81b in the optical-axis direction. However, the disclosure is not limited thereto. In another embodiment, the first coil 120 may not overlap the first and second terminals 81a and 81b in the optical-axis direction.

The second coil 170 may be disposed under the bobbin 110.

The second coil 170 may include a shape corresponding to the first coil 120.

For example, the first coil 120 may include a ring portion having a circular, oval, or polygonal (e.g. quadrangular, pentagonal, or octagonal) shape.

The second coil 170 may include a ring portion having a circular, oval, or polygonal (e.g. quadrangular, pentagonal, or octagonal) shape.

The diameter R2 of the ring portion of the second coil 170 may be greater than the diameter R1 of the ring portion of the first coil 120. However, the disclosure is not limited thereto. For example, the diameter R1 may be the inner diameter of the inner surface of the first coil 120, and the diameter R2 may be the inner diameter of the inner surface of the second coil 170.

For example, the outer diameter of the ring portion of the second coil 170 may be greater than the outer diameter of the bobbin 110. However, the disclosure is not limited thereto. Here, the outer diameter of the ring portion of the second coil 170 may be the outer diameter of the second coil 170.

In addition, when viewed from above, the first and second solders 71 and 72 may be located inside the second coil 170, and the second portions 8b1 and 8b2 of the first and second terminals 81a and 81b may be located outside the second coil 170.

In addition, for example, when viewed from above, the first coil 120 may include first sides 4a and first corners 4b, and the second coil 170 may include second sides 5a and second corners 5b.

For example, the first sides 4a of the first coil 120 may be portions corresponding to or opposite the side portions 141-1 to 141-4 of the housing 140 or the magnets 130-1 to 130-4 disposed on the housing 140.

In addition, for example, the first corners 4b of the first coil 120 may be portions corresponding to or opposite the corner portions 142-1 to 142-4 of the housing 140.

In addition, for example, the second sides 5a of the second coil 170 may be portions corresponding to or opposite the side portions of the base 210, the side portions of the housing 140, or the first sides 4a of the first coil 120. In addition, for example, the second corners 5b of the second coil 170 may be portions corresponding to or opposite the corner portions of the base 210, the corner portions of the housing 140, or the first corners 4b of the first coil 120.

For example, when viewed from above, at least one of the second sides 5a of the second coil 170 may be disposed outside the first coil 120.

Alternatively, when viewed from above, at least one of the second corners 5b of the second coil 170 may be disposed inside the first coil 120.

Alternatively, for example, a portion of the second coil 170 overlapping the first and second terminals 81a and 81b in the optical-axis direction may overlap a portion of the first coil 120 in the optical-axis direction.

When viewed from above, the center of the ring portion of the second coil 170 may coincide with or may be aligned with the center of the base 210. At this time, for example, the center A1 of the base 210 may be the spatial middle of the base 210 in a two-dimensional plane perpendicular to the optical axis OA. For example, the center of the base 210 may be the center of the opening of the base 210.

In another embodiment, the center of the ring portion of the second coil 170 may not coincide with or may not be aligned with the center of the base 210. In this case, the following description of a lens moving apparatus 1100 given with reference to FIGS. 30A, 30B, 31, and 32 is applicable or adaptable.

The AF operation unit (or operator) may include the bobbin 110 elastically supported by the upper elastic member 150 and the lower elastic member 160 and components mounted to the bobbin 110 so as to be movable with the bobbin 110. For example, the AF operation unit may include the bobbin 110 and the first coil 120. In the case in which a lens is mounted, the AF operation unit may include a lens (not shown) mounted to the bobbin 110.

Also, in order to increase AF driving force, the length H1 (see FIG. 4B) of the first coil 120 in the optical-axis direction may be greater than the length H2 (see FIG. 6) of the second coil 170 in the optical-axis direction. In another embodiment, the length of the first coil 120 in the optical-axis direction may be equal to or less than the length of the second coil 170 in the optical-axis direction.

The second coil 170 may be an induction coil configured to sense the position or displacement of the AF operation unit, e.g. the bobbin 110. For example, the second coil 170 may be a wire. However, the disclosure is not limited thereto. In another embodiment, the second coil may be an FPCB or a fine pattern (FP) coil.

For example, when the AF operation unit is moved due to interaction between the first coil 120 to which a driving signal is provided and the magnet 130, induced voltage may be generated in the second coil 170. For example, as the distance between the first coil 120 and the second coil 170 is decreased as the result of movement of the bobbin 110, induced voltage generated in the second coil 170 may be increased. On the other hand, as the distance between the first coil 120 and the second coil 170 is increased, induced voltage generated in the second coil 170 may be decreased.

As described, the magnitude of induced voltage generated in the second coil 170 may be sensed, whereby displacement of the AF operation unit may be sensed, and AF feedback operation may be performed using the sensed displacement of the AF operation unit, whereby accurate AF operation may be performed.

In general, for autofocus (AF) feedback control, a position sensor configured to sense displacement of the AF operation unit, e.g. the bobbin, and a separate power connection structure configured to drive the position sensor are necessary, whereby cost of the lens moving apparatus may be increased and the manufacturing process may be difficult.

In addition, a linear section of a graph between the movement distance of the bobbin and magnetic flux of the magnet sensed by the position sensor (hereinafter referred to as a "first linear section") may be restricted by a positional relationship between the magnet and the position sensor.

Since no separate position sensor configured to sense displacement of the bobbin 2110 is necessary in the embodiment, it is possible to reduce cost of the lens moving apparatus and to improve ease of manufacture.

In addition, since mutual induction between the first coil 120 and the second coil 170 is used, a linear section of a graph between the movement distance of the bobbin 110 and induced voltage of the second coil 170 may be wider than the first linear section. In the embodiment, therefore, it is possible to secure linearity over a wide section, to reduce a process defect rate, and to perform more accurate AF feedback control.

In order to provide a driving signal to the first coil 120 and to receive voltage of the second coil 170 using the lower elastic member, the lower elastic member must include at least four elastic members separated from each other. The four elastic members must include connection terminals for connection with the outside. The connection terminals may be disposed on two different outer surfaces of the base. As a result, soldering for connection with the outside cannot be performed in one direction, and the amount of work may be increased. In addition, since work is performed in the state in which the lower elastic member is divided into four parts, spring change defects may be increased and thus work difficulty may be increased.

The lens moving apparatus 100 according to the embodiment may include the terminals 81a and 81b, which are components separate from the lower elastic member 160, in order to receive induced voltage of the second coil 170. In addition, the terminals 81a and 81b and the connection terminals 164-1 and 164-2 of the elastic members 160-1 and 160-2 are disposed on one outer surface 208 of the base 210, whereby it is possible to reduce the amount of soldering work and to improve convenience in soldering. Also, in the embodiment, the lower elastic member 4 is not divided into four parts, whereby it is possible to reduce a spring change defect rate.

Figure 13:
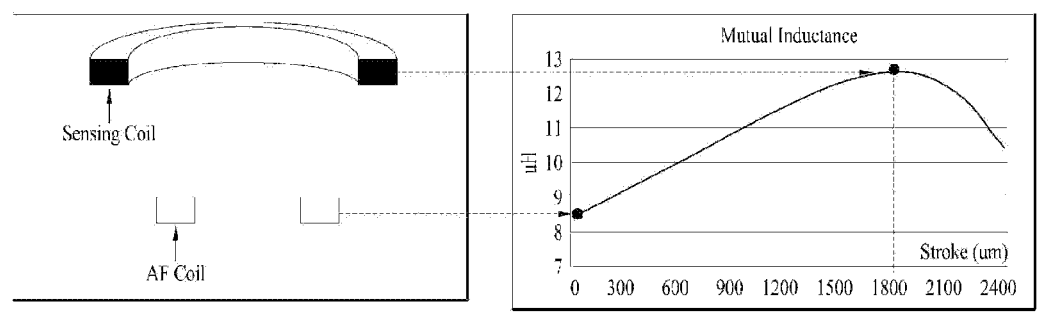
FIG. 13 shows mutual inductance according to the distance between the first coil and the second coil.

FIG. 13 shows mutual inductance according to the distance between the first coil and the second coil.

FIG. 13 shows a change in mutual inductance between the first coil and the second coil due to movement of the first coil mounted to the bobbin in the upward direction in the structure in which the first coil, which is an AF driving coil, is disposed on the lower side of the second coil, which is a sensing coil.

Referring to FIG. 13, in the case in which the distance between the first coil and the second coil is less than a predetermined distance (e.g. 100 μm), linearity of a change in mutual inductance between the first coil and the second coil according to displacement of the bobbin may be rapidly deteriorated. Induced voltage generated in the second coil is proportional to mutual inductance between the first coil and the second coil. In the case in which the distance between the first coil and the second coil is less than the predetermined distance (e.g. 100 μm), therefore, linearity of a change in induced voltage of the second coil according to displacement of the bobbin may be rapidly deteriorated.

In the structure in which the first coil, which is an AF driving coil, is disposed on the lower side of the second coil, which is a sensing coil, therefore, design must be performed such that the distance between the first coil and the second coil at the highest position of the bobbin is equal to or greater than the predetermined distance (e.g. 100 μm) in order to secure linearity of induced voltage of the second coil. Consequently, design freedom in disposition of the first coil and the second coil is limited, and the overall thickness of the lens moving apparatus may be increased.

In the embodiment, on the other hand, the second coil 170 is disposed in the base 210 located at the lower side of the first coil 120. When the bobbin 110 is moved from above, therefore, the first coil 120 and the second coil 170 become distant from each other. As long as the distance between the first coil and the second coil at the initial position of the bobbin 110 in the case of unidirectional driving or the lowest position of the bobbin 110 in the case of bidirectional driving is set to about the predetermined distance (e.g. 100 μm), linearity of induced voltage of the second coil 170 is automatically maintained even though the bobbin 110 is moved upwards, whereby it is possible to alleviate limitation in designing the disposition of the driving coil 120 and the sensing coil 170 and to reduce the thickness of the lens moving apparatus.

The lens moving apparatus 100 may further include a magnetic member (not shown) disposed on the second coil 170 in order to increase the magnitude of induced voltage generated in the second coil 170.

The magnetic member may have the same ring shape as the second coil 170 and the same diameter as the second coil. In addition, the width of the magnetic member and the width of the second coil 170 may be equal to each other. However, the disclosure is not limited thereto. In another embodiment, the width of the magnetic member may be greater than the width of the second coil 170.

For example, the magnetic member and the second coil 170 may be disposed in the recess 25 of the base 210. The lower surface of the magnetic member may abut the upper surface of the second coil 170.

In another embodiment, the magnetic member may be disposed under the second coil 170.

The magnetic member may be an iron core or a ferrite core having magnetism. For example, the ferrite core may be MnZn or NiZn. An MnZn-based ferrite core may be used for low frequencies, and an NiZn-based ferrite core may be used for high frequencies.

In another embodiment, the magnetic member may be disposed outside the second coil 170. The inner surface of the magnetic member may abut the outer surface of the second coil 170. In another embodiment, the second coil 170 may be located outside the magnetic member, and the outer surface of the magnetic member may abut the inner surface of the second coil 170.

Figure 14:
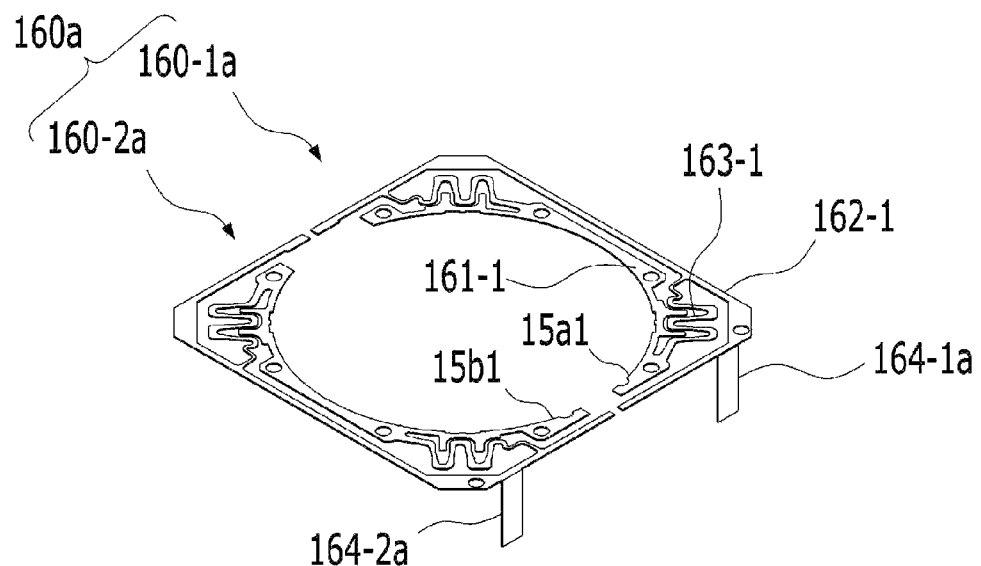
FIG. 14 is a perspective view of a lower elastic member, a base, a second coil, and first and second terminals according to another embodiment.
Figure 14:
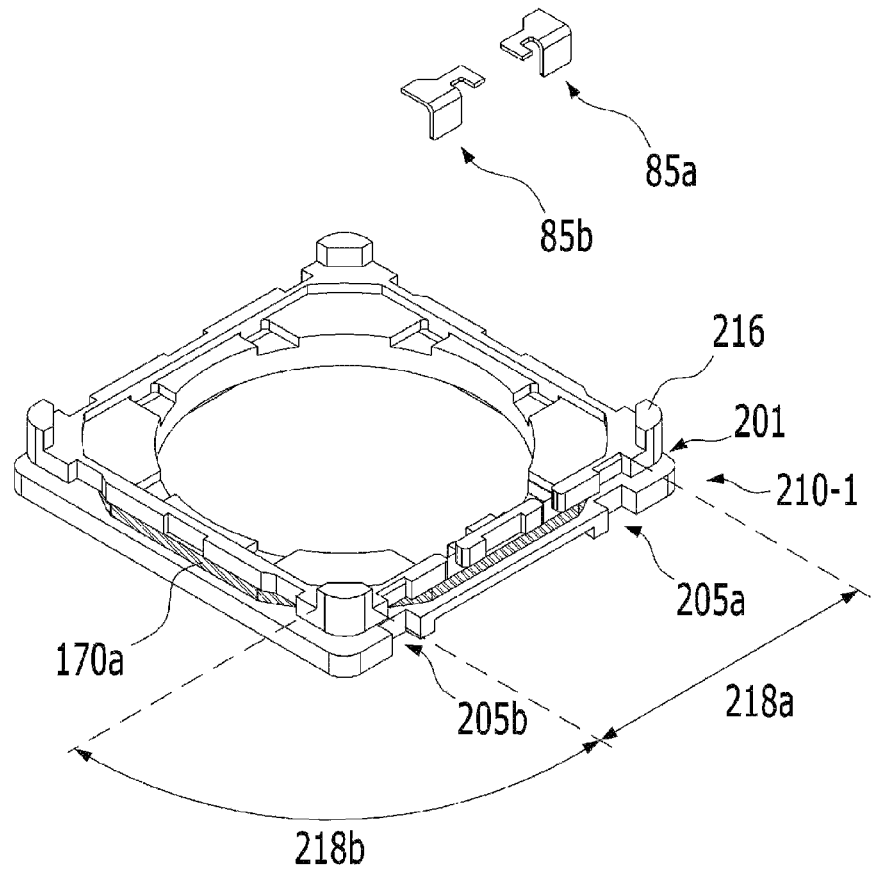
Figure 15:
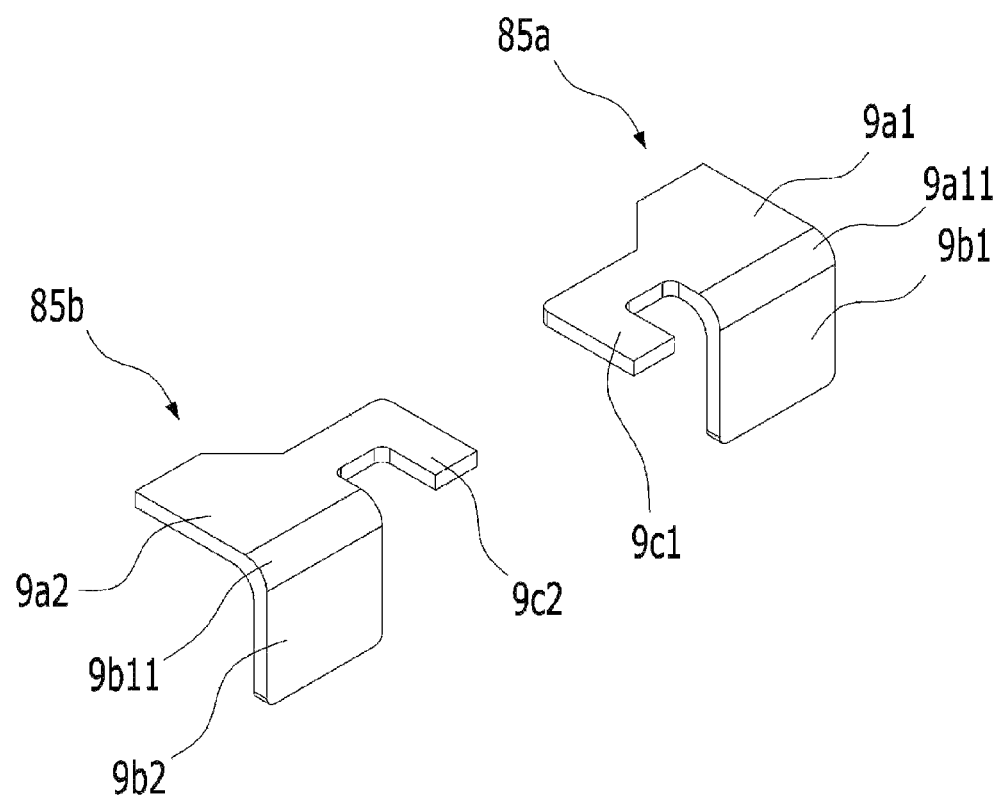
FIG. 15 is an enlarged view of the first and second terminals shown in FIG. 14.
Figure 16:
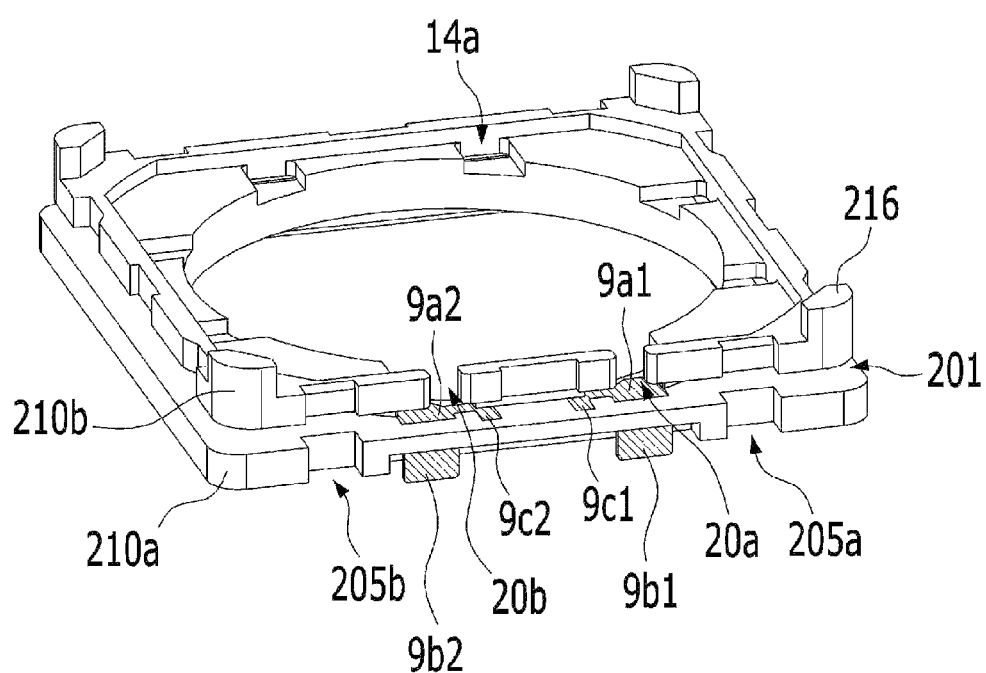
FIG. 16 is a coupled perspective view of the base and the first and second terminals shown in FIG. 14.
Figure 17:
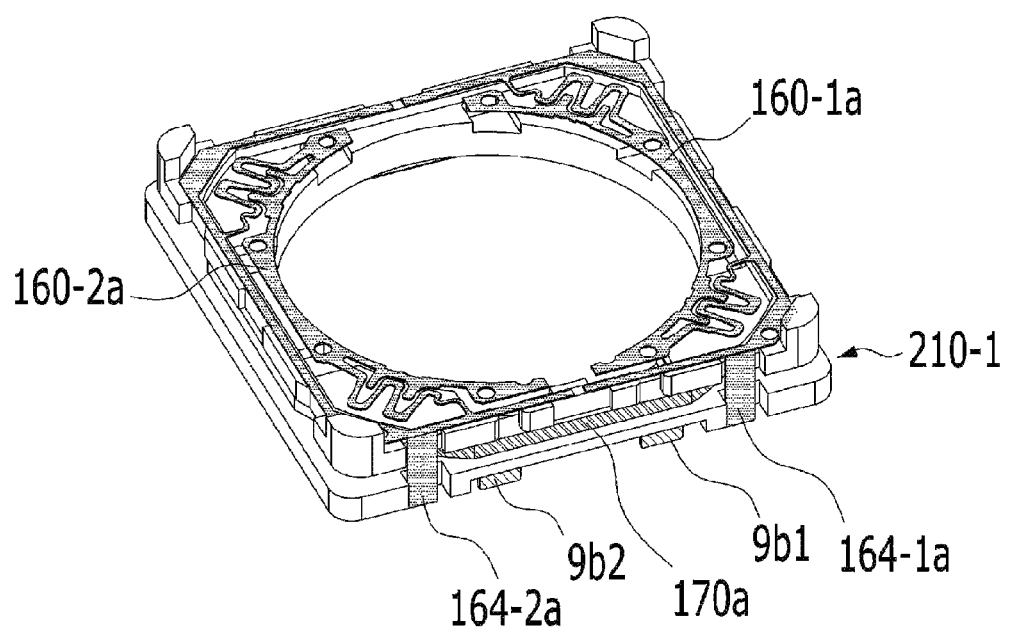
FIG. 17 is a coupled perspective view of first and second elastic members, the base, the second coil, and the first and second terminals shown in FIG. 14.
Figure 18:
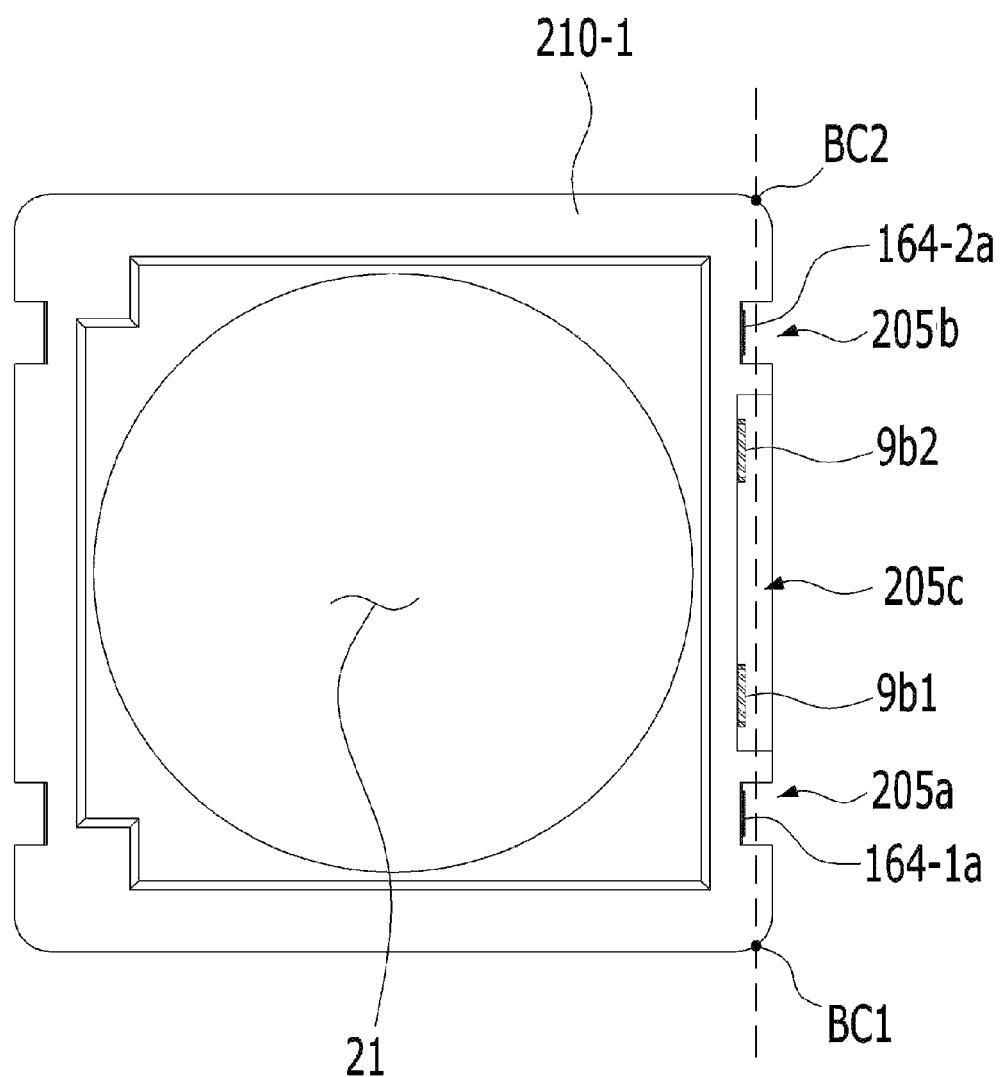
FIG. 18 is a bottom view of FIG. 17.

FIG. 14 is a perspective view of a lower elastic member 160a, a base 210-1, a second coil 170a, and first and second terminals 85a and 85b according to another embodiment, FIG. 15 is an enlarged view of the first and second terminals 85a and 85b shown in FIG. 14, FIG. 16 is a coupled perspective view of the base 210-1 and the first and second terminals 85a and 85b shown in FIG. 14, FIG. 17 is a coupled perspective view of first and second elastic members 160-1a and 160-2a, the base 210-1, the second coil 170a, and the first and second terminals 85a and 85b shown in FIG. 14, and FIG. 18 is a bottom view of FIG. 17.

The above description of the bobbin 110, the first coil 120, the magnet 130, the housing 140, and the blocking unit 250 is applicable to the embodiment shown in FIGS. 13 to 16.

Referring to FIGS. 14 to 18, the second coil 170a may be disposed under the lower elastic member 160a, and may be disposed on the outer surface of the base 210-1.

For example, the second coil 170a may be disposed so as to be wound around the outer surface of the base 210-1 in the clockwise direction or the counterclockwise direction based on the optical axis OA.

For example, a recess 201 may be provided in the outer surface of the base 210-1.

For example, the recess 201 of the base 210-1 may have a structure depressed from the outer surface of the base 210-1. The recess 201 may be spaced apart from each of the upper surface and the lower surface of the base 210-1. As a result, the second coil 170a disposed or wound in the recess 201 of the base 210-1 may be inhibited from being separated from the base 210-1.

A first length of the second coil 170a disposed in the recess 201 of the base 210-1 in the optical-axis direction may be less than a second length of the second coil in a direction from the inner circumferential surface to the outer circumferential surface of the base 210-1 and perpendicular to the optical axis OA. As a result, it is possible to reduce the height or length of the lens moving apparatus 100 in the optical-axis direction. In another embodiment, the first length of the second coil 170a may be equal to or greater than the second length of the second coil 170a.

The base 210-1 may include side portions (e.g. 218a) corresponding to or opposite the side portions 141-1 to 141-4 of the housing 140 and corner portions (e.g. 218b) corresponding to or opposite the corner portions 142-1 to 142-4 of the housing 140.

For example, the side portions (e.g. 218a) of the base 210-1 may have flat outer surfaces, and the corner portions 218b may have curved outer surfaces.

The recess 201 of the base 210-1 may be depressed from the outer surfaces of the side portions (e.g. 218a) and the corner portions (e.g. 218b) of the base 210-1, and may have a ring shape.

First and second depressed portions 205a and 205b corresponding to first and second connection terminals 164-1a and 164-2a of the first and second elastic members 160-1a and 160-2a may be provided in the outer surface of one of the side portions (e.g. 218a) of the base 210-1.

In addition, a third depressed portion 205c, which is disposed between the first depressed portion 205a and the second depressed portion 205b, may be provided in the outer surface of one of the side portions (e.g. 218a) of the base 210-1.

A second portion 9b1 of the first terminal 85a and a second portion 9b2 of the second terminal 85b may be disposed in the third depressed portion 205c.

For example, a first distance from the outer surface of the base 210-1 to the bottom of the third depressed portion 205c may be greater than a second distance from the outer surface of the base 210-1 to the bottom of the first depressed portion 205a. In addition, the first distance may be greater than a third distance from the outer surface of the base 210-1 to the bottom of the second depressed portion 205b. In another embodiment, the first distance may be equal to or less than the second distance and the third distance.

The first connection terminal 164-1a may be disposed on the bottom of the first depressed portion 205a, the second connection terminal 164-2a may be disposed on the bottom of the second depressed portion 205b, and the second portions 9b1 and 9b2 of the first and second terminals 85a and 85b may be disposed on the bottom of the third depressed portion 205c.

For example, each of the first and second depressed portions 205a and 205b may include an upper opening that is open to the upper surface of the base 210-1 and a lower opening that is open to the lower surface of the base 210-1.

In addition, for example, a third depressed portion 205c may include an opening that is open to the lower surface of the base 210-1.

The distance from the outer surface of the base 210-1 to one depressed surface of each of the first and second depressed portions 205a and 205b may be less than the distance from the outer surface of the base 210-1 to one depressed surface of the recess 201.

For example, based on the outer surface of the base 210-1, the depressed depth of each of the first and second depressed portions 205a and 205b may be less than the depressed depth of the recess 201.

As a result, spatial interference between the first and second connection terminals 164-1a and 164-2a of the lower elastic member 160a, disposed in the first and second depressed portions 205a and 205b of the base 210-1, and the second coil 170a, disposed in the recess 201 of the base 210-1, may be avoided.

For example, the first and second connection terminals 164-1a and 164-2a may be spaced apart from the second coil 170a. However, the disclosure is not limited thereto. In another embodiment, there may be contact therebetween.

Referring to FIG. 15, the first terminal 85a and the second terminal 85b may be disposed on the base 210-1.

The first and second terminals 85a and 85b may include first portions 9a1 and 9a2 and second portions 9b1 and 9b2, respectively. In addition, the first and second terminals 85a and 85b may further include third portions 9c1 and 9c2, respectively. A description of the first portions 8a1 and 8a2, the second portions 8b1 and 8b2, and the third portions 8c1 and 8c2 of the first and second terminals 81a and 81b of FIG. 9 is applicable to the first portions 9a1 and 9a2, the second portions 9b1 and 9b2, and the third portions 9c1 and 9c2 of FIG. 15.

In addition, the first and second terminals 85a and 85b may include bent portions 9a11 and 9b11 disposed between the first portions 9a1 and 9a2 and the second portions 9b1 and 9b2, respectively. A description of the bent portions 8a11 and 8b11 of FIG. 9 is applicable to the bent portions 9a11 and 9b11 of FIG. 15.

Although not shown in FIG. 15, each of the first portions 9a1 and 9a2 of the first and second terminals 85a and 85b may include a first region and a second region, and a description of the first regions S1 and S3 and the second regions S2 and S4 of the first portions 8a1 and 8a2 of the first and second terminals 81a and 81b of FIG. 9 is applicable thereto.

The shape of the second regions of the first portions 9a1 and 9a2 of the first and second terminals 85a and 85b of FIG. 15 is partially different from the shape of the second regions S2 and S4 of the first portions 8a1 and 8a2 of the first and second terminals 81a and 81b of FIG. 9. However, the shape of the second regions S2 and S4 shown in FIGS. 9 and 15 is provided merely as an example, and various shapes are possible.

The lower elastic member 160a of FIG. 14 may include first and second elastic members 160-1a and 160-2a.

Each of the first and second elastic members 160-1a and 160-2a may include a second inner frame 161-1 coupled to the bobbin 110, a second outer frame 162-1 coupled to the housing 140, a frame connection portion 163-1 configured to connect the second inner frame 161-1 and the second outer frame 162-1 to each other, and a connection terminal 164-1a or 164-2a.

A bonding portion 15a1 or 15b1, to which the first coil 120 is coupled, may be provided at one end of the second inner frame 161-1 of each of the first and second elastic members 160-1a and 160-2a.

The bonding portion 15a1 or 15b1 may be provided at a region of the second inner frame 161-1 connected to the second outer frame 162-1, at which the connection terminal 164-1a or 164-2a is disposed, by the frame connection portion 163-1. However, the disclosure is not limited thereto.

A description of the first and second connection terminals 164-1 and 164-2 shown in FIG. 6 is applicable to the first and second connection terminals 164-1a and 164-2a of FIG. 14.

Referring to FIG. 16, the first portions 9a1 and 9a2 of the first and second terminals 85a and 85b may be exposed from the recess 201. However, the disclosure is not limited thereto. In another embodiment, the first portions may not be exposed from the recess.

In addition, for example, the third portions 9c1 and 9c2 of the first and second terminals 85a and 85b may be exposed from the recess 201 of the base 210-1. However, the disclosure is not limited thereto. In another embodiment, the third portions may not be exposed from the recess.

The first and second terminals 85a and 85b may be disposed under the second coil 170a.

At least a portion of each of the first portions 9a1 and 9a2 of the first and second terminals 85a and 85b may be exposed from the upper surface of the base 210-1 so as to be soldered to the second coil 170a, and at least a portion of each of the second portions 9b1 and 9b2 of the first and second terminals 85a and 85b may be exposed from the outer surface of the base 210-1 so as to be connected to the outside (e.g. by soldering).

For example, the first portions 9a1 and 9a2 of the first and second terminals 85a and 85b may be disposed under the second coil 170a. For example, at least a portion (e.g. a first region) of each of the first portions 9a1 and 9a2 of the first and second terminals 85a and 85b may overlap the second coil 170a in the optical-axis direction.

In addition, for example, each of the first portions 9a1 and 9a2 of the first and second terminals 85a and 85b may have another portion (e.g. a second region) that does not overlap the second coil 170a in the optical-axis direction.

For example, the second coil 170 and the second regions of the first portions 9a1 and 9a2 of the first and second terminals 85a and 85b may be coupled to each other by soldering.

In addition, the third portions 9c1 and 9c2 of the first and second terminals 85a and 85b may extend under the recess 201 of the base 210-1 (or the second coil 170a).

For example, at least a portion of each of the third portions 9c1 and 9c2 of the first and second terminals 85a and 85b may be located under the recess 201 of the base 210-1 (or the second coil 170a).

The second portions 9b1 and 9b2 of the first and second terminals 85a and 85b may be disposed between the first and second connection terminals 164-a1 and 164-a2.

The first and second connection terminals 164-1a and 164-2a may be located outside the second coil 170a. For example, the first and second connection terminals 164-1a and 164-2a may not overlap the second coil 170a in the optical-axis direction.

For example, the third portions 9c1 and 9c2 of the first and second terminals 85a and 85b may overlap the second coil 170a in the optical-axis direction.

The second coil 170a and the first and second connection terminals 164-1a and 164-2a may all be disposed on the outer surface of the base 210-1, and the second portions 9b1 and 9b2 of the first and second terminals 85a and 85b and the first and second connection terminals 164-1a and 164-2a may extend under the recess 201 in which the second coil 170a is disposed.

Referring to FIG. 18, the first and second terminals 85a and 85b and the first and second connection terminals 164-1a and 164-2a may be located inside a reference line 207.

For example, the second portions 9b1 and 9b2 of the first and second terminals 85a and 85b and the first and second connection terminals 164-1a and 164-2a may be located inside the reference line 207.

Here, the reference line 207 may be an imaginary straight line that links two corners BC1 and BC2 of the lower surface of the base 210-1 adjacent to the outer surface of the base 210-1, at which the second portions 9b1 and 9b2 of the first and second terminals 85a and 85b and the first and second connection terminals 164-1a and 164-2a are disposed.

For example, the inside of the reference line 207 may be the side at which an opening 21 of the base 210-1 is located based on the reference line 207.

The first and second terminals 85a and 85b and the first and second connection terminals 164-1a and 164-2a may not deviate or protrude outwards from the reference line 207. Here, the outside of the reference line may be the side opposite the inside of the reference line 207.

Referring to FIG. 18, the second portions 9b1 and 9b2 of the first and second terminals 85a and 85b may be disposed more inwards than the first and second connection terminals 164-1a and 164-2a based on the reference line 207. However, the disclosure is not limited thereto. In another embodiment, the first and second connection terminals 164-1a and 164-2a may be located more inwards from the reference line 207 than the second portions 9b1 and 9b2 of the first and second terminals 85a and 85b in the state of being spaced apart therefrom. In a further embodiment, the first and second connection terminals 164-1a and 164-2a and the second portions 9b1 and 9b2 of the first and second terminals 85a and 85b may be located inwards from the reference line 207 in the state of being spaced apart from each other by the same distance.

In FIG. 10 or 17, the second portions 8b1 and 8b2 or 9b1 and 9b2 of the first and second terminals 81a and 81b or 85a and 85b are located between the first and second connection terminals 164-1 and 164-2 or 164-1a and 164-2a. However, the disclosure is not limited thereto. In another embodiment, the first and second connection terminals 164-1 and 164-2 or 164-1a and 164-2a may be disposed between the second portion 8b1 or 9b1 of the first terminal 81a or 85a and the second portion 8b2 or 9b2 of the second terminal 81b or 85b.

In FIGS. 17 and 18, the second portions 8b1 and 8b2 or 9b1 and 9b2 of the first and second terminals 81a and 81b or 85a and 85b and the first and second connection terminals 164-1a and 164-2a do not protrude under the bottom of the base 210-1. However, the disclosure is not limited thereto.

For example, in another embodiment, a portion of each of the second portions 8b1 and 8b2 or 9b1 and 9b2 of the first and second terminals 81a and 81b or 85a and 85b may be exposed or may protrude under the lower surface of the base 210-1. For example, in another embodiment, a portion of each of the first and second connection terminals 164-1a and 164-2a may be exposed or may protrude under the lower surface of the base 210-1. At this time, a portion of each of the second portions 8b1 and 8b2 or 9b1 and 9b2 protruding under the lower surface of the base 210-2 and a portion of each of the first and second connection terminals 164-1a and 164-2a may be coupled to terminals of a circuit board 800 of a camera module 200 by soldering.

In the case in which the depth of the recess 201 in which the second coil 170a is disposed is large, spatial interference between the second coil 170a and the first and second terminals 85a and 85b may be avoided, and spatial interference between the second coil 170a and the first and second connection terminals 164-1a and 164-2a may be avoided or escaped. However, the injection process of the base 210 to form the recess 201 so as to have a large depth is not easy. In the case in which the recess 201 is formed so as to have a large depth, the length of the second coil 170a wound in the recess 201 is reduced, whereby it is not possible to secure a predetermined resistance value of the second coil 170a.

Also, in the case in which the second coil is disposed on the upper surface of the base, the thickness of the base must be sufficiently considered in order to prevent interference with the lower elastic member. In the embodiment of FIG.

14, however, it is possible to reduce the thickness of the base 210-1, since the second coil 170a is disposed on the outer surface of the base 210-1.

In addition, since the second coil 170a is disposed so as to be wound around the outer surface of the base 210-1, it is possible to increase one winding length of the second coil 170a. Compared to the second coil disposed on the upper surface of the base, therefore, it is possible to increase the magnitude of induced voltage of the second coil 170a at the same number of windings.

In addition, the number of windings of the second coil 170 or 170a disposed on the base 210 or 210-1 may be greater than the number of windings of the first coil 120 wound around the bobbin 110. However, the disclosure is not limited thereto. In another embodiment, the number of windings of the second coil 170 or 170a disposed on the base 210 or 210-1 may be equal to or less than the number of windings of the first coil 120 wound around the bobbin 110.

In the above embodiment, the first coil 120 is coupled to the first and second connection terminals 164-1 and 164-2 or 164-1a and 164-2a of the first and second elastic members 160-1 and 160-2 or 160-1a and 160-2a, and the second coil 170 or 170a is coupled to the first and second terminals 81a and 81b or 85a and 85b. However, the disclosure is not limited thereto.

In another embodiment, the first coil 120 may be coupled to the first and second terminals 81a and 81b or 85a and 85b, and the second coil 170 or 170a may be coupled to the first and second connection terminals 164-1 and 164-2 or 164-1a and 164-2a.

In another embodiment, a first recess for the first terminal 85a and a second recess for the second terminal 85b may be formed in the first outer surface of the base 210-1, the first terminal 85a may be inserted into the first recess of the base 210-1, the second terminal 85b may be inserted into the second recess of the base 210-1, one end of the second coil 170a and the first terminal 85a may be coupled to each other by first solder, and the other end of the second coil 170a and the second terminal 85b may be coupled to each other by second solder.

Figure 19:
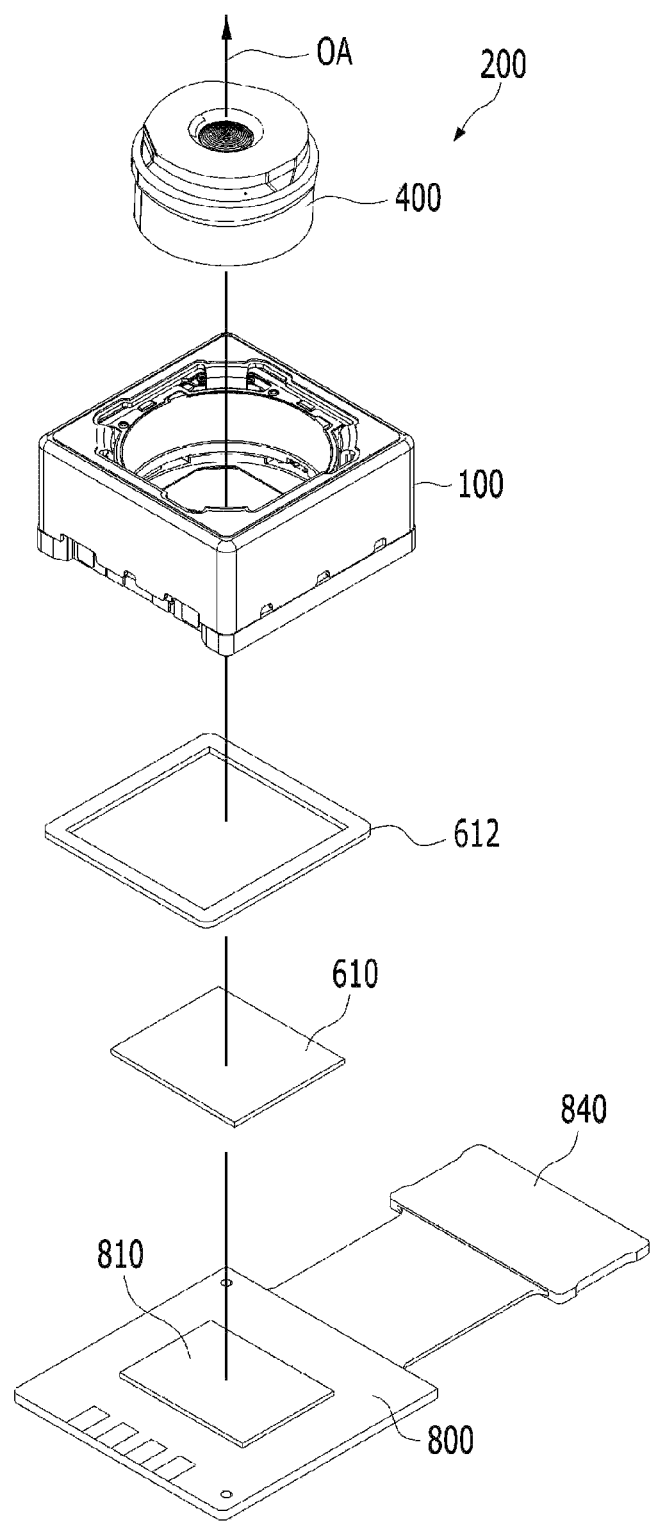
FIG. 19 is an exploded perspective view of a camera module according to an embodiment.

FIG. 19 is an exploded perspective view of a camera module 200 according to an embodiment.

Referring to FIG. 19, the camera module may include a lens module 400, a lens moving apparatus 100, an adhesive member 612, a filter 610, a circuit board 800, an image sensor 810, and a connector 840.

The lens module 400 may include a lens or a lens barrel, and may be mounted or coupled to the bobbin 110 of the lens moving apparatus 100.

For example, the lens module 400 may include one or more lenses and a lens barrel configured to receive one or more lenses. However, a configuration of the lens module is not limited to the lens barrel. Any holder structure capable of supporting one or more lenses may be used. The lens module may be coupled to the lens moving apparatus 100 so as to be moved with the lens moving apparatus 100.

As an example, the lens module 400 may be thread-engaged with the lens moving apparatus 100. As an example, the lens module 400 may be coupled to the lens moving apparatus 100 using an adhesive (not shown). Meanwhile, light passing through the lens module 400 may irradiate the image sensor 810 via the filter 610.

The adhesive member 612 may couple or adhere the base 210 of the lens moving apparatus 100 to the circuit board 800. For example, the adhesive member 612 may be an epoxy, a thermo-hardening adhesive, or an ultraviolet-hardening adhesive.

The filter 610 may function to prevent a specific-frequency-band component of light passing through the lens module 400 from being incident on the image sensor 810. The filter 610 may be an infrared cutoff filter; however, the disclosure is not limited thereto. At this time, the filter 610 may be disposed parallel to an x-y plane.

The infrared cutoff filter may be made of a film material or a glass material. As an example, the infrared cutoff filter may be formed by coating a flat optical filter, such as a cover glass configured to protect an imaging surface, with an infrared cutoff coating material.

The filter 610 may be disposed under the base 210 of the lens moving apparatus 100.

For example, the base 210 of the lens moving apparatus 100 may be provided at the lower surface thereof with a seating portion on which the filter 610 is seated. In another embodiment, a separate sensor base on which the filter 610 is seated may be provided.

The circuit board 800 may be disposed on the lower portion of the lens moving apparatus 100, and the image sensor 810 may be mounted on the circuit board 800. The image sensor 810 may receive an image included in light incident through the lens moving apparatus 100, and may convert the received image into an electrical signal.

The image sensor 810 may be located so as to have the same optical axis as the lens module 400. As a result, the image sensor may acquire light passing through the lens module 400. The image sensor 810 may output an image based on incident light.

The circuit board 800 may be connected to the first coil 120 and the second coil 170 of the lens moving apparatus 100.

For example, the circuit board 800 may be provided with terminals connected to the first and second connection terminals 164-1 and 164-2 and the first and second terminals 81a and 81b of the lens moving apparatus 100.

The filter 610 and the image sensor 810 may be disposed spaced apart from each other while being opposite each other in the first direction.

The connector 840 may be connected to the circuit board 800, and may have a port for connection with an external device.

Although not shown in FIG. 19, the camera module 200 may further include a motion sensor configured to output information about rotational angular velocity based on movement of the camera module 200 and a controller configured to control AF driving of the lens moving apparatus 100.

Figure 20:
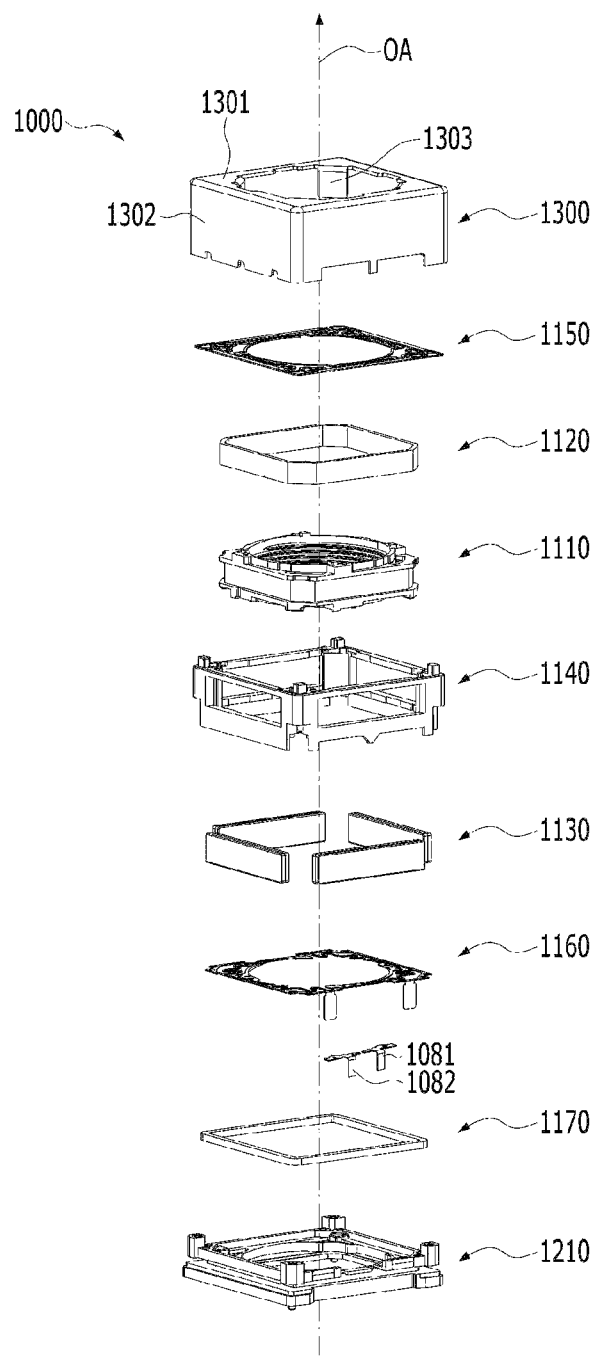
FIG. 20 is a separated perspective view of a lens moving apparatus according to another embodiment.
Figure 21:
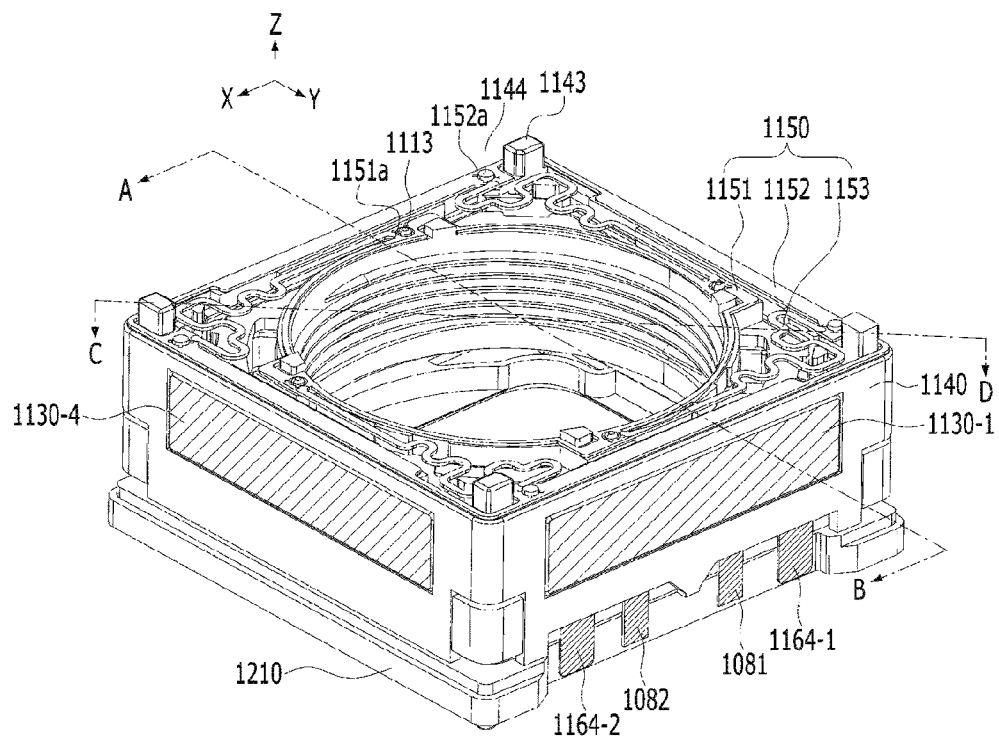
FIG. 21 is a coupled view of the lens moving apparatus with a cover member removed.

FIG. 20 is a separated perspective view of a lens moving apparatus 1100 according to another embodiment, and FIG. 21 is a coupled view of the lens moving apparatus 1100 with a cover member 1300 removed.

Referring to FIGS. 20 and 21, the lens moving apparatus 1100 may include a bobbin 1110, a coil 1120, a magnet 1130, a housing 1140, a base 1210, a sensing coil 1170, a lower elastic member 1160, a first terminal 1081, and a second terminal 1082.

In addition, the lens moving apparatus 1100 may further include at least one of an upper elastic member 1150 and a cover member 1300.

The lens moving apparatus 1100 may further include the magnetic member of the embodiment 100 of FIG. 1, and a description of the magnetic member of the embodiment of FIG. 1 is applicable or adaptable.

The bobbin 1110 and the housing 1140 will be described.

Figure 22A:
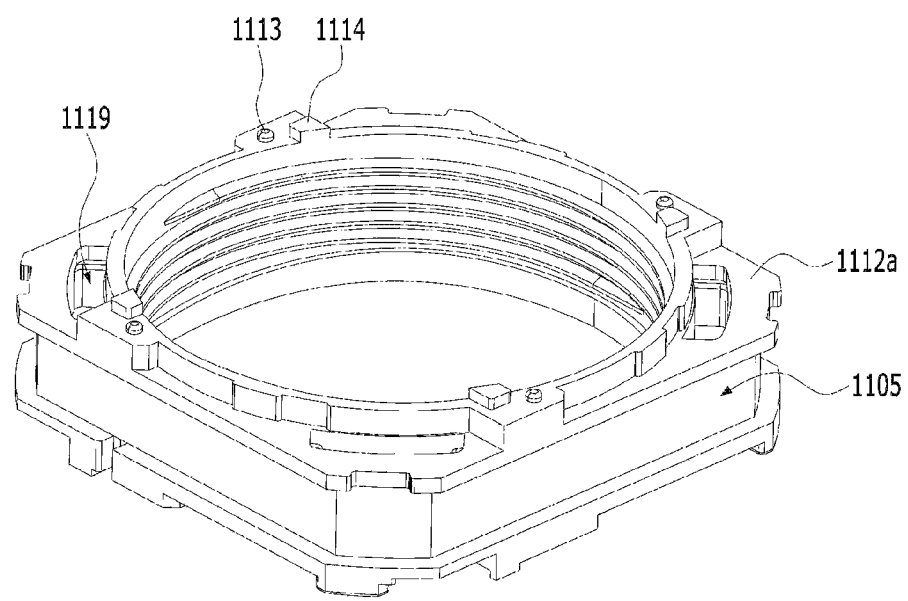
FIG. 22A is a perspective view of a bobbin shown in FIG. 20.
Figure 22B:
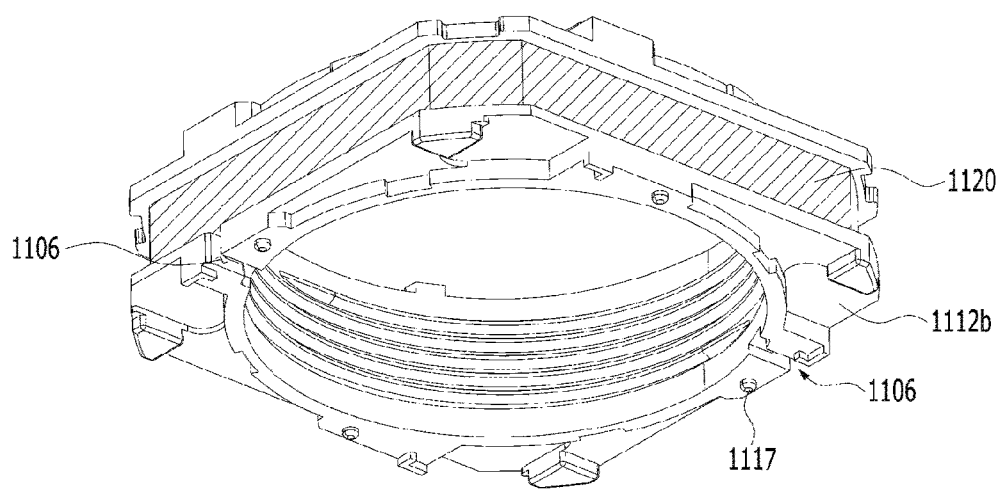
FIG. 22B is a coupled view of the bobbin and a coil of FIG. 20.
Figure 23A:
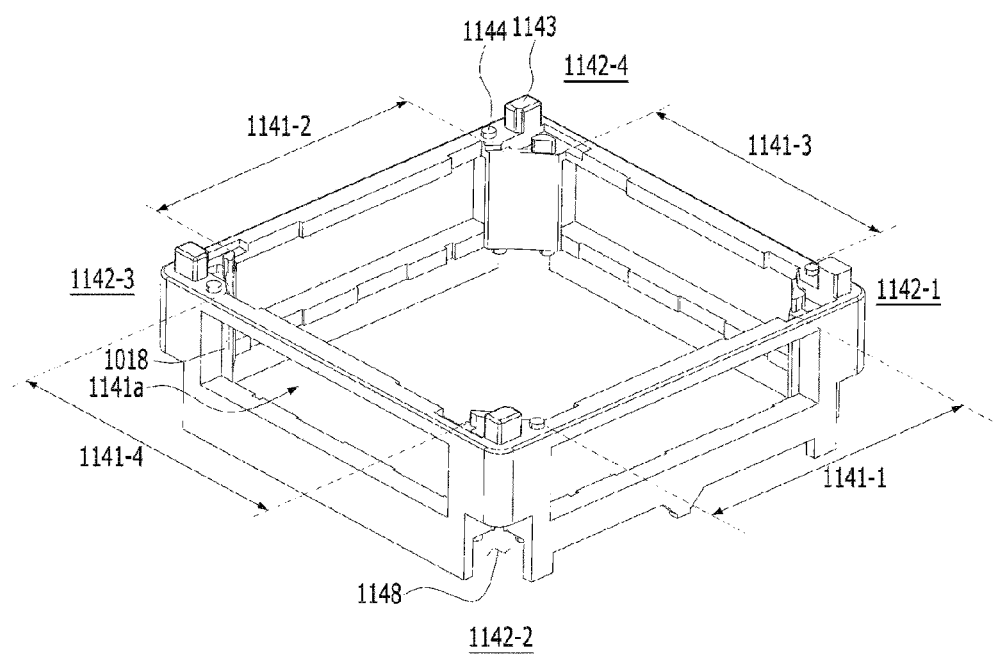
FIG. 23A is a perspective view of a housing of FIG. 20.
Figure 23B:
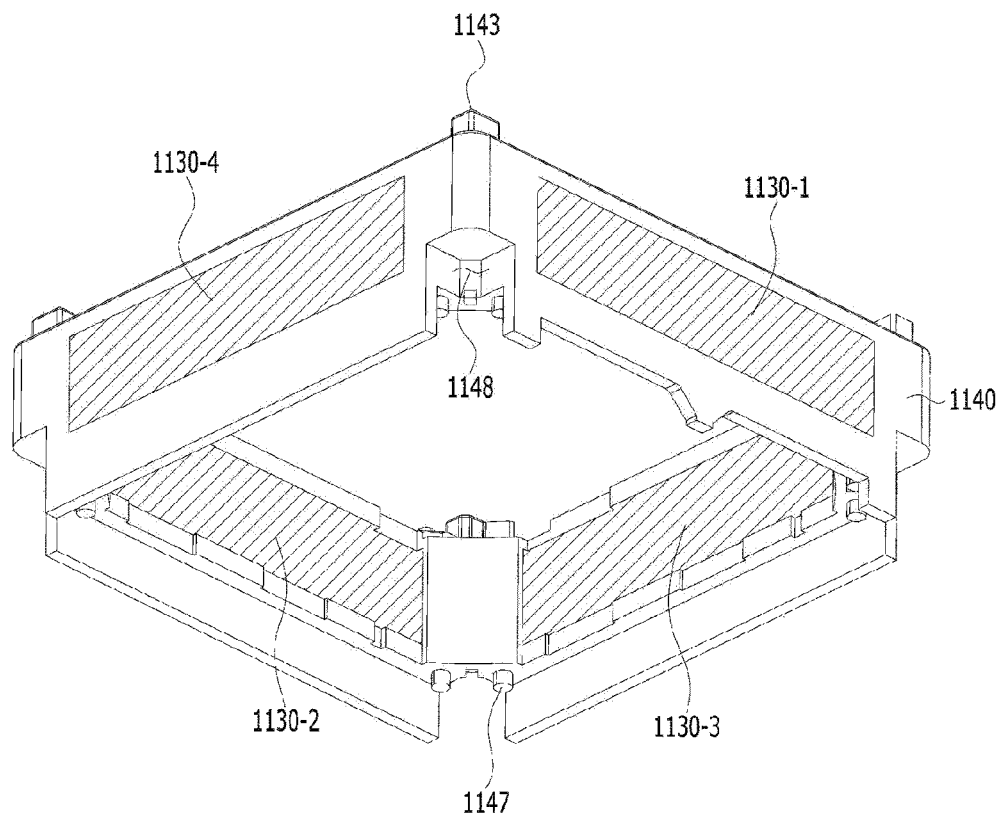
FIG. 23B is a coupled view of the housing and a magnet of FIG. 20.

FIG. 22A is a perspective view of the bobbin 1110 shown in FIG. 20, FIG. 22B is a coupled view of the bobbin 1110 and the coil 1120, FIG. 23A is a perspective view of the housing 1140, and FIG. 23B is a coupled view of the housing 1140 and the magnet 1130.

The bobbin 1110 may be disposed in the housing 1140, and may be moved in the optical-axis (OA) direction or a direction parallel to the optical axis as the result of electromagnetic interaction between the coil 1120 and the magnet 1130.

The bobbin 1110 may have an opening or a hollow portion, in which a lens or a lens barrel is mounted. The shape of the opening (or the hollow portion) of the bobbin 1110 may coincide with the shape of the lens or the lens barrel mounted therein, and may be circular, oval, or polygonal. However, the disclosure is not limited thereto. For example, the opening of the bobbin 1110 may be a throughhole formed through the bobbin 1110 in the optical-axis direction.

The lens or the lens module may be directly coupled to the inner surface of the bobbin 1110. However, the disclosure is not limited thereto. For example, the bobbin 1110 may include a lens barrel (not shown), in which at least one lens is installed, and the lens barrel may be coupled to the inner surface of the bobbin 1110 in various manners. For example, a screw thread for coupling with the lens or the lens module may be provided in the inner surface of the bobbin 1110.

The bobbin 1110 may be provided at the upper surface, the upper portion, or the upper end thereof with at least one first coupling portion 1113 configured to be coupled and fixed to an inner frame 1151 of the upper elastic member 1150.

The bobbin 1110 may be provided at the lower surface, the lower portion, or the lower end thereof with at least one second coupling portion 1117 configured to be coupled and fixed to an inner frame 1161 of the lower elastic member 1160.

For example, in FIGS. 22A and 22B, each of the first coupling portion 1113 and the second coupling portion 1117 of the bobbin 1110 is a protrusion. However, the disclosure is not limited thereto. In another embodiment, at least one of the first and second coupling portions of the bobbin 1110 may be a coupling recess or a flat surface.

A first escape recess 1112a may be provided in a region of the upper surface of the bobbin 1110 corresponding to or aligned with a first frame connection portion 1153 of the upper elastic member 1150.

In addition, a second escape recess 1112b may be provided in a region of the lower surface of the bobbin 1110 corresponding to or aligned with a second frame connection portion 1163 of the lower elastic member 1160.

When the bobbin 1110 is moved in the first direction, spatial interference between the first and second frame connection portions 1153 and 1163 and the bobbin 1110 may be avoided by the first escape recess 1112a and the second escape recess 1112b of the bobbin 1110, whereby the first and second frame connection portions 1153 and 1163 of the upper and lower elastic members 1150 and 1160 may be more easily elastically deformed.

In another embodiment, the first frame connection portion of the upper elastic member and the bobbin may be designed so as not to interfere with each other, and the first escape recess and/or the second escape recess may not be provided in the bobbin.

The bobbin 1110 may be provided in the outer surface thereof with at least one recess 1105, in which the coil 1120 is disposed.

The coil 1120 may be disposed or seated in the recess 1105 of the bobbin 1110.

For example, the coil 1120 may be directly wound or turned in the recess 1105 of the bobbin 1110 so as to be rotated in the clockwise direction or in the counterclockwise direction based on the optical axis (OA).

The shape and number of recesses 1105 of the bobbin 1110 may correspond to the shape and number of coils disposed on the outer surface of the bobbin 1110. In another embodiment, the bobbin 1110 may have no recess in which the coil is seated, and the coil 1120 may be directly wound or turned around the outer surface of the bobbin 1110 having no recess so as to be fixed thereto.

The bobbin 1110 may be provided in the lower end of the outer surface thereof with at least one recess 1106, and one end or a portion (e.g. a start-line region) or the other end or another portion (e.g. an end-line region) of the coil 1120 may be disposed in the at least one recess 1106 or may extend through the at least one recess 1106.

Next, the coil 1120 will be described.

The coil 1120 may be disposed on the bobbin 1110, may be coupled or connected to the bobbin 1110, or may be supported by the bobbin 1110.

For example, the coil 1120 may be disposed on the outer surface of the bobbin 1110 and may perform electromagnetic interaction with the magnet 1130 disposed on the housing 1140. That is, the coil 1120 may function as a coil for AF operation. Also, in order to generate electromagnetic force due to interaction with the magnet 1130, power may be provided to or a driving signal may be applied to the coil 1120.

In order to generate induced voltage (or induced current) due to mutual induction with the sensing coil 1170, the driving signal provided to the coil 1120 may include an alternating-current signal or may include an alternating-current signal and a direct-current signal.

For example, the alternating-current signal provided to the coil 1120 may be a sinusoidal signal or a pulse signal (for example, a pulse width modulation (PWM) signal). For example, the driving signal may have the form of current or voltage.

For example, the direct-current signal of the driving signal provided to the coil 1120 may move an AF operation unit in the optical-axis direction due to interaction with the magnet 1130, and the alternating-current signal of the driving signal may be provided to generate induced voltage (or induced current) due to interaction with the sensing coil 1170. However, the disclosure is not limited thereto.

The bobbin 1110 elastically supported by the upper and lower elastic members 1150 and 1160 may be moved in the optical-axis direction or the first direction by electromagnetic force due to electromagnetic interaction between the coil 1120 and the magnet 1130. The coil 1120 and the magnet 1130 may be a "lens moving unit" configured to move the lens.

The driving signal provided to the coil 1120 may be controlled, whereby movement of the bobbin 1110 in the first direction may be controlled, and therefore an autofocus function may be performed.

The coil 1120 may be disposed so as to wrap the outer surface of the bobbin 1110 so as to be rotated about the optical axis in the clockwise direction or the counterclockwise direction. For example, the coil 1120 may be disposed or wound in the recess 1105 provided in the outer surface of the bobbin 1110.

For example, the coil 1120 may have a closed-curved shape or a ring shape.

In another embodiment, the coil 1120 may be realized in the form of a coil ring wound about an axis perpendicular to the optical axis in the clockwise direction or the counterclockwise direction, and the number of coil rings may be equal to the number of magnets 1130. However, the disclosure is not limited thereto.

The coil 1120 may be connected to at least one of the upper and lower elastic members 1150 and 1160. A driving signal may be applied to the coil 1120 through at least one of the upper and lower elastic members 1150 and 1160. For example, a driving signal may be provided to the coil 1120 through two elastic members 1160-1 and 1160-2.

Referring to FIGS. 23A and 23B, the housing 1140 supports the magnet 1130, and receives the bobbin 1110 therein such that the bobbin 1110 can be moved in the first direction.

The housing 1140 may generally have a hollow pillar shape.

The housing 1140 may be provided with an opening (or a hollow portion) in which the bobbin 1110 is received, and the opening of the housing 1140 may be a through-hole formed through the housing 1130 in the optical-axis direction.

The housing 1140 may include side portions (or "first side portions") 1141-1 to 1141-4 and corner portions (or "second side portions") 1142-1 to 1142-4.

For example, the housing 1140 may include a plurality of side portions 1141-1 to 1141-4 and a plurality of corner portions 1142-1 to 1142-4 disposed so as to form a polygonal (e.g. quadrangular or octagonal) or circular opening. Here, the corner portions of the housing 1140 may also be referred to as "pillar portions."

For example, the side portions 1141-1 to 1141-4 of the housing 1140 may be disposed on positions corresponding to the side plates 1302 of the cover member 1300, and corresponding ones of the side portions of the housing 1140 and the side plates of the cover member 1300 may be parallel to each other.

For example, the side portions 1141-1 to 1141-4 of the housing 1140 may be portions corresponding to sides of the housing 1140, and the corner portions 1142-1 to 1142-4 of the housing 1140 may be portions corresponding to corners of the housing 1140.

The inner surface of each of the corner portions 1142-1 to 1142-4 of the housing 1140 may be a flat surface, a chamfered surface, or a curved surface.

The magnet 1130 may be disposed or installed at at least one of the side portions 1141-1 to 1141-4 of the housing 1140. For example, seating portions 1141a, in which magnets 1130-1 to 1130-4 are seated, disposed, or fixed, may be provided at the first to fourth side portions 1141-1 to 1141-4 of the housing 1140.

In FIG. 23A, the seating portions 1141a may be openings or through-holes formed through the side portions 1141-1 to 1141-4 of the housing 1140. However, the disclosure is not limited thereto. In another embodiment, the seating portions may be recesses or concave recesses.

The housing 1140 may include a supporting portion 1018 adjacent to the seating portion 1141a in order to support the edge of a first surface of the magnet 1130 opposite the coil 1120.

The supporting portion 1018 may be located adjacent to the inner surface of the housing 1140, and may protrude from the side surface of the seating portion 1141a in a horizontal direction. In addition, for example, the supporting portion 1018 may include a tapered portion or an inclined surface. In another embodiment, the housing 1140 may include no supporting portion 1018.

In addition, the housing 1140 may be provided in the lower portions of the outer surfaces of the corner portions 1142-1 to 1142-4 thereof with guide recesses 1148, into which bosses (e.g. 1216a to 1216d) of the base 1210 are inserted, fastened, or coupled.

The housing 1140 may be provided on the upper portion, the upper surface, or the upper end thereof with a stopper 1143 in order to prevent direct collision with the inner surface of the upper plate of the cover member 1300. Here, the stopper 1143 may also be referred to as a "boss" or a "protrusion."

For example, the stoppers 1143 may be provided at the corner portions of the housing 1140. However, the disclosure is not limited thereto. In another embodiment, the stoppers 1143 may be provided at at least one of the side portions and the corner portions of the housing 1140.

For example, the upper surface of the stopper 1143 of the housing 1140 may contact the inner surface of the upper plate 1301 of the cover member 1300. However, the disclosure is not limited thereto. In another embodiment, there may be no contact therebetween.

In addition, the housing 1140 may be provided on the upper surface, the upper end, or the upper portion thereof with at least one first coupling portion 1144 coupled to an outer frame 1152 of the upper elastic member 1150. In addition, the housing 1140 may be provided on the lower surface, the lower portion, or the lower end thereof with at least one second coupling portion 1147 coupled to an outer frame 1162 of the lower elastic member 1160.

In FIGS. 23A and 23B, each of the first and second coupling portions 1144 and 1147 of the housing 1140 is a protrusion. However, the disclosure is not limited thereto. In another embodiment, at least one of the first and second coupling portions 1144 and 1147 may be a recess or a flat surface.

For example, the guide recesses 1148 of the housing 1140 and the bosses (e.g. 1216a to 1216d) of the base 1210 may be coupled to each other using an adhesive (not shown), such as silicone or epoxy, whereby the housing 1140 may be coupled to the base 1210.

Next, the magnet 1130 will be described.

At an initial position of the AF operation unit (e.g. the bobbin 1110), the magnet 1130 may be disposed on the side portions 1141-1 to 1141-4 of the housing 1140 so as to correspond to or to be opposite the coil 1120 in a direction perpendicular to the optical axis OA. However, the disclosure is not limited thereto. In another embodiment, the magnet may be disposed on the corner portions 1142-1 to 1142-4 of the housing 1140.

Here, the initial position of the AF operation unit (e.g. the bobbin 1110) may be the original position of the AF operation unit in the state in which neither power nor a driving signal is applied to the coil 1120 or the position at which the AF operation unit is located as the result of the upper and lower elastic members 1150 and 1160 being elastically deformed due only to the weight of the AF operation unit.

In addition, the initial position of the AF operation unit (e.g. the bobbin 1110) may be the position at which the AF operation unit is located when gravity acts in the direction from the bobbin 1110 to the base 1210 or when gravity acts in the direction from the base 1210 to the bobbin 1110.

For example, the AF operation unit may include the bobbin 1110 and components coupled to the bobbin 1110. For example, the AF operation unit may include the bobbin 1110 and the coil 1120. In the case in which a lens or a lens barrel is mounted, the AF operation unit may include the lens or the lens barrel.

In the embodiment, bidirectional driving is possible such that the AF operation unit is movable forwards (or upwards) and rearwards (or downwards) from the initial position of the AF operation unit due to interaction between the coil 1120 and the magnet 1130. In another embodiment, unidirectional driving is possible such that the AF operation unit is movable forwards from the initial position.

At the initial position of the AF operation unit, the magnet 1130 may be disposed in the seating portion 1141a of the housing 1140 so as to overlap the coil 1120 in a direction perpendicular to the optical-axis direction.

In another embodiment, no seating portion 1141a may be formed in the side portions 1141-1 to 1141-4 of the housing 1140, and the magnet 1130 may be disposed on the outer surfaces or the inner surfaces of the side portions 1141-1 to 1141-4 of the housing 1140.

In the embodiment, the magnet 1130 includes first to fourth magnets 1130-1 to 1130-4 disposed on the first to fourth side portions 1141-1 to 1141-4 of the housing 1140. However, the disclosure is not limited thereto. The number of magnets 1130 may be two or more. In another embodiment, two magnets may be disposed on two opposite side portions of the housing 1140.

Each of the magnets 1130-1 to 1130-4 may have a shape corresponding to the outer surface of a corresponding one of the side portions 1141-1 to 1141-4 of the housing 1140, for example a polyhedral shape (e.g. a hexahedral shape or a rectangular parallelepiped shape). However, the disclosure is not limited thereto.

Each of the magnets 1130-1 to 1130-4 may be a monopolar magnetized magnet having two different polarities and a border surface naturally formed between the different polarities.

For example, each of the magnets 1130-1 to 1130-4 may be a monopolar magnetized magnet disposed such that a first surface thereof facing the coil 1120 has an N pole and a second surface opposite the first surface has an S pole. However, the disclosure is not limited thereto. The N pole and the S pole may be reversely disposed.

In another embodiment, in order to increase electromagnetic force, each of the magnets 1130-1 to 1130-4 may be a bipolar magnetized magnet divided into two parts in a direction perpendicular to the optical axis. Here, each of the magnets 1130-1 to 1130-4 may be realized by a ferrite, alnico, or rare-earth magnet. However, the disclosure is not limited thereto.

In the case in which each of the magnets 1130-1 to 1130-4 is a bipolar magnetized magnet, each of the magnets 1130-1 to 1130-4 may include a first magnet portion, a second magnet portion, and a partition disposed between the first magnet portion and the second magnet portion.

The first magnet portion may include an N pole, an S pole, and a first border surface between the N pole and the S pole. Here, the first border surface may be a portion having substantially no magnetism, may include a section having little polarity, and may be a portion that is naturally generated in order to form a magnet including a single N pole and a single S pole.

The second magnet portion may include an N pole, an S pole, and a second border surface between the N pole and the S pole. Here, the second border surface may be a portion having substantially no magnetism, may include a section having little polarity, and may be a portion that is naturally generated in order to form a magnet including a single N pole and a single S pole.

The partition may be a portion that separates or isolates the first magnet portion and the second magnet portion, may be a portion having substantially no magnetism, and may be a portion having little polarity. For example, the partition may be a nonmagnetic material or air. For example, the nonmagnetic partition may also be referred to as a "neutral zone."

The partition is a portion that is artificially formed when the first magnet portion and the second magnet portion are magnetized, and the width of the partition may be greater than the width of each of the first border surface and the second border surface. Here, the width of the partition may be the length of the partition in the direction from the first magnet portion to the second magnet portion.

The first surface of each of the magnets 1130-1 to 1130-4 may be a flat surface. However, the disclosure is not limited thereto. The first surface of each of the magnets 1130-1 to 1130-2 may include a curved surface, an inclined surface, or a tapered portion. For example, the first surface of each of the magnets 1130-1 to 1130-4 may be a surface opposite the outer surface of the bobbin 1110 and/or the coil 1120.

Next, the base 1210, the upper elastic member 1150, the lower elastic member 1160, the first terminal 1081, the second terminal 1082, and the sensing coil 1170 will be described.

Figure 24:
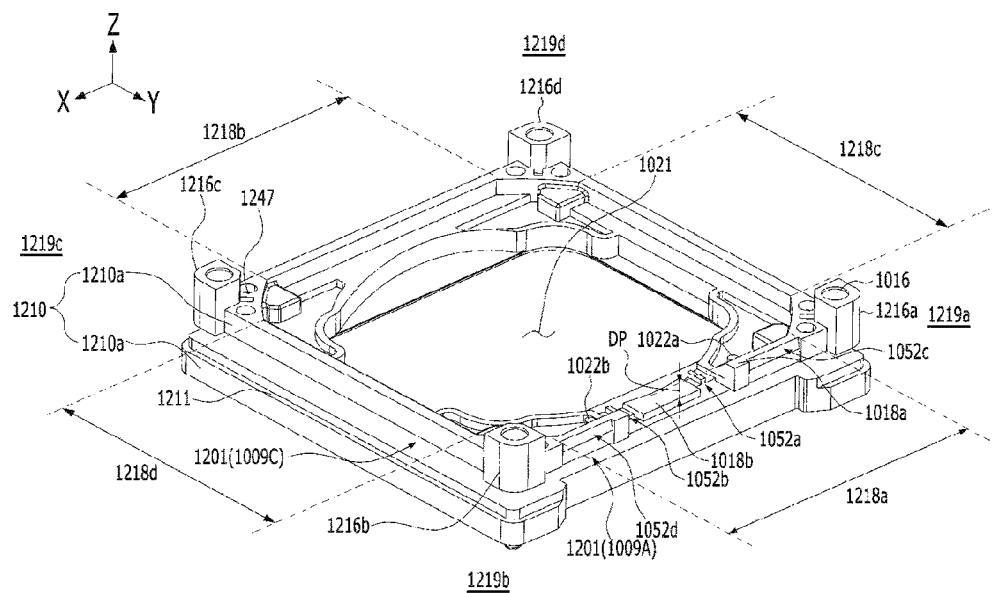
FIG. 24 is a perspective view of a base of FIG. 20.
Figure 25:
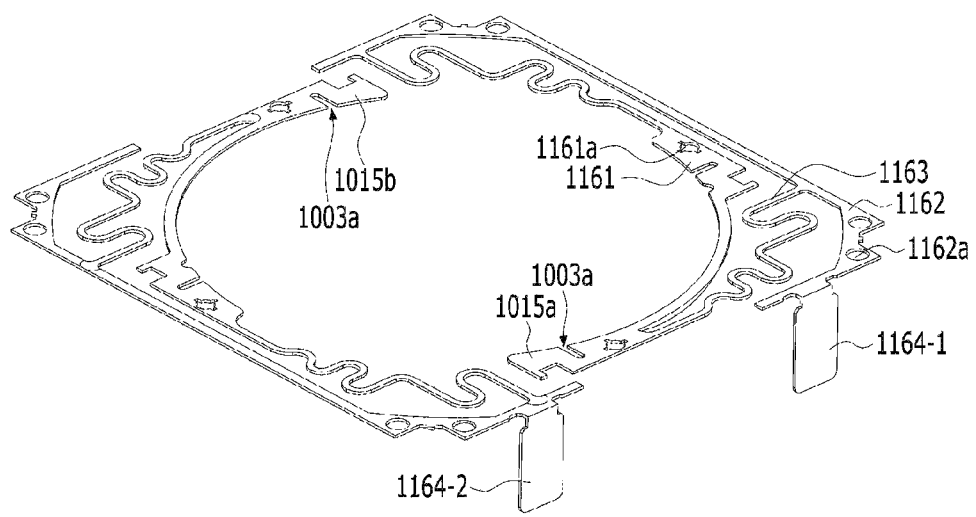
FIG. 25 is a perspective view of a lower elastic member of FIG. 20.
Figure 26:
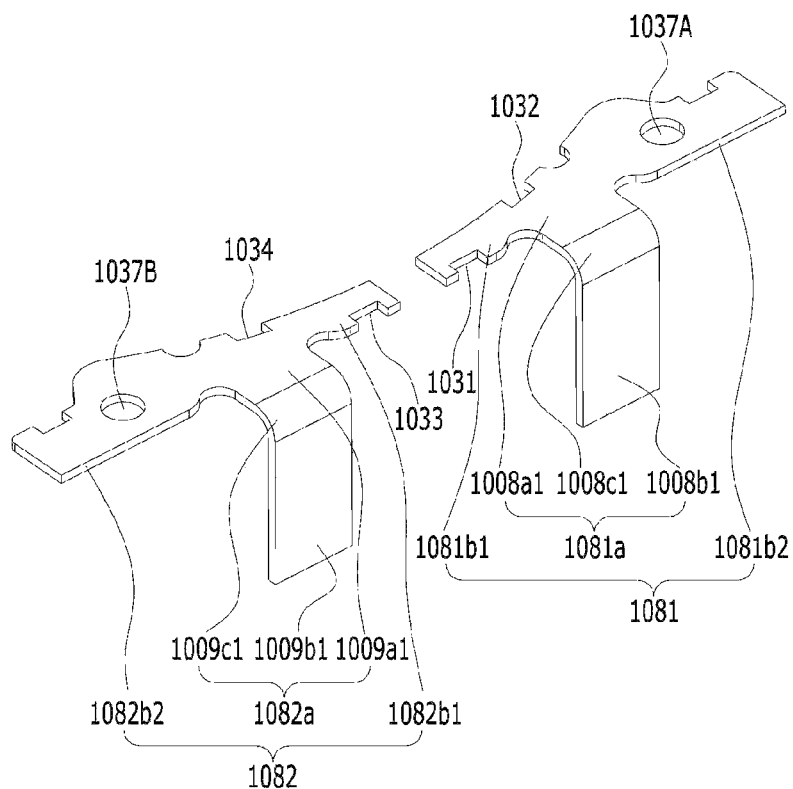
FIG. 26 is an enlarged perspective view of a first terminal and a second terminal of FIG. 20.
Figure 27:
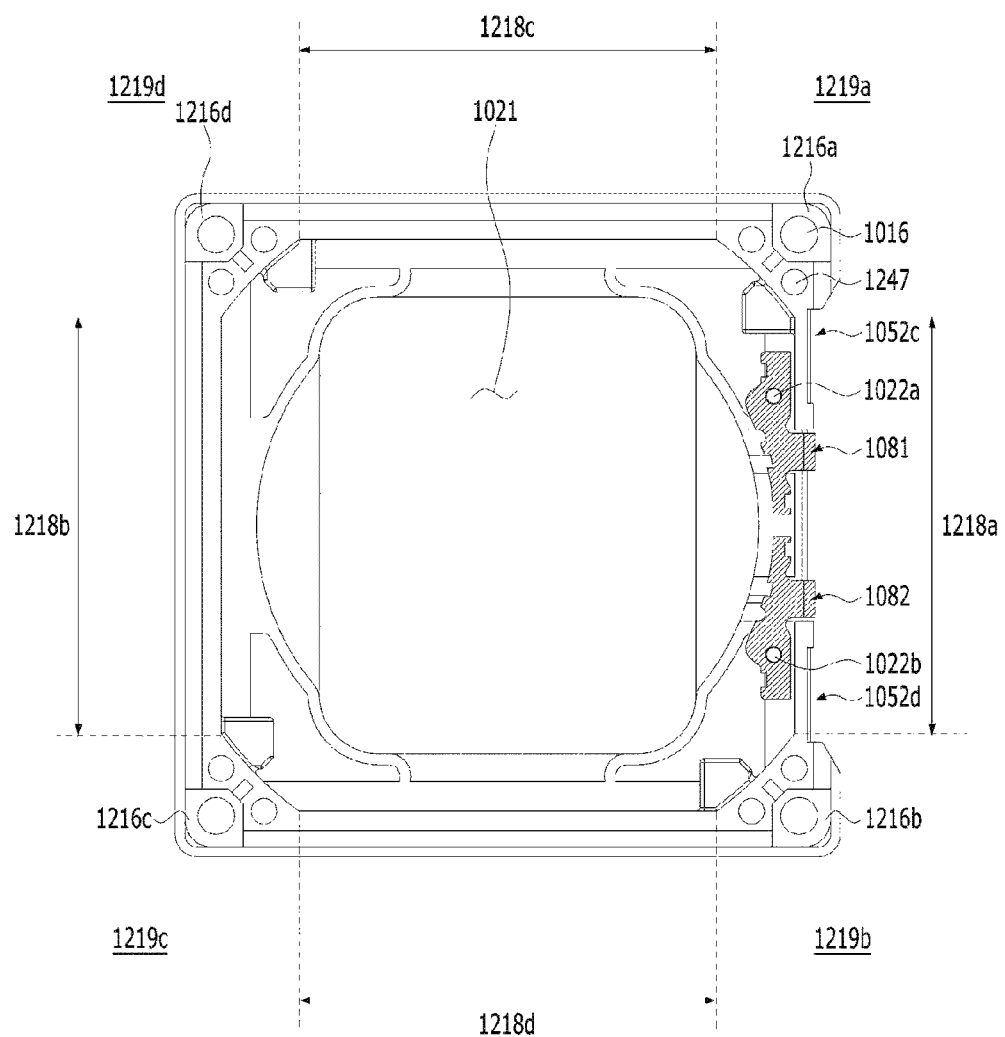
FIG. 27 is a plan view of the base and the first and second terminals of FIG. 20.
Figure 28:
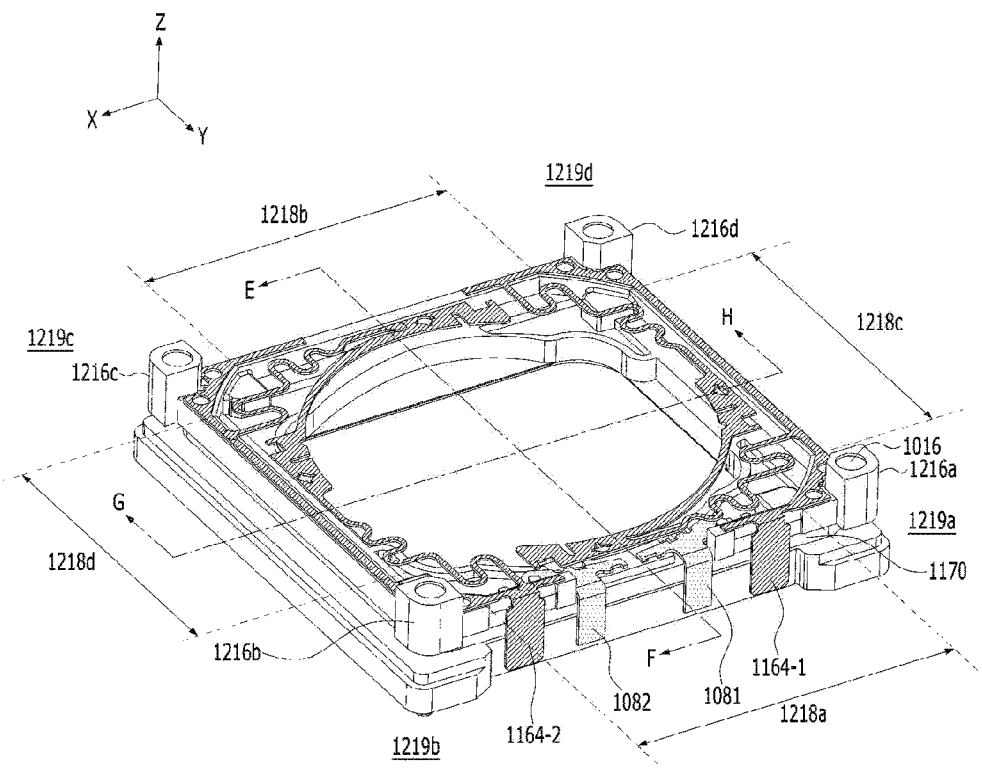
FIG. 28 is a perspective view of the base, the first terminal, the second terminal, the lower elastic member, and a sensing coil of FIG. 20.
Figure 29A:
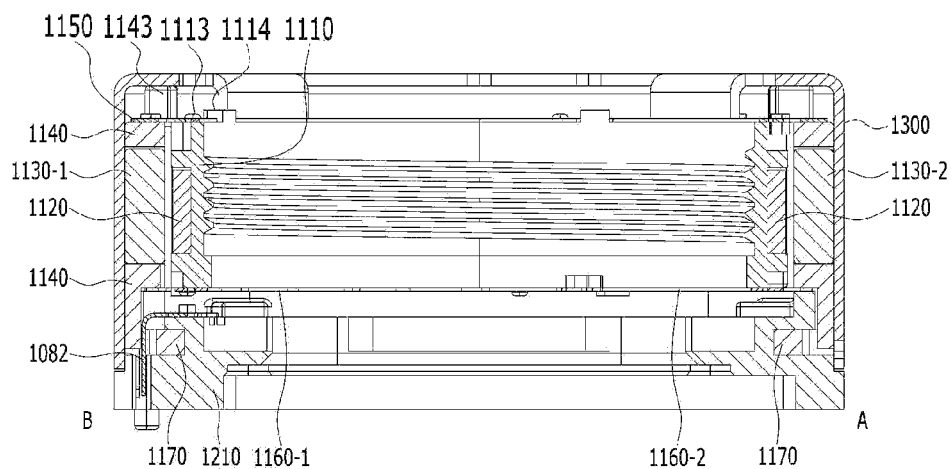
FIG. 29A is a sectional view of FIG. 21 in an AB direction.
Figure 29B:
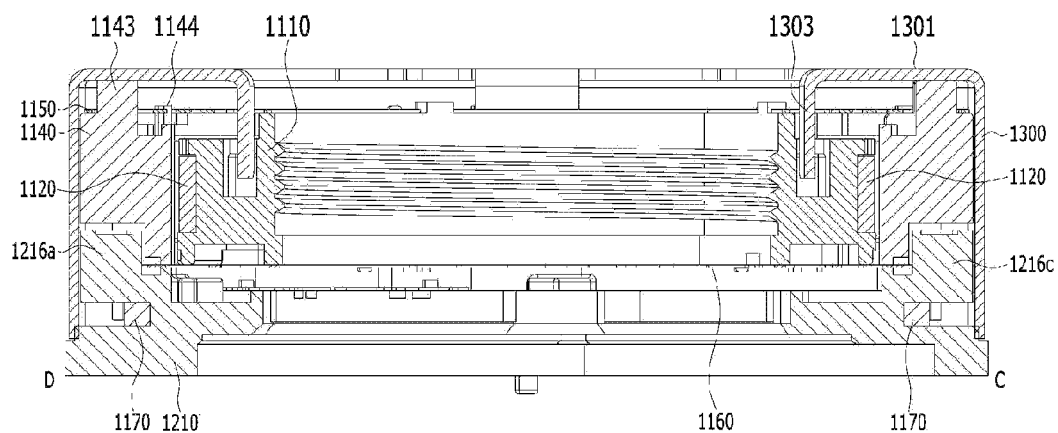
FIG. 29B is a sectional view of FIG. 21 in a CD direction.
Figure 30A:
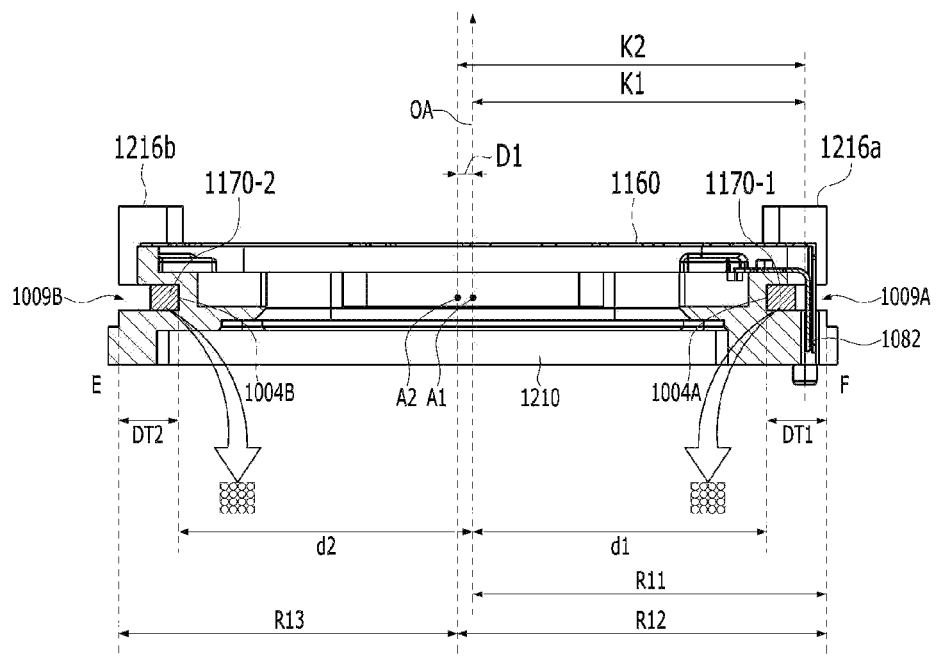
FIG. 30A is a sectional view of FIG. 28 in an EF direction.
Figure 30B:
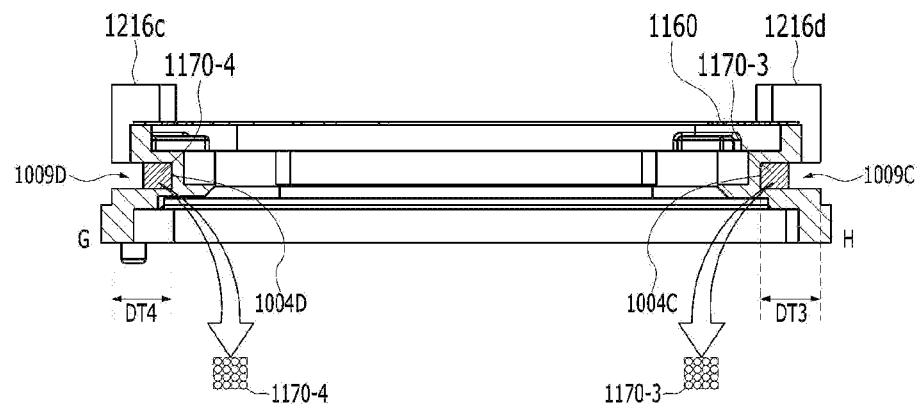
FIG. 30B is a sectional view of FIG. 28 in a GH direction.
Figure 31:
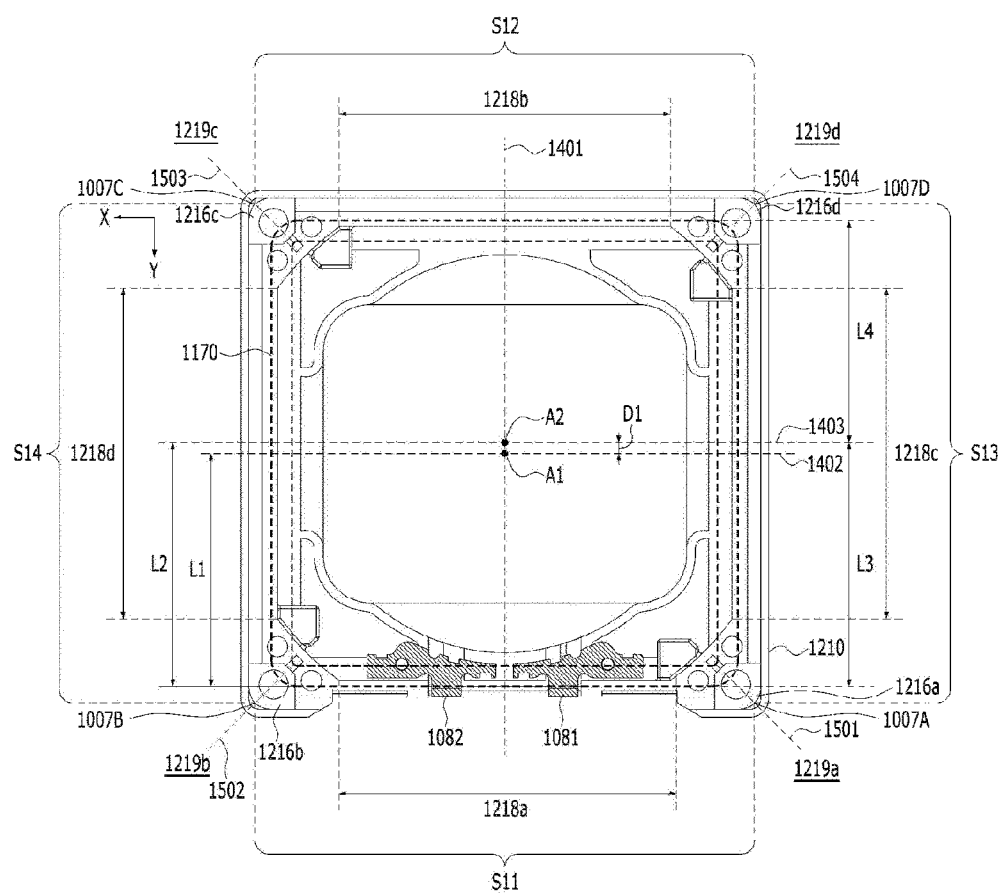
FIG. 31 is a plan view of the base, the first and second terminals, and the sensing coil of FIG. 20.

FIG. 24 is a perspective view of the base 1210, FIG. 25 is a perspective view of the lower elastic member 1160, FIG. 26 is an enlarged perspective view of the first terminal 1081 and the second terminal 1082, FIG. 27 is a plan view of the base 1210 and the first and second terminals 1081 and 1082, FIG. 28 is a perspective view of the base 1210, the first terminal 1081, the second terminal 1082, the lower elastic member 1160, and the sensing coil 1170, FIG. 29A is a sectional view of FIG. 21 in an AB direction, FIG. 29B is a sectional view of FIG. 21 in a CD direction, FIG. 30A is a sectional view of FIG. 28 in an EF direction, FIG. 30B is a sectional view of FIG. 28 in a GH direction, and FIG. 31 is a plan view of the base 1210, the first and second terminals 1081 and 1082, and the sensing coil 1170. The sensing coil 1170 is shown as being visible in FIG. 31.

Referring to FIGS. 24 to 31, the base 1210 may be coupled to the housing 1140, and may form a receiving space configured to receive the bobbin 1110 and the housing 1140 together with the cover member 1300.

The base 1210 may have an opening 21 corresponding to the opening of the bobbin 1110 and/or the opening of the housing 1140, and may be configured in a shape coinciding with or corresponding to the shape of the cover member 1300, such as a quadrangular shape.

The base 1210 may be provided at the lower end of the outer surface thereof with a stair 1211, which may be coated with an adhesive when fixing the cover member 1300 by adhesion. In this case, the stair 1211 may guide the cover member 1300 coupled to the upper side thereof, and may be opposite the lower end of the side plate 1302 of the cover member 1300. An adhesive member and/or a sealing member may be disposed or coated between the lower end of the side plate 1302 of the base 1210 and the stair 1211 of the base 1210.

The base 1210 may be disposed under the bobbin 1110 and the housing 1140.

For example, the base 1210 may be disposed under the lower elastic member 1160.

The base 1210 may include side portions 1218a to 1218d corresponding to or opposite the side portions 1141-1 to 1141-4 of the housing 1140 and corner portions 1219a to 1219d corresponding to or aligned with the corner portions 1142-1 to 1142-4 of the housing 1140 in the optical-axis (OA) direction.

For example, the side portion 1218a of the base 1210 may include a flat outer surface, and the corner portion 1219a of the base 1210 may include a curved outer surface.

The corner portion (e.g. 1219a) of the base 1210 may connect two adjacent side portions (e.g. 1218a and 1218c) of the base 1210 to each other, and may be located at a corner of the base.

At least one boss 1216a to 1216d protruding toward the housing 1140 may be formed on the upper surface of the base 1210. The at least one boss may be disposed on at least one of the corner portions of the base 1210.

For example, the base 1210 may include bosses 1216a to 1216d protruding from the four corners or corner portions 1219a to 1219d thereof by a predetermined height in the upward direction. Here, the bosses 1216a to 1216d of the base 1210 may also be referred to as "pillar portions" or "guide members."

For example, each of the bosses 1216a to 1216d of the base 1210 may have a multilateral pillar shape protruding from an upper surface 1211a of the base 1210 so as to be perpendicular to the upper surface 1211a of the base 1210. However, the disclosure is not limited thereto.

The bosses 1216a to 1216d of the base 1210 may be inserted, fastened, or coupled to the guide recesses 1148 of the housing 1140 using an adhesive member, such as epoxy or silicone. For example, a recess 1016, in which an adhesive member is coated, may be formed in the upper surface of each of the bosses 1216a to 1216d. In another embodiment, the recess 1016 may be omitted.

In addition, a recess 1247, in which the second coupling portion 1147 of the housing 1140 formed in the shape of a protrusion is seated, inserted, or coupled, may be provided in the upper surface of the base 1210. For example, the recess 1247 may correspond to or may be opposite the second coupling portion 1147 of the housing 1140 in the optical-axis direction, and may be formed in a corner region of the upper surface of the base 1210.

A seating recess 1201 or a recess, in which the sensing coil 1170 is disposed, may be formed in the outer surface of the base 1210.

The seating recess 1201 of the base 1210 may have a structure depressed from the outer surface of the base 1210. The seating recess 1201 of the base 1210 may be formed so as to be spaced apart from each of the upper surface and the lower surface of the base 1210. As a result, the sensing coil 1170 disposed or wound in the seating recess 1201 of the base 1210 may be inhibited from being separated from the base 1210.

For example, the depth of the seating recess 1201 of the base 1210 may be greater than the length of the sensing coil 1170 in a direction perpendicular to the optical axis. However, the disclosure is not limited thereto. In another embodiment, the depth and length may be equal to each other. As a result, the sensing coil 1170 may be inhibited from being separated from the base 1210.

For example, a first length of the sensing coil 1170 disposed in the seating recess 1201 of the base 1210 in the optical-axis direction may be less than a second length of the sensing coil in a direction from the inner circumferential surface to the outer circumferential surface of the base 1210 and perpendicular to the optical axis OA. As a result, it is possible to reduce the height or length of the lens moving apparatus 1100 in the optical-axis direction. In another embodiment, the first length of the sensing coil may be equal to or greater than the second length of the sensing coil.

The seating recess 1201 of the base 1210 may be depressed from the outer surface of the side portion 1218a and the outer surface of the corner portion 1219a, and may have a ring shape.

Referring to FIGS. 24, 30A, 30B, and 31, the seating recess 1201 of the base 1210 may include a first recess 1009A formed in a first outer surface S11 of the base 1210, a second recess 1009B formed in a second outer surface S12 of the base 1210, a third recess 1009C formed in a third outer surface S13 of the base 1210, and a fourth recess 1009D formed in a fourth outer surface S14 of the base 1210.

For example, the first recess 1009A may be formed in the outer surface of the first side portion 1218a of the base 1210, the second recess 1009B may be formed in the outer surface of the second side portion 1218b of the base 1210, the third recess 1009C may be formed in the outer surface of the third side portion 1218c of the base 1210, and the fourth recess 1009D may be formed in the outer surface of the fourth side portion 1218d of the base 1210.

For example, two or more of the first to fourth recesses 1009A to 1009D may be connected to each other. In addition, for example, the first to fourth recesses 1009A to 1009D may be spaced apart from each other. In addition, for example, the first to fourth recesses 1009A to 1009D may be connected to each other.

In addition, the seating recess 1201 may further include corner recesses formed in the outer surfaces of the corner portions 1219a to 1219d of the base 1210 in order to dispose the sensing coil 1170 at the corner parts of the base.

For example, the seating recess 1201 of the base 1210 may extend along the outer surfaces S11 to S14 of the base 1210 in a closed-curved shape or a ring shape.

In addition, the base 1210 may include a first portion 1210a or a lower end portion disposed under the seating recess 1201 and a second portion 1210b disposed above the seating recess 1201.

First and second depressed portions 1052a and 1052b, in which the first and second terminals 1081 and 1082 are disposed, may be formed in the outer surface of one 1218a of the side portions of the base 1210.

In addition, third and fourth depressed portions 1052c and 1052d, in which terminals 1164-1 and 1164-2 of the first and second elastic members 1160-1 and 1160-2 are disposed, may be formed in the outer surface of one 1218a of the side portions of the base 1210. For example, the first to fourth depressed portions 1052a to 1052d may be formed in the first portion 1210a and the second portion 1210b of the base 1210.

The first to fourth depressed portions 1052a to 1052d may be formed in the first outer surface S11 of the base 1210. For example, the first to fourth depressed portions 1052a to 1052d may be formed in the outer surface of the first side portion 1218a of the base 1210.

For example, at least one of the first to fourth depressed portions 1052a to 1052d may include an upper opening that is open to the upper surface of the base 1210 and a lower opening that is open to the lower surface of the base 1210.

Referring to FIGS. 21 and 25 to 31, the upper elastic member 1150 and the lower elastic member 1160 are coupled to the bobbin 1110 and to the housing 1140, and flexibly support the bobbin 1110.

For example, the upper elastic member 1150 may be coupled to the upper portion (or the upper surface or the upper end) of the bobbin 1110 and/or to the upper portion (or the upper surface or the upper end) of the housing 1140.

The lower elastic member 1160 may be coupled to the lower portion (or the lower surface or the lower end) of the bobbin 1110 and/or to the upper portion (or the lower surface or the lower end) of the housing 1140.

In FIG. 21, the upper elastic member 1150 is not divided into a plurality of parts. However, the disclosure is not limited thereto. In another embodiment, the upper elastic member 1150 may include a plurality of elastic members spaced apart from each other.

Referring to FIG. 21, the upper elastic member 1150 may include a first inner frame 1151 coupled to the upper portion of the bobbin 1110, a first outer frame 1152 coupled to the upper portion of the housing 1140, and a first frame connection portion 1153 configured to connect the first inner frame 1151 and the first outer frame 1152 to each other. In the following description, the inner frame may also be referred to as an "inner portion," the outer frame may also be referred to as an "outer portion," and the frame connection portion may also be referred to as a "connection portion."

A hole 1151*a*, to which the first coupling portion 1113 of the bobbin 1110 is coupled, may be provided in the first inner frame 1151 of the upper elastic member 1150, and a hole 1152*a*, to which the first coupling portion 1144 of the housing 1140 is coupled, may be provided in the first outer frame 1152.

Referring to FIG. 25, the lower elastic member 1160 may include a plurality of divided or separated elastic members, for example two or more elastic members, and may be coupled to the bobbin 1110. For example, the elastic members may also be referred to as "elastic units" or "springs."

For example, the lower elastic member 1160 may include first and second elastic members 1160-1 and 1160-2 spaced apart from each other, and the first and second elastic members 1160-1 and 1160-2 may be separated from each other.

The coil 1120 may be connected to the first and second elastic members 1160-1 and 1160-2. For example, one end (or the first end) of the coil 1120 may be coupled to the first elastic member 1160-1, and the other end (or the second end) of the coil 1120 may be coupled to the second elastic member 1160-2, by soldering or using a conductive adhesive.

Each of the first and second elastic members 1160-1 and 1160-2 may include a second inner frame 1161 coupled to the lower portion of the bobbin 1110, a second outer frame 1162 coupled to the lower portion of the housing 1140, and a second frame connection portion 1163 configured to connect the second inner frame 1161 and the second outer frame 1162 to each other.

A hole 1161*a*, to which the second coupling portion 1117 of the bobbin 1110 is coupled, may be provided in the second inner frame 1161 of the lower elastic member 1160, and a hole 1162*a*, to which the second coupling portion 1147 of the housing 1140 is coupled, may be provided in the second outer frame 1162.

For example, a first bonding portion (or a "first boding region") 1015*a*, to which one end of the coil 1120 is coupled, may be provided at one end of the second inner frame 1161 of the first elastic member 1160-1, and a second bonding portion (or a "second boding region") 1015*b*, to which the other end of the coil 1120 is coupled, may be provided at one end of the second inner frame 1161 of the second elastic member 1160-2.

For example, one end of the coil 1120 may be coupled to the first bonding portion 1015*a* of the inner frame 1161 of the first elastic member 1160-1, and the other end of the coil 1120 may be coupled to the second bonding portion 1015*b* of the inner frame 1161 of the second elastic member 1160-2, by soldering or using a conductive adhesive member.

The reason that the first and second bonding portions 1015*a* and 1015*b* are provided at the second inner frame 1161 is that, since the second inner frame 1161 is closer to the bobbin 1110 than the second outer frame 1162, bonding with the coil 1120 can be more easily performed.

For example, guide recesses 1003*a* configured to guide one end and the other end of the coil 1120 may be provided in the first and second bonding portions 1015*a* and 1015*b*.

For the first and second bonding portions 1015*a* and 1015*b*, the "bonding portions" may also be referred to as pad portions, connection terminal portions, solder portions, or electrode portions.

Each of the upper elastic member 1150 and the lower elastic member 1160 may be realized as a leaf spring; however, the disclosure is not limited thereto. Each elastic member may be realized as a coil spring or a suspension wire.

Each of the first and second frame connection portions 1153 and 1163 may be formed so as to be bent or curved at least once in order to form a predetermined pattern. Upward and/or downward movement of the bobbin 1110 in the first direction may be flexibly (or elastically) supported through displacement and microscopic deformation of the first and second frame connection portions 1153 and 1163.

For example, in order to prevent an oscillation phenomenon when the bobbin 1110 is moved, a damper may be disposed between the first frame connection portion 1153 of the upper elastic member 1150 and the upper surface of the bobbin 1110 (e.g. the first escape recess 1112*a*).

Alternatively, a damper (not shown) may also be disposed between the second frame connection portion 1163 of the lower elastic member 1160 and the lower surface of the bobbin 1110 (e.g. the second escape recess 1112*b*).

Alternatively, for example, a damper may be coated on a coupling portion between the upper elastic member 1150 and each of the bobbin 1110 and the housing 1140 or on a coupling portion between the lower elastic member 1160 and each of the bobbin 1110 and the housing 1140. For example, the damper may be gel-type silicone.

For example, the first and second elastic members 1160-1 and 1160-2 may be separated or spaced apart from each other at the first side portion 1141-1 and the second side portion 1141-2 of the housing 1140. However, the disclosure is not limited thereto.

The first elastic member 1160-1 may include a first terminal 1164-1 connected to the outer surface of the second outer frame 1162 of the first elastic member 1160-1, bent from the second outer frame 1162 of the first elastic member 1160-1 in a direction toward the base 1210, and extending toward the base.

In addition, the second elastic member 1160-2 may include a second terminal 1164-2 connected to the outer surface of the second outer frame 1162 of the second elastic member 1160-2, bent from the second outer frame 1162 of the second elastic member 1160-2 in a direction toward the base 1210, and extending toward the base.

For example, the first terminal 1164-1 of the first elastic member 1160-1 may extend or may be bent from the second outer frame 1162 of the first elastic member 1160-1 to the first outer surface S11 of the base 1210 or to the outer surface of the first side portion 1218*a* of the base 1210.

In addition, the second terminal 1164-2 of the second elastic member 1160-2 may extend from the second outer frame 1162 of the second elastic member 1160-2 to the first outer S11 surface of the base 1210 or to the outer surface of the first side portion 1218*a* of the base 1210.

For example, the first and second terminals 1164-1 and 1164-2 of the first and second elastic members 1160-1 and 1160-2 may be disposed on the first outer surface S11 of the base 1210 (or the outer surface of the first side portion 1218*a*) so as to be spaced apart from each other. The first and second terminals 1164-1 and 1164-2 of the first and second elastic members 1160-1 and 1160-2 may be spaced apart from the first outer surface S11 of the base 1210. However, the disclosure is not limited thereto. The first and second terminals may abut the first outer surface S11.

For example, the first terminal 1164-1 of the first elastic member 1160-1 may be disposed, seated, or inserted in the third depressed portion 1052*c* of the base 1210. In addition, the second terminal 1164-2 of the second elastic member 1160-2 may be disposed, seated, or inserted in the fourth depressed portion 1052*d* of the base 1210. Here, the terminal 1164-1 or 1164-2 may also be referred to as a "connection terminal," a "coupling terminal," an "extension portion," a "pad portion," a "bonding portion," a "solder portion," or an "electrode portion," and the depressed portion 1052*c* or 1052*d* may also be referred to as a "recess."

The first and second terminals 1164-1 and 1164-2 of the first and second elastic members 1160-1 and 1160-2 may be exposed from the base 1210, and the first and second terminals 1164-1 and 1164-2 may be separated from each other.

For example, the inner surface of the first terminal 1164-1 of the first elastic member 1160-1 disposed in the third depressed portion 1052*c* of the base 1210 may be opposite one surface (e.g. the bottom surface) of the third depressed portion 1052*c*, and the outer surface of the first terminal 1164-1 of the first elastic member 1160-1 may be exposed from the first outer surface of the base 1210. The outer surface of the first terminal 1164-1 of the first elastic member 1160-1 may be the surface opposite the inner surface of the first terminal 1164-1.

In addition, the inner surface of the second terminal 1164-2 of the second elastic member 1160-2 disposed in the fourth depressed portion 1052*d* of the base 1210 may be opposite one surface (e.g. the bottom surface) of the fourth depressed portion 1052*d*, and the outer surface of the second terminal 1164-2 of the second elastic member 1160-2 may be exposed from the first outer surface of the base 1210. The outer surface of the second terminal 1164-2 of the second elastic member 1160-2 may be the surface opposite the inner surface of the second terminal 1164-2.

For example, the lower end of each of the first and second terminals 1164-1 and 1164-2 of the lower elastic member 1160 may be exposed from the lower surface of the base 1210. However, the disclosure is not limited thereto. In another embodiment, the lower end of each of the first and second terminals 1164-1 and 1164-2 of the lower elastic member 1160 may not be exposed from the lower surface of the base 1210.

The depth of the third and fourth depressed portions 1052*c* and 1052*d* may be greater than the thickness of the terminals 1164-1 and 1164-2 of the lower elastic member 1160, and the outer surfaces of the terminals 1164-1 and 1164-2 of the lower elastic member 1160 disposed in the third and fourth depressed portions 1052*c* and 1052*d* may not protrude out of the depressed portions 1052*c* and 1052*d*. However, the disclosure is not limited thereto. In another embodiment, the outer surfaces of the terminals 1164-1 and 1164-2 of the lower elastic member 1160 may protrude out of the depressed portions 1052*c* and 1052*d*.

Referring to FIGS. 24 and 28, the first elastic member 1160-1 and the second elastic member 1160-2 may be disposed so as to be opposite each other in the first-axis direction (e.g. the X-axis direction).

For example, the first elastic member 1160-1 may be disposed on one side of the first side portion 1218*a* of the base 1210, the first corner portion of the base 1210, the third side portion 1218*c* of the base 1210, the fourth corner portion 1219*d* of the base 1210, and one side of the second side portion 1218*b* of the base 1210.

For example, the second side portion 1218*b* of the base 1210 may be opposite the first side portion 1218*a* of the base 1210 in the second-axis direction (e.g. the Y-axis direction), the third side portion 1218*c* of the base 1210 may be disposed between the first side portion 1218*a* and the second side portion 1218*b* of the base 1210, the first corner portion 1219*a* of the base 1210 may connect the first side portion 1218*a* and the third side portion 1218*c* of the base 1210 to each other, and the third corner portion 1219*c* of the base 1210 may connect the second side portion 1218*b* of the base 1210 and the fourth side portion 1218*d* of the base 1210 to each other. The second-axis direction may be perpendicular to the first-axis direction.

For example, the second elastic member 1160-2 may be disposed on the other side of the first side portion 1218*a* of the base 1210, the second corner portion 1219*b* of the base 1210, the fourth side portion 1218*d* of the base 1210, the third corner portion 1219*c* of the base 1210, and the other side of the second side portion 1218*b* of the base 1210.

For example, the fourth side portion 1218*d* of the base 1210 may be opposite the third side portion 1218*c* of the base 1210 in the first-axis (X-axis) direction, the second corner portion 1219*b* of the base 1210 may connect the first side portion 1218*a* of the base 1210 and the fourth side portion 1218*d* of the base 1210 to each other, and the fourth corner portion 1219*d* of the base 1210 may connect the second side portion 1218*b* of the base 1210 and the third side portion 1218*c* of the base 1210 to each other.

For example, the first and second terminals 1164-1 and 1164-2 of the lower elastic member 1160 and the first and second terminals 1081 and 1082 may be disposed on the first side portion 1218*a* of the base 1210.

For example, the first and second terminals 1081 and 1082 may include portions 1008*b*1 and 1009*b*1 disposed on the first outer surface S11 of the base 1210 or the outer surface of the first side portion 1218*a* of the base 1210.

The first terminal 1081 may be disposed so as to extend to the first corner portion 1219*a* of the base 1210, and the second terminal 1082 may be disposed so as to extend to the second corner portion 1219*b* of the base 1210.

The first and second terminals 1164-1 and 1164-2 of the lower elastic member 1160 may be connected to external wires or external elements using a conductive adhesive member (e.g. solder) such that power or a driving signal is received from the outside.

In the case in which the solder bonded to the first and second terminals 1164-1 and 1164-2 of the lower elastic member 1160 protrudes out of the outer surface of the base 1210, contact or collision between the solder bonded to the first and second terminals 1164-1 and 1164-2 of the lower elastic member 1160 and the cover member 1300 may be prevented, whereby electrical short circuit or open circuit may occur. In the embodiment, the depth of the depressed portions 1052c and 1052d is sufficiently secured such that the solder bonded to the first and second terminals 1164-1 and 1164-2 of the lower elastic member 1160 does not protrude out of the outer surface of the base 1210, whereby it is possible to prevent the occurrence of electrical short circuit or open circuit.

In addition, the first and second terminals 1164-1 and 1164-2 of the lower elastic member 1160 may be disposed on the second outer frames 1162 of the first and second elastic members 1160-1 and 1160-2 disposed under the first side portion 1141-1 of the housing 1140 and/or the corner portions 1142-1 and 1142-2 of the housing 1140 adjacent to the first side portion 1141-1.

The first and second terminals 1164-1 and 1164-2 of the first and second elastic members 1160-1 and 1160-2 may be connected to the coil 1120, and power or a driving signal for driving the coil 1120 may be provided to the first and second terminals 1164-1 and 1164-2 of the first and second elastic members 1160-1 and 1160-2.

In FIG. 25, the first terminal 1164-1 is formed integrally with the first elastic member 1160-1, and the second terminal 1164-2 is formed integrally with the second elastic member 1160-2. However, the disclosure is not limited thereto. In another embodiment, a separate first terminal may be formed independently of the first elastic member and disposed on the first outer surface S11 of the base 1210, a separate second terminal may be formed independently of the second elastic member and disposed on the first outer surface S11 of the base 1210, the first elastic member (e.g. the second outer frame) and the separate first terminal may be connected to each other using a conductive adhesive (e.g. solder), and the second elastic member (e.g. the second outer frame) and the separate second terminal may be connected to each other using a conductive adhesive (e.g. solder).

Next, the first terminal 1081 and the second terminal 1082 will be described.

Referring to FIGS. 26 to 28, the first terminal 1081 may be disposed on the base 1210, may be coupled or connected to the base 1210, or may be supported by the base 1210. For example, the first terminal 1081 may be disposed on the first side portion 1218a of the base 1210. Alternatively, for example, the first terminal 1081 may be disposed on the first side portion 1218a and the first corner portion 1219a of the base 1210.

Referring to FIG. 26, the first terminal 1081 may include a first body 1081a and at least one extension portion 1081b1 and 1081b2 extending from the first body 1081a.

For example, the first terminal 1081 may include a first body 1081a disposed on the first side portion 1218a of the base 1210 and a first extension portion 1081b1 and a second extension portion 1081b2 extending from the first body 1081a.

A portion of the first body 1081a may be exposed from the upper surface of the base 1210, and another portion of the first body 1081a may be bent from a portion of the first body 1081a. In addition, at least a region of another portion of the first body 1081a may be exposed from the outer surface of the first side portion 1218a or the first outer surface of the base 1210.

The first body 1081a may include a first portion 1008a1 and a second portion 1008b1.

For example, the first portion 1008a1 of the first terminal 1081 may be exposed from the upper surface of the base 1210. In another embodiment, at least a portion of the first portion 1008a1 of the first terminal 1081 may not be exposed from the upper surface of the base 1210, and may be disposed in the base 1210.

The second portion 1008b1 of the first terminal 1081 may be connected to one end of the first portion 1008a1, and may be bent from one end of the first portion 1008a1 in a direction toward the lower surface of the base 1210 or toward the first outer surface S11 of the base 1210.

For example, the second portion 1008b1 of the first terminal 1081 may be bent toward the first outer surface S11 of the base 1210 or the outer surface of the first side portion 1218a of the base 1210.

For example, the first body 1081a of the first terminal 1081 may include a first bent portion 1008c1 configured to connect the first portion 1008a1 and the second portion 1008b1 to each other. The first bent portion 1008c1 may be round. However, the disclosure is not limited thereto. In another embodiment, the first bent portion may be angled.

For example, the first bent portion 1008c1 may be exposed from the base 1210. However, the disclosure is not limited thereto. In another embodiment, the first bent portion may be disposed in the base 1210 and may not be exposed from the base 1210.

For example, the interior angle between the first portion 1008a1 and the second portion 1008b1 may be a right angle. However, the disclosure is not limited thereto. In another embodiment, the interior angle may be an acute angle or an obtuse angle.

For example, the second portion 1008b1 of the first terminal 1081 may be bent and extend from a region of the first portion 1008a1 in the downward direction.

The first extension portion 1081b1 may extend from one side of the first body 1081a in a direction toward the second corner portion 1219b of the base 1210, and the second extension portion 1081b2 may extend from the other side of the first body 1081a in a direction toward the first corner portion 1219a of the base 1210. The first extension portion 1081b1 and the second extension portion 1081b2 may extend in opposite directions.

For example, the first extension portion 1081b1 may extend from one side of the first portion 1008a1 of the first body 1081a in the direction toward the second corner portion 1219b of the base 1210, and the second extension portion 1081b2 may extend from the other side of the first portion 1008a1 in the direction toward the first corner portion 1219a of the base 1210.

The first and second extension portions 1081b1 and 1081b2 may be exposed from the base 1210. In another embodiment, at least a portion of each of the first and second extension portions 1081b1 and 1081b2 may be disposed in the base 1210.

For example, the first and second extension portions 1081b1 and 1081b2 may be disposed on the first side portion 1218a of the base 1210. However, the disclosure is not limited thereto. In another embodiment, the first and second extension portions 1081b1 and 1081b2 may be disposed on the first side portion 1218a and the first corner portion 1219a of the base 1210.

For example, one end of the sensing coil 1170 may be coupled to the first extension portion 1081b1 exposed from the base 1210 by soldering or using a conductive adhesive member.

A first recess 1031 may be formed in the first extension portion 1081b1. The first recess 1031 may be formed in a first side surface of the first extension portion 1081b1, and the first side surface of the first extension portion 1081*b*1 may be the side surface that faces the first outer surface of the base 1210.

In addition, a second recess 1032 may be formed in a second side surface of at least one of the first portion 1008*a*1 and the extension portions 1081*b*1 and 1081*b*2 of the first terminal 1081. The second side surface of the first terminal 1081 may be the surface opposite the first side surface of the first terminal 1081. The first side surface of the first terminal 1081 may be the side surface that faces the first outer surface of the base 1210.

The second extension portion 1081*b*2 may be provided with a first through-hole 1037A formed through the second extension portion 1081*b*2. The first through-hole 1037A of the second extension portion 1081*b*2 may be coupled to a first protrusion 1022*a* formed on the first side portion 1218*a* of the base 1210. The first protrusion 1022*a* may be formed at the upper surface of the first side portion 1218*a* of the base 1210.

The second terminal 1082 may include a second body 1082*a* and at least one extension portion 1082*b*1 and 1082*b*2 extending from the second body 1082*a*.

For example, the second terminal 1082 may include a second body 1082*a* disposed on the first side portion 1218*a* of the base 1210 and a third extension portion 1082*b*1 and a fourth extension portion 1082*b*2 extending from the second body 1082*a*.

A portion of the second body 1082*a* may be exposed from the upper surface of the base 1210, and another portion of the second body 1082*a* may be bent from a portion of the second body 1082*a*. In addition, at least a region of another portion of the second body 1082*a* may be exposed from the outer surface of the first side portion 1218*a* or the first outer surface S11 of the base 1210.

The second body 1082*a* may include a first portion 1009*a*1 and a second portion 1009*b*1.

For example, the first portion 1009*a*1 of the second terminal 1082 may be exposed from the upper surface of the base 1210. In another embodiment, at least a portion of the first portion 1009*a*1 of the second terminal 1082 may not be exposed from the upper surface of the base 1210, and may be disposed in the base 1210.

The second portion 1009*b*1 of the second terminal 1082 may be connected to one end of the first portion 1009*a*1, and may be bent from one end of the first portion 1009*a*1 in a direction toward the lower surface of the base 1210 or toward the first outer surface S11 of the base 1210.

For example, the second portion 1009*b*1 of the second terminal 1082 may be bent toward the first outer surface S11 of the base 1210 or the outer surface of the first side portion 1218*a* of the base 1210.

For example, the second body 1082*a* of the second terminal 1082 may include a second bent portion 1009*c*1 configured to connect the first portion 1009*a*1 and the second portion 1009*b*1 to each other. The second bent portion 1009*c*1 may be round. However, the disclosure is not limited thereto. In another embodiment, the second bent portion may be angled.

For example, the second bent portion 1009*c*1 may be exposed from the base 1210. However, the disclosure is not limited thereto. In another embodiment, the second bent portion may be disposed in the base 1210 and may not be exposed from the base 1210.

For example, the interior angle between the first portion 1009*a*1 and the second portion 1009*b*1 of the second terminal 1082 may be a right angle. However, the disclosure is not limited thereto. In another embodiment, the interior angle may be an acute angle or an obtuse angle.

For example, the second portion 1009*b*1 of the second terminal 1082 may be bent and extend from a region of the first portion 1009*a*1 in the downward direction.

The third extension portion 1082*b*1 may extend from one side of the second body 1082*a* in a direction toward the first corner portion 1219*ba* of the base 1210, and the fourth extension portion 1082*b*2 may extend from the other side of the second body 1082*a* in a direction toward the second corner portion 1219*b* of the base 1210. The third extension portion 1082*b*1 and the fourth extension portion 1082*b*2 may extend in opposite directions.

For example, the third extension portion 1082*b*1 may extend from one side of the first portion 1009*a*1 of the second body 1082*a* in the direction toward the first corner portion 1219*a* of the base 1210, and the fourth extension portion 1082*b*2 may extend from the other side of the first portion 1009*a*1 in the direction toward the second corner portion 1219*b* of the base 1210.

The third and fourth extension portions 1082*b*1 and 1082*b*2 may be exposed from the base 1210. In another embodiment, at least a portion of each of the third and fourth extension portions 1082*b*1 and 1082*b*2 may be disposed in the base 1210.

For example, the third and fourth extension portions 1082*b*1 and 1082*b*2 may be disposed on the first side portion 1218*a* of the base 1210. However, the disclosure is not limited thereto. In another embodiment, the third and fourth extension portions 1082*b*1 and 1082*b*2 may be disposed on the first side portion 1218*a* and the second corner portion 1219*b* of the base 1210.

For example, the other end of the sensing coil 1170 may be coupled to the third extension portion 1082*b*1 exposed from the base 1210 by soldering or using a conductive adhesive member.

A third recess 1033 may be formed in the third extension portion 1082*b*1. The third recess 1033 may be formed in a first side surface of the third extension portion 1082*b*1, and the first side surface of the third extension portion 1082*b*1 may be the side surface that faces the first outer surface of the base 1210.

In addition, a fourth recess 1034 may be formed in a second side surface of at least one of the first portion 1009*a*1 and the extension portions 1082*b*1 and 1082*b*2 of the second terminal 1082. The second side surface of the second terminal 1082 may be the surface opposite the first side surface of the second terminal 1082. The first side surface of the second terminal 1082 may be the side surface that faces the first outer surface of the base 1210.

The fourth extension portion 1082*b*2 of the second terminal 1082 may be provided with a second through-hole 1037B formed through the fourth extension portion 1082*b*2. The second through-hole 1037B of the fourth extension portion 1082*b*2 may be coupled to a second protrusion 1022*b* formed on the first side portion 1218*a* of the base 1210. The second protrusion 1022*b* may be formed at the upper surface of the first side portion 1218*a* of the base 1210.

In another embodiment, each of the first and second terminals 1081 and 1082 may be provided with a recess-shaped coupling portion for coupling with the base 1210 instead of a corresponding one of the first and second through-holes 1037A and 1037B. In a further embodiment, a protrusion-shaped coupling portion may be provided. In this case, the base 1210 may be provided with a recess or a hole having a shape corresponding thereto.

For example, the first terminal 1081 and the second terminal 1082 may have shapes symmetric with respect to a first central axis 1401. However, the disclosure is not limited thereto. In addition, the first terminal 1081 and the second terminal 1082 may be disposed so as to be symmetric with respect to the first central axis 1401. However, the disclosure is not limited thereto.

The first and second terminals 1164-1 and 1164-2 of the lower elastic member 1160 may be disposed on opposite sides of the first side portion 1218*a* of the base 1210. The first and second terminals 1081 and 1082 may be disposed on the first side portion 1218*a* of the base 1210, and may be disposed between the first and second terminals 1164-1 and 1164-2 of the lower elastic member 1160.

In addition, the first portion 1008*a*1 and the first and second extension portions 1081*b*1 and 1081*b*2 of the first terminal 1081 and the first portion 1009*a*1 and the third and fourth extension portions 1082*b*1 and 1082*b*2 of the second terminal 1082 may be located at the upper side of the sensing coil 1170.

Referring to FIG. 24, the outer frames 1162 of the first and second elastic members 1160-1 and 1160-2 may be disposed on a first surface 1018*a* of the upper surface of the base 1210, and the first portions 1008*a*1 and 1009*a*1 and the extension portions 1081*b*1, 1081*b*2, 1082*b*1, and 1082*b*2 of the first and second terminals 1081 and 1082 may be disposed on a second surface 1018*b* of the upper surface of the base 1210.

The first surface 1018*a* and the second surface 1018*b* of the upper surface of the base 1210 may have a stair DP in the optical-axis direction. For example, the first surface 1018*a* of the upper surface of the base 1210 may be located higher than the second surface 1018*b*. For example, the height of the first surface 1018*a* of the upper surface of the base 1210 may be greater than the height of the second surface 1018*b* based on the lower surface of the base 1210.

For example, the upper surfaces of the first portions 1008*a*1 and 1009*a*1 of the first and second terminals 1081 and 1082 may be located lower than the upper surfaces of the outer frames 1162 of the first and second elastic members 1160-1 and 1160-2. In addition, the upper surfaces of the extension portions 1081*b*1, 1081*b*2, 1082*b*1, and 1082*b*2 may be located lower than the upper surfaces of the outer frames 1162 of the first and second elastic members 1160-1 and 1160-2. As a result, it is possible to avoid spatial interference therebetween and to prevent electrical short circuit therebetween due to soldering.

In addition, the first portion 1008*a*1, the first extension portion 1081*b*1, and the second extension portion 1081*b*2 of the first terminal 1081 and the first portion 1009*a*1, the third extension portion 1082*b*1, and the fourth extension portion 1082*b*2 of the second terminal 1082 may not overlap the sensing coil 1170 (or a ring-shaped portion of the sensing coil 1170) in a direction perpendicular to the optical axis.

At least one of the first portion 1008*a*1, the first extension portion 1081*b*1, and the second extension portion 1081*b*2 of the first terminal 1081 and the first portion 1009*a*1, the third extension portion 1082*b*1, and the fourth extension portion 1082*b*2 of the second terminal 1082 may overlap the sensing coil 1170 (or the ring-shaped portion of the sensing coil 1170) in the optical-axis direction.

In addition, at least a portion of each of the first portion 1008*a*1, the first extension portion 1081*b*1, and the second extension portion 1081*b*2 of the first terminal 1081 and the first portion 1009*a*1, the third extension portion 1082*b*1, and the fourth extension portion 1082*b*2 of the second terminal 1082 may overlap the sensing coil 1170 (or the ring-shaped portion of the sensing coil 1170) in the optical-axis direction. However, the disclosure is not limited thereto. In another embodiment, they may not overlap the sensing coil 1170 in the optical-axis direction.

In addition, the first and second terminals 1164-1 and 1164-2 of the lower elastic member 1160 and the second portions 1008*b*1 and 1009*b*1 of the first and second terminals 1081 and 1082 may not overlap the sensing coil 1170 (or the ring-shaped portion of the sensing coil 1170) in the optical-axis direction.

For example, the second portions 1008*b*1 and 1009*b*1 of the first and second terminals 1081 and 1082 and the first and second terminals 1164-1 and 1164-2 of the lower elastic member 1160 may be located outside the sensing coil 1170. Here, the outside of the sensing coil 1170 may be the side opposite the side at which the center of the base 1210 is located based on the second coil 1170.

For example, the base 1210 may be made of an injection molded material, and the first and second terminals 1081 and 1082 may be coupled to the base 1210 using an adhesive member. However, the disclosure is not limited thereto. In another embodiment, at least a portion of each of the first and second terminals 1081 and 1082 may be located in the base 1210 by insert injection molding.

Each of the first and second terminals 1081 and 1082 may be made of a conductor, such as a metal. For example, each of the first and second terminals 1081 and 1082 may be made of copper, gold, silver, nickel, or an alloy including at least one thereof. However, the disclosure is not limited thereto.

In addition, for the first and second terminals 1081 and 1082, the terminals may also be referred to as "pads," "pad portions," "connection terminal portions," "solder portions," or "electrode portions."

The first terminal 1164-1 of the first elastic member 1160-1, the second terminal 1164-2 of the second elastic member 1160-2, and the second portions 1008*b*1 and 1009*b*1 of the first and second terminals 1081 and 1082 may be disposed on one side portion (e.g. 1218*a*) of the base 1210. Consequently, at the time of soldering for connection between the first and second terminals 1164-1 and 1164-2 of the lower elastic member 1160, the first and second terminals 1081 and 1082, and an external device (e.g. a circuit board), soldering work may be easily and simply performed.

The first terminal 1164-1 and the second terminal 1164-2 of the lower elastic member 1160 may be disposed on opposite sides of the first outer surface S11 of the base 1210, and the first and second terminals 1081 and 1082 may be disposed between the first and second terminals 1164-1 and 1164-2 of the lower elastic member 1160 so as to be spaced apart from each other.

For example, the second portions 1008*b*1 and 1009*b*1 of the first and second terminals 1081 and 1082 may be disposed or arranged in a space between the first terminal 1164-1 and the second terminal 1164-2 of the lower elastic member 1160.

For example, when the first outer surface S11 of the base 1210 is viewed from the front, the first terminal 1164-1 of the first elastic member 1160-1, the first terminal 1081, the second terminal 1082, and the second terminal 1164-2 of the second elastic member 1160-2 may be sequentially disposed in a direction from the first corner portion 1219*a* to the second corner portion 1219*b* of the base 1210. However, the disclosure is not limited thereto. In another embodiment, arrangement may be performed in order different from the above order.

For example, when the first outer surface S11 of the base 1210 is viewed from the front, the first terminal 1164-1 of the first elastic member 1160-1, the second portion 1008b1 of the first terminal 1081, the second portion 1009b1 of the second terminal 1082, and the second terminal 1164-2 of the second elastic member 1160-2 may be sequentially disposed in the direction from the first corner portion 1219a to the second corner portion 1219b of the base 1210. However, the disclosure is not limited thereto. In another embodiment, arrangement may be performed in different order.

A description of FIG. 18 is applicable or adaptable to the embodiment 1100 of FIG. 20. That is, the second portion 1008b1 of the first terminal 1081, the second portion 1009b1 of the second terminal 1082, the first terminal 1164-1 of the first elastic member 1160-1, and the second terminal 1164-2 of the second elastic member 1160-2 may be located inside a reference line. Here, the reference line may be the reference line 207 of FIG. 18.

Next, the cover member 1300 will be described.

The cover member 1300 receives the bobbin 1110, the coil 1120, the magnet 1130, the housing 1140, the upper elastic member 1150, the lower elastic member 1160, the sensing coil 1170, and the first and second terminals 1081 and 1082 in a receiving space formed together with the base 1210.

The cover member 1300 may be formed in the shape of a box, the lower portion of which is open and which includes an upper plate 1301 and side plates 1302. The lower ends of the side plates 1302 of the cover member 1300 may be coupled to stairs 1211 of the base 1210. When viewed from above, the shape of the upper plate 1301 of the cover member 1300 may be polygonal, for example, quadrangular or octagonal.

The cover member 1300 may be provided in the upper plate 1301 thereof with an opening (or a hollow portion), through which a lens (not shown) coupled to the bobbin 1110 is exposed to external light.

The cover member 1300 may be made of a nonmagnetic material, such as SUS, in order to prevent a phenomenon in which the magnet 1130 attracts the cover member. Alternatively, the cover member may be made of a magnetic material so as to perform the function of a yoke.

The cover member 1300 may be provided with at least one boss 1303 extending from a region adjacent to the opening formed in the upper plate 1301 in a direction toward the upper surface of the bobbin 1110.

The at least one boss 1303 of the cover member 1300 may be disposed or inserted in a recess 1119 provided in the upper surface of the bobbin 1110. At the time of AF driving, the boss 1303 of the cover member 1300 may abut the bottom surface of the recess 1119 of the bobbin 1110. As a result, the boss 1303 may serve as a stopper configured to limit upward movement of the bobbin 1110 within a predetermined range. Alternatively, in another embodiment in which the magnet is disposed on the corner portion of the housing, the at least one boss of the cover member 1300 may perform the function of a yoke.

Next, the sensing coil 1170 will be described.

The sensing coil 1170 may be disposed under the lower elastic member 1160, and may be disposed on the base 1210.

For example, the sensing coil 1170 may be disposed so as to be wound around the outer surface of the base 1210 in the clockwise direction or the counterclockwise direction based on the optical axis OA. The sensing coil 1170 is configured to sense displacement of the AF operation unit, and the coil 1120 and the sensing coil 1170 may constitute a "sensing unit" configured to sense displacement of the AF operation unit.

For example, the sensing coil 1170 may be disposed in the seating recess 1201 provided in the outer surface of the base 1210. For example, the sensing coil 1170 may be disposed between the upper surface and the lower surface of the base 1210.

For example, the sensing coil 1170 may be disposed so as to be spaced apart from the first and second terminals 1164-1 and 1164-2 of the lower elastic member 1160 and the first and second terminals 1081 and 1082.

The sensing coil 1170 may generate induced voltage due to mutual induction with the coil 1120.

For example, at least a portion of the ring portion of the sensing coil 1170 may overlap the ring portion of the coil 1120 in the optical-axis direction. However, the disclosure is not limited thereto. In another embodiment, the ring portion of the sensing coil may not overlap the ring portion of the coil 1120 in the optical-axis direction.

The sensing coil 1170 may have a closed-curved shape, such as a ring shape, wrapping the outer surface of the base 1210. For example, the sensing coil 1170 may have a ring shape wound so as to be rotated in the clockwise direction or the counterclockwise direction based on the optical axis OA.

At least a portion of the sensing coil 1170 may overlap the magnet 1130 in the optical-axis direction. However, the disclosure is not limited thereto. In another embodiment, the two may not overlap each other in the optical-axis direction.

The sensing coil 1170 may be an induction coil configured to sense the position or displacement of the AF operation unit, e.g. the bobbin 1110. For example, the sensing coil 1170 may be a wire. However, the disclosure is not limited thereto. In another embodiment, the sensing coil may be an FPCB or a fine pattern (FP) coil.

For example, when the AF operation unit is moved due to interaction between the coil 1120 to which a driving signal is provided and the magnet 1130, induced voltage (or induced current) due to interaction between the coil 1120 and the sensing coil 1170 may be generated. The magnitude of the induced voltage (or the induced current) may be based on displacement of the AF operation unit, and the induced voltage (or the induced current) of the sensing coil 1170 may be output through the first terminal 1081 and the second terminal 1082.

A controller 410 of the camera module 200 or a controller 780 of an optical instrument 200A may sense displacement of the AF operation unit using the induced voltage (or the induced current) provided through the first and second terminals 1081 and 1082 of the lens moving apparatus 1100.

The coil 1120 may be connected to the first and second elastic members 1160-1 and 1160-2 in order to receive a driving signal or power through the first and second terminals 1164-1 and 1164-2 of the first and second elastic members 1160-1 and 1160-2.

In order to prevent a decrease in output and to reduce the effect due to noise, the sensing coil 1170 may be connected to the first and second terminals 1081 and 1082, and may output the induced voltage (or the induced current) through the first and second terminals 1081 and 1082. The reason for this is that resistance of each of the first and second terminals 1081 and 1082 may be lower than resistance of a corresponding one of the first and second elastic members 1160-1 and 1160-2 and that an electrical signal transmission path of the first and second terminals 1081 and 1082 is shorter than that of the first and second elastic members 1160-1 and 1160-2.

In another embodiment, the sensing coil 1170 may be connected to the first and second elastic members 1160-1 and 1160-2, and the coil 1120 may be connected to the first and second terminals 1081 and 1082.

In FIG. 31, the center A1 of the base 1210 and the center A2 of the sensing coil 1170 disposed on the base 1210 are shown. Referring to FIG. 31, for example, the center A1 of the base 1210 may be the spatial middle of the base 1210 in a two-dimensional plane perpendicular to the optical axis OA.

For example, the center A1 of the base 1210 may be the center or the spatial middle of the base 1210 in the optical-axis (OA) direction, and may overlap the side portions 1218a to 1218d of the base 1210 and/or the sensing coil 1170 in a direction perpendicular to the optical axis.

Alternatively, for example, the center of the base 1210 may be the spatial middle of the opening 21 of the base 1210 in a two-dimensional plane perpendicular to the optical axis OA. Alternatively, the center A1 of the base 1210 may be the center or the spatial middle of the opening 21 of the base 1210 in the optical-axis (OA) direction.

The center A1 of the base 1210 may be a point at which a first center line 1401 and a second center line 1402 are linked to each other.

For example, the first center line 1401 may be a straight line that is parallel to the second-axis direction (e.g. the Y-axis direction) and that passes through the center A1 of the base 1210. For example, the first center line 1401 may be a straight line that is parallel to the outer surface of the third side portion 1218c or the fourth side portion 1218d of the base 1210.

For example, the second center line 1402 may be a straight line that is parallel to the first-axis direction (e.g. the X-axis direction) and that passes through the center A1 of the base 1210. For example, the second center line 1402 may be a straight line that is parallel to the outer surface of the first side portion 1218a or the second side portion 1218b of the base 1210.

A third center line 1403 may be located between the first center line 1401 and the second side portion 1218b of the base 1210. The third center line 1403 may be a straight line that is parallel to the first-axis direction (e.g. the X-axis direction) and that passes through the center A2 of the sensing coil 1170. For example, the third center line 1403 may be a straight line that is parallel to the outer surface of the first side portion 1218a or the second side portion 1218b of the base 1210.

In addition, for example, an axis that is parallel to the optical axis and that passes through the center of the base 1210 may pass through at least one of the center of the bobbin 1110, the center of the housing 1140, and the optical axis.

The center A2 of the ring portion of the sensing coil 1170 may be the spatial center or the spatial middle of the sensing coil 1170 in a two-dimensional plane perpendicular to the optical axis OA. Hereinafter, the center of the ring portion of the sensing coil 1170 will be referred to as the "center A2 of the sensing coil."

For example, the center A2 of the sensing coil 1170 may be the center or the spatial middle of the sensing coil 1170 in the optical-axis (OA) direction, and may overlap the side portions 1218a to 1218d of the base 1210 and the sensing coil 1170 in a direction perpendicular to the optical axis OA.

Alternatively, for example, the center A2 of the sensing coil 1170 may be the middle of a ring formed by a coil line (or strand) that is located at the innermost side. Alternatively, the center A2 of the sensing coil 1170 may be the middle of a ring formed by a coil line (or strand) that is located at the outermost side.

The center A2 of the sensing coil 1170 may be spaced apart from the center A1 of the base 1210 by a predetermined distance D1 in the second-axis direction (the Y-axis direction).

The center A1 of the base 1210 may be located between the center A2 of the sensing coil 1170 and the first side portion 1218a of the base 1210. For example, A1 may be located between A2 and the outer surface of the first side portion 1218a of the base 1210 (or the first outer surface S11).

The distance L1 from the outer surface of the first side portion 1218a of the base 1210 to the center A1 of the base 1210 is less than the distance L2 from the first outer surface S11 of the base 1210 (or the outer surface of the first side portion 1218a of the base 1210) to the center A2 of the sensing coil 1170 (L1<L2).

Alternatively, the center A2 of the sensing coil 1170 may be located between the second side portion 1218b of the base 1210 and the center A1 of the base 1210. For example, A2 may be located between the second outer surface of the base 1210 (or the outer surface of the second side portion 1218b of the base 1210) and A1.

The distance L3 from the center A2 of the sensing coil 1170 to the first outer surface S11 of the base 1210 (or the outer surface of the first side portion 1218a of the base 1210) may be greater than the distance L4 from the center A2 of the sensing coil 1170 to the second outer surface of the base 1210 (or the outer surface of the second side portion 1218b of the base 1210) (L3>L4).

In addition, the distance from the third outer surface of the base 1210 (or the outer surface of the third side portion 1218c of the base 1210) to the center A1 of the base 1210 may be equal to the distance from the third outer surface of the base 1210 (or the outer surface of the third side portion 1218c of the base 1210) to the center A2 of the sensing coil 1170. However, the disclosure is not limited thereto. In another embodiment, the two may be different from each other.

In addition, the distance from the fourth outer surface S14 of the base 1210 (or the outer surface of the fourth side portion 1218d of the base 1210) to the center A1 of the base 1210 may be equal to the distance from the fourth outer surface S14 of the base 1210 (or the outer surface of the fourth side portion 1218d of the base 1210) to the center A2 of the sensing coil. However, the disclosure is not limited thereto. In another embodiment, the two may be different from each other.

Referring to FIG. 30A, the depth DT1 of the first recess 1009A formed in the first outer surface S11 of the base 1210 or the outer surface of the first side portion 1218a of the base 1210 may be greater than the depth DT2 of the second recess 1009B formed in the second outer surface S12 of the base 1210 or the outer surface of the second side portion 1218b of the base 1210 (DT1>DT2).

Hereinafter, the depth DT1 of the first recess may be the distance from the first outer surface of the base 1210 (or the outer surface of the first side portion 1218a of the base 1210) to the bottom surface 1004A of the first recess 1009A, and the depth DT2 of the second recess 1009B may be the distance from the second outer surface S12 of the base 1210 (or the outer surface of the second side portion 1218b of the base 1210) to the bottom surface 1004B of the second recess 1009B.

For example, the distance d1 from the center A1 of the base 1210 to a first portion 1170-1 of the sensing coil 1170 (or the bottom surface 1004A of the first recess 1009A) may be less than the distance d2 from the center A1 of the base 1210 to a second portion 1170-2 of the sensing coil 1170 (or the bottom surface 1004B of the second recess 1009B) (d1<d2). For example, each of d1 and d2 may be the shortest distance.

For example, d1 (or d2) may be the distance from A1 to the innermost strand of the first portion 1170-1 (or the second portion 1170-2) of the sensing coil 1170. For example, the innermost strand may be the strand that abuts the bottom surface 1004A of the first recess 1009A or the bottom surface 1004B of the second recess 1009B and that is the closest to A1.

When viewed from above, a first distance K1 between the terminal 1081 or 1082 and the optical axis OA may be less than a second distance K2 between the terminal 1081 or 1082 and the center A2 of the sensing coil 1170 (K1<K2). For example, the first distance K1 may be the distance between the first portion 1008a1 or 1009a1 of the terminal 1081 or 1082 and the optical axis OA.

For example, the first distance K1 may be the shortest distance between a horizontal plane that is parallel and identical to the inner surface of the first portion 1008a1 or 1009a1 of the terminal 1081 or 1082 and the optical axis OA, and the second distance K2 may be the shortest distance between the horizontal plane and the center A2 of the sensing coil 1170.

For example, the optical axis OA may be disposed between the center A2 of the sensing coil 1170 and the terminal 1081 or 1082.

Referring to FIGS. 30A and 31, when viewed from above, the distance R11 between the first outer surface S11 of the base 1210 and the optical axis OA may be less than the distance R12 between the first outer surface S11 of the base 1210 and the center A2 of the sensing coil 1170 (R11<R12).

R11 may be the shortest distance between the optical axis OA and the first outer surface S11, and R12 may be the shortest distance between the center A2 of the sensing coil 1170 and the first outer surface S11.

When viewed from above, the distance R2 from the center of the sensing coil 1170 to the first outer surface S11 of the base 1210 may be greater than the distance R3 from the center A2 of the sensing coil 1170 to the second outer surface S12 of the base 1210. R3 may be the shortest distance between the center A2 of the sensing coil 1170 and the second outer surface S12.

Referring to FIG. 30B, the depth DT3 of the third recess 1009C formed in the third outer surface S13 of the base 1210 or the outer surface of the third side portion 1218c of the base 1210 may be equal to the depth DT4 of the fourth recess 1009D formed in the fourth outer surface S14 of the base 1210 or the outer surface of the fourth side portion 1218b of the base 1210 (DT3=DT4).

The depth DT3 of the third recess 1009C may be the distance from third outer surface S13 of the base 1210 (or the outer surface of the third side portion 1218c of the base 1210) to the bottom surface 1004C of the third recess 1009C, and the depth DT4 of the fourth recess 1009D may be the distance from fourth outer surface S14 of the base 1210 (or the outer surface of the fourth side portion 1218d of the base 1210) to the bottom surface 1004D of the fourth recess 1009D.

In addition, each of DT3 and DT4 may be less than DT1. However, the disclosure is not limited thereto. In another embodiment, each of the depth of the third recess and the depth of the fourth recess may be equal to or greater than the depth of the first recess.

The number of windings of the first portion 1170-1 of the sensing coil 1170 disposed in the first recess 1009A of the base 1210 may be equal to the number of windings of the second portion 1170-2 of the sensing coil 1170 disposed in the second recess 1009B of the base 1210.

In addition, the number of windings of the third portion 1170-3 of the sensing coil 1170 disposed in the third recess 1009C of the base 1210 may be equal to the number of windings of the fourth portion 1170-4 of the sensing coil 1170 disposed in the fourth recess 1009D of the base 1210.

For example, the numbers of windings of the first to fourth portions 1170-1 to 1170-4 of the sensing coil 1170 disposed in the first to fourth recesses 1009A to 1009D may be equal to each other. For example, the numbers of windings of the first to fourth portions 1170-1 to 1170-4 of the sensing coil 1170 disposed in the first to fourth recesses 1009A to 1009D of the base 1210 in a direction perpendicular to the optical axis OA may be equal to each other. However, the disclosure is not limited thereto. In another embodiment, the number of windings of at least one of the first to fourth portions 1170-1 to 1170-4 in the direction perpendicular to the optical axis OA may be different from the numbers of windings of the other portions.

In addition, for example, the numbers of windings of the first to fourth portions 1170-1 to 1170-4 of the sensing coil 1170 disposed in the first to fourth recesses 1009A to 1009D of the base 1210 in the optical-axis (OA) direction may be equal to each other. However, the disclosure is not limited thereto. In another embodiment, the number of windings of at least one of the first to fourth portions 1170-1 to 1170-4 in the optical-axis (OA) direction may be different from the numbers of windings of the other portions.

Referring to FIG. 31, for example, the first outer surface S11 of the base 1210 may be an outer surface between a first reference line 1501 and a second reference line 1502, the second outer surface S12 of the base 1210 may be an outer surface between a third reference line 1503 and a fourth reference line 1504, the third outer surface S13 of the base 1210 may be an outer surface between the first reference line 1501 and the fourth reference line 1504, and the fourth outer surface S14 of the base 1210 may be an outer surface between the second reference line 1502 and the third reference line 1503.

For example, the first reference line 1501 may be a straight line passing through a corner 1007A of the outer surface of the first corner portion of the base 1210 and the center A1 of the base 1210, the second reference line 1502 may be a straight line passing through a corner 1007B of the outer surface of the second corner portion 1219b of the base 1210 and the center A1 of the base 1210, the third reference line 1503 may be a straight line passing through a corner 1007C of the outer surface of the third corner portion 1219c of the base 1210 and the center A1 of the base 1210, and the fourth reference line 1504 may be a straight line passing through a corner 1007D of the outer surface of the fourth corner portion 1219d of the base 1210 and the center A1 of the base 1210.

The first outer surface S11 and the second outer surface S12 of the base 1210 may be located opposite each other, and the third outer surface S13 and the fourth outer surface S14 of the base 1210 may be located opposite each other.

Generally, in a structure in which a sensing coil is disposed or wound in a recess formed in the outer surface of a base and terminals for connection with the outside are disposed on a portion of the outer surface of the base, the number of windings of the sensing coil may be limited due to spatial interference between the sensing coil and the terminals for connection with the outside, whereby induced voltage generated in the sensing coil may be reduced and sensing sensitivity and sensing accuracy may be deteriorated.

In the embodiment, however, the center A2 of the sensing coil 1170 disposed in the recess 1201 of the base 1210 is biased to the second outer surface S12, located opposite the first outer surface S11 of the base 1210 at which the terminals 1081 and 1082 are disposed, more than the center A1 of the base 1210, whereby it is possible to prevent the number of turns of the sensing coil 1170 from being limited due to spatial interference with the terminals 1081 and 1082.

That is, as described with reference to FIG. 30A, the depth DT1 of the first recess 1009A formed in the first outer surface S11 of the base 1210 is greater than the depth DT2 of the second recess 1009B formed in the second outer surface S12 of the base 1210 (DT1>DT2), whereby it is possible to prevent the number of turns of the sensing coil 1170 from being limited due to spatial interference with the terminals 1081 and 1082.

Figure 32:
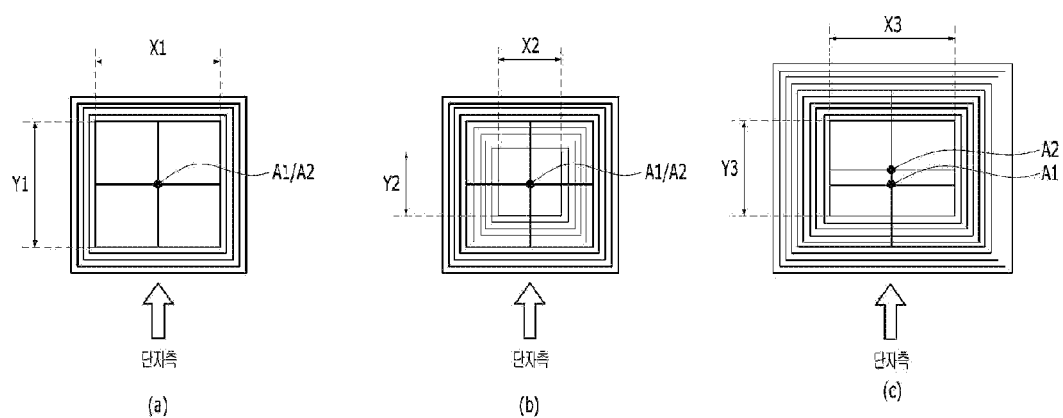
FIG. 32 is experimental results showing area differences of an inner space of the sensing coil according to disposition of the center of the sensing coil and the center of the base.

FIG. 32 is experimental results showing area differences of an inner space of the sensing coil according to disposition of the center A2 of the sensing coil and the center A1 of the base.

FIG. 32(*a*) shows the case in which the sensing coil is wound around the outer surface of the base five times and the center of the sensing coil and the center of the base are aligned to coincide with each other (hereinafter referred to as "CASE1").

FIG. 32(*b*) shows the case in which the sensing coil is further wound inside the base five times, compared to FIG. 32(*a*) (hereinafter referred to as "CASE2").

FIG. 32(*c*) shows the case in which the sensing coil is wound around the outer surface of the base ten times and the center of the sensing coil is located spaced farther apart from the terminal side than the center of the base (hereinafter referred to as "CASE3").

The inner areas of the sensing coils of FIGS. 32(*b*) and 32(*c*) are compared with each other based on the inner area of a space located inside the sensing coil of FIG. 32(*a*).

For example, the inner area (X1×Y1) of CASE1 may be 400 mm$^2$, the inner area (X2×Y2) of CASE2 may be 100 mm$^2$, and the inner area (X3×Y3) of CASE3 may be 300 mm$^2$.

Since the inner area of FIG. 32(*b*) is reduced by 75%, compared to FIG. 32(*a*), the aperture of the lens may be limited so as to be appropriate to the inner area (X2×Y2) of FIG. 32(*b*), whereby it may not be appropriate for a large aperture and/or the number of turns of the sensing coil may be limited. When the number of turns of the sensing coil is reduced, the magnitude of induced voltage of the sensing coil is small, and therefore sensitivity of the sensing coil may be deteriorated.

On the other hand, CASE3 shows disposition of the sensing coil according to the embodiment, and the inner area (X3×Y3) of CASE3 is reduced by 25%, compared to FIG. 32(*a*). Compared to CASE2, CASE3 is capable of alleviating limitation in lens aperture depending on the number of windings of the sensing coil.

In addition, although the number of turns of the sensing coil is 10, which is equal to that of CASE2, the length of the sensing coil of CASE3 is greater than the length of the sensing coil of CASE2, whereby the resistance of the sensing coil of CASE3 is greater than the resistance of the sensing coil of CASE2. Since the resistance of the sensing coil of CASE3 is greater than the resistance of the sensing coil of CASE2, induced voltage of the sensing coil of CASE3 may be higher than induced voltage of the sensing coil of CASE2, whereby it is possible to improve sensitivity of the sensing coil. That is, CASE3 is capable of increasing the number of windings of the sensing coil and at the same time alleviating limitation in lens aperture due to the number of windings of the sensing coil, thereby improving sensitivity of the sensing coil.

Figure 33:
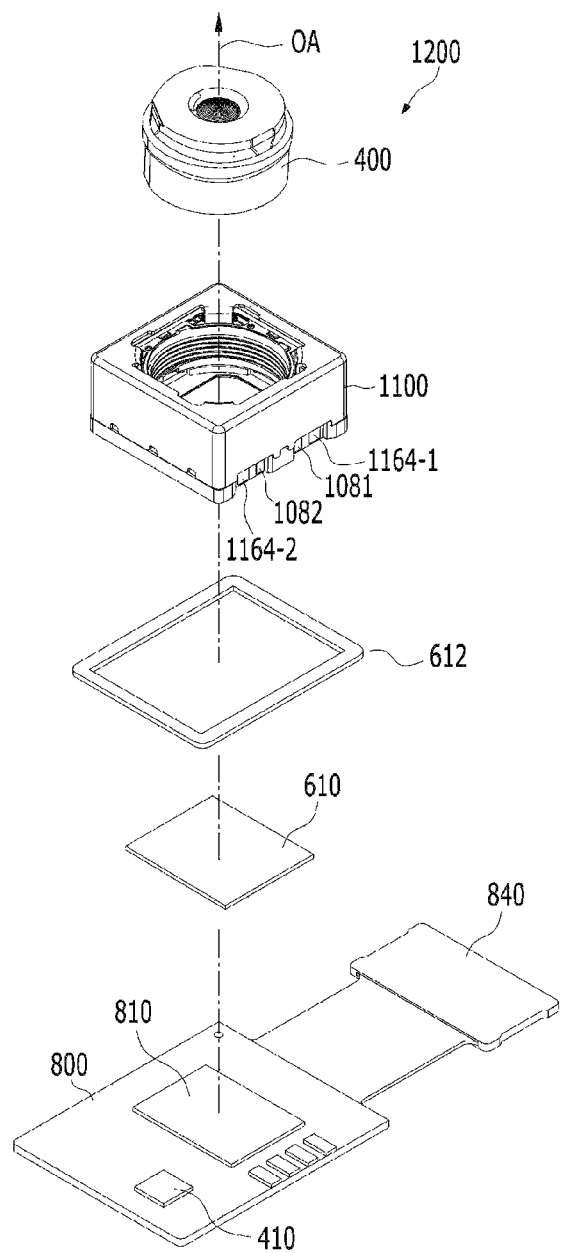
FIG. 33 is an exploded perspective view of a camera module according to another embodiment.

FIG. 33 is an exploded perspective view of a camera module 200 according to another embodiment.

Referring to FIG. 33, the camera module may include a lens module 400, a lens moving apparatus 1100, an adhesive member 612, a filter 610, a circuit board 800, an image sensor 810, a controller 410, and a connector 840. Reference numerals of FIG. 33 identical to those of FIG. 19 denote the same components, and a description of the same components will be briefly given or omitted.

The circuit board 800 may be connected to a coil 1120 and a sensing coil 1170 of the lens moving apparatus 1100.

For example, the circuit board 800 may be provided with terminals connected to first and second terminals 1164-1 and 1164-2 of a lower elastic member 1160 and first and second terminals 1081 and 1082 of the lens moving apparatus 1100.

The circuit board 800 is shown as including four terminals. However, the disclosure is not limited thereto. In another embodiment, the circuit board 800 may include a plurality of terminals for AF driving, e.g. two or more terminals.

The controller 410 may control AF driving of the lens moving apparatus 1100. In another embodiment, the controller 410 may be omitted.

Figure 34:
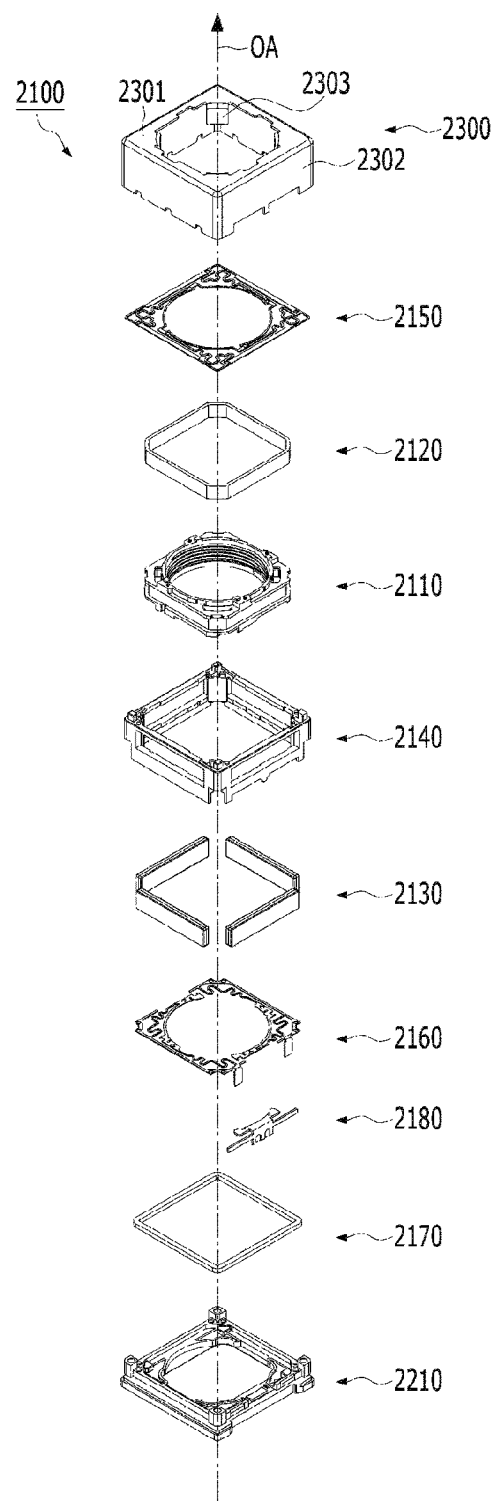
FIG. 34 is a separated perspective view of a lens moving apparatus according to another embodiment.
Figure 35:
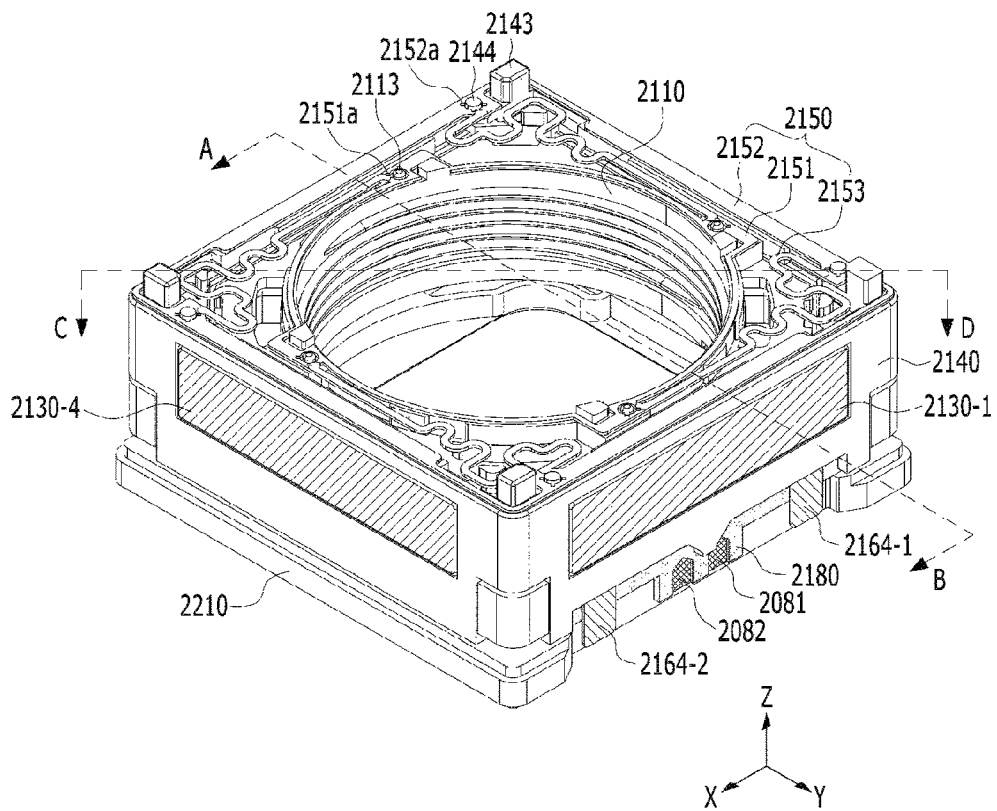
FIG. 35 is a coupled view of the lens moving apparatus of FIG. 34 with a cover member removed.

FIG. 34 is a separated perspective view of a lens moving apparatus 2100 according to another embodiment, and FIG. 35 is a coupled view of the lens moving apparatus 2100 with a cover member 2300 removed.

Referring to FIGS. 34 and 35, the lens moving apparatus 2100 may include a bobbin 2110, a coil 2120, a magnet 2130, a housing 2140, a base 2210, a sensing coil 2170, a lower elastic member 2160, and a circuit board 2180.

In addition, the lens moving apparatus 2100 may further include at least one of an upper elastic member 2150 and a cover member 2300.

The bobbin 2110 and the housing 2140 will be described.

Figure 36A:
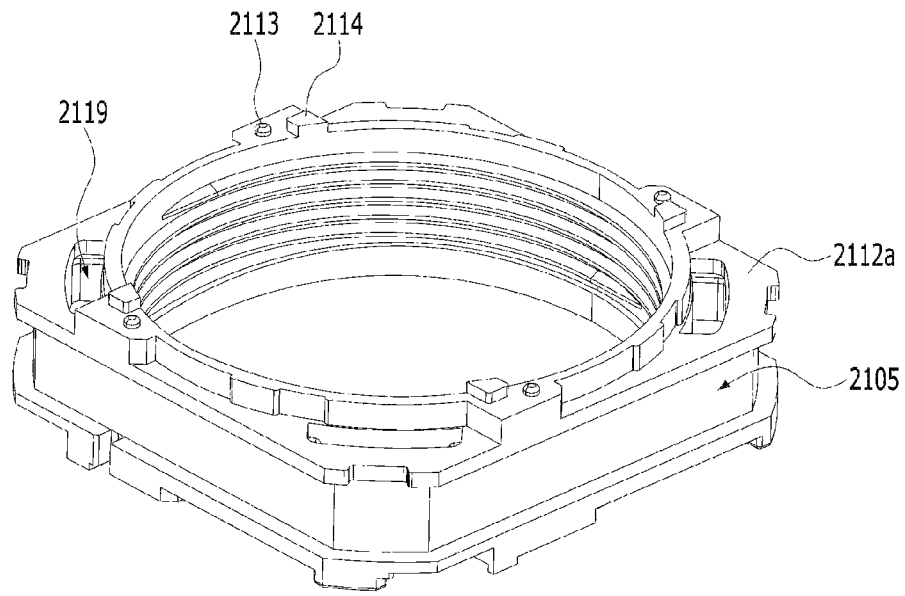
FIG. 36A is a perspective view of a bobbin shown in FIG. 34.
Figure 36B:
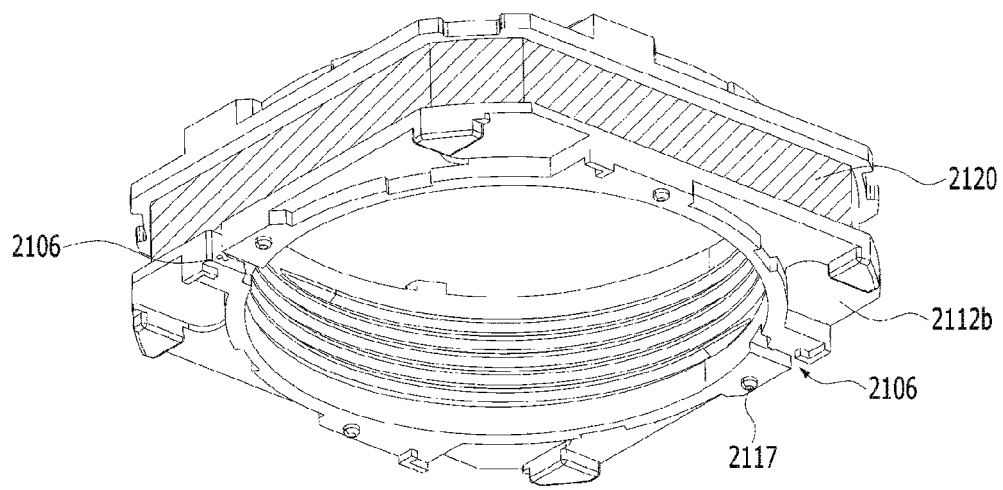
FIG. 36B is a coupled view of the bobbin and a coil of FIG. 34.
Figure 37A:
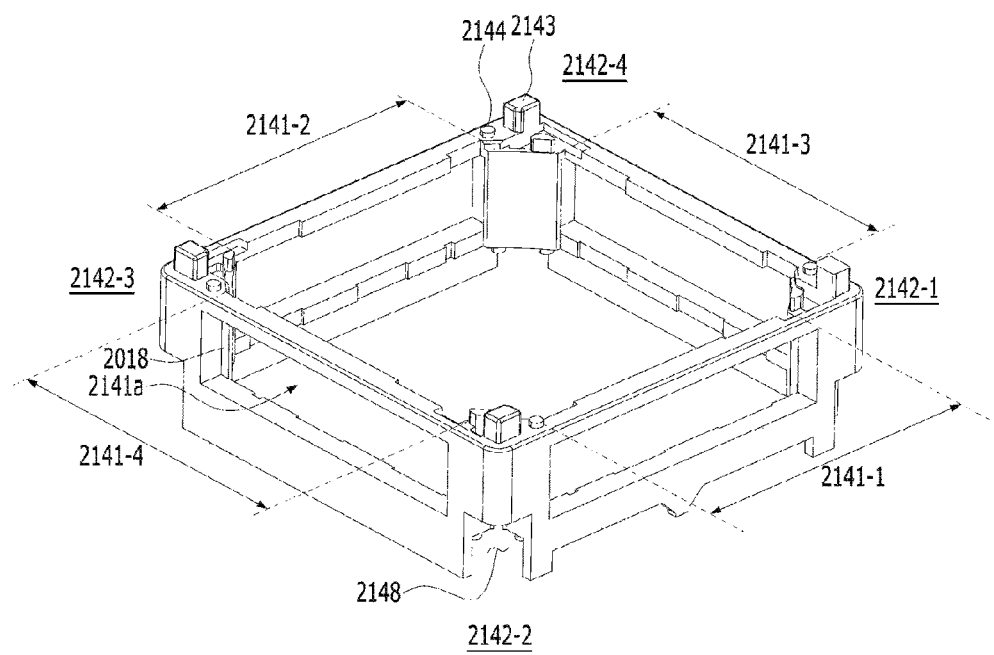
FIG. 37A is a perspective view of a housing of FIG. 34.
Figure 37B:
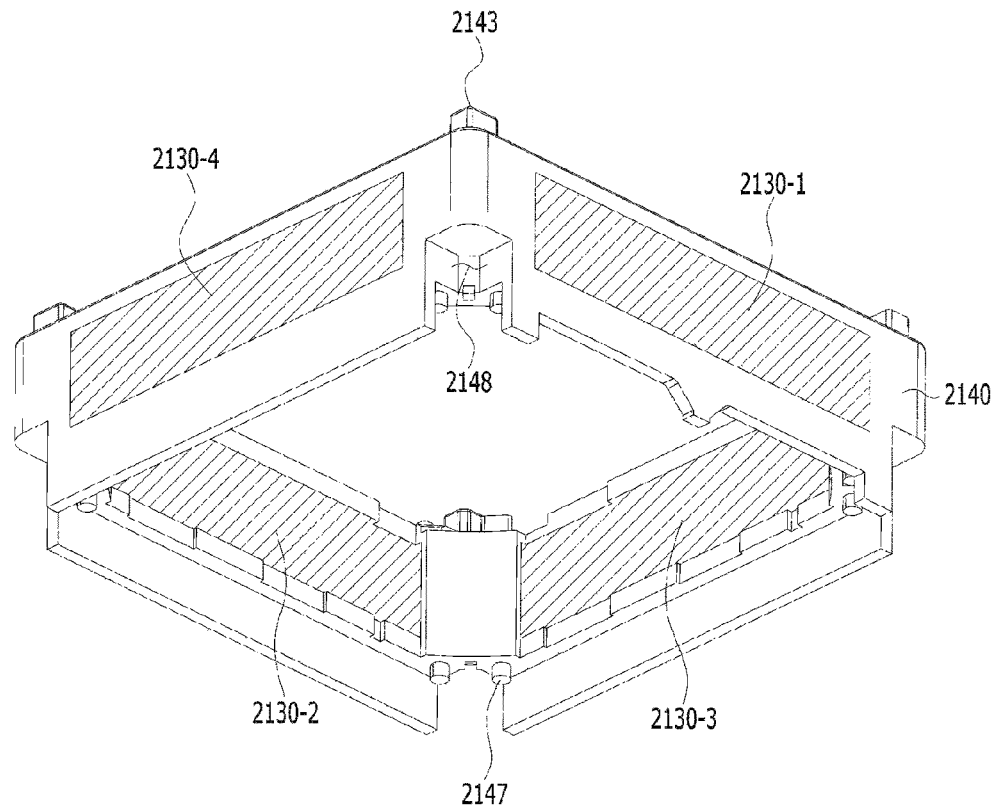
FIG. 37B is a coupled view of the housing and a magnet of FIG. 34.

FIG. 36A is a perspective view of the bobbin 2110 shown in FIG. 34, FIG. 36B is a coupled view of the bobbin 2110 and the coil 2120, FIG. 37A is a perspective view of the housing 2140, and FIG. 37B is a coupled view of the housing 2140 and the magnet 2130.

The bobbin 2110 may be disposed in the housing 2140, and may be moved in the optical-axis (OA) direction or a direction parallel to the optical axis as the result of electromagnetic interaction between the coil 2120 and the magnet 2130.

The bobbin 2110 may have an opening or a hollow portion, in which a lens or a lens barrel is mounted. The shape of the opening (or the hollow portion) of the bobbin 2110 may coincide with the shape of the lens or the lens barrel mounted therein, and may be circular, oval, or polygonal. However, the disclosure is not limited thereto. For example, the opening of the bobbin 2110 may be a through-hole formed through the bobbin 2110 in the optical-axis direction.

The lens or the lens module may be directly coupled to the inner surface of the bobbin 2110. However, the disclosure is not limited thereto. For example, the bobbin 2110 may include a lens barrel (not shown), in which at least one lens is installed, and the lens barrel may be coupled to the inner surface of the bobbin 2110 in various manners. For example, a screw thread for coupling with the lens or the lens module may be provided in the inner surface of the bobbin 2110.

The bobbin 2110 may be provided at the upper surface, the upper portion, or the upper end thereof with at least one first coupling portion 2113 configured to be coupled and fixed to an inner frame 2151 of the upper elastic member 2150.

The bobbin 2110 may be provided at the lower surface, the lower portion, or the lower end thereof with at least one second coupling portion 2117 configured to be coupled and fixed to an inner frame 2161 of the lower elastic member 2160.

For example, in FIGS. 36A and 36B, each of the first coupling portion 2113 and the second coupling portion 2117 of the bobbin 2110 is a protrusion. However, the disclosure is not limited thereto. In another embodiment, at least one of the first and second coupling portions of the bobbin 2110 may be a coupling recess or a flat surface.

A first escape recess 2112a may be provided in a region of the upper surface of the bobbin 2110 corresponding to or aligned with a first frame connection portion 2153 of the upper elastic member 2150.

In addition, a second escape recess 2112b may be provided in a region of the lower surface of the bobbin 2110 corresponding to or aligned with a second frame connection portion 2163 of the lower elastic member 2160.

When the bobbin 2110 is moved in the first direction, spatial interference between the first and second frame connection portions 2153 and 2163 and the bobbin 2110 may be avoided by the first escape recess 2112a and the second escape recess 2112b of the bobbin 2110, whereby the first and second frame connection portions 2153 and 2163 of the upper and lower elastic members 2150 and 2160 may be more easily elastically deformed.

In another embodiment, the first frame connection portion of the upper elastic member and the bobbin may be designed so as not to interfere with each other, and the first escape recess and/or the second escape recess may not be provided in the bobbin.

The bobbin 2110 may be provided in the outer surface thereof with at least one recess 2105, in which the coil 2120 is disposed.

The coil 2120 may be disposed or seated in the recess 2105 of the bobbin 2110.

For example, the coil 2120 may be directly wound or turned in the recess 2105 of the bobbin 2110 so as to be rotated in the clockwise direction or in the counterclockwise direction based on the optical axis (OA).

The shape and number of recesses 2105 of the bobbin 2110 may correspond to the shape and number of coils disposed on the outer surface of the bobbin 2110. In another embodiment, the bobbin 2110 may have no recess in which the coil is seated, and the coil 2120 may be directly wound or turned around the outer surface of the bobbin 2110 having no recess so as to be fixed thereto.

The bobbin 2110 may be provided in the lower end of the outer surface thereof with at least one recess 2106, and one end or a portion (e.g. a start-line region) or the other end or another portion (e.g. an end-line region) of the coil 2120 may be disposed in the at least one recess or may extend through the at least one recess.

Next, the coil 2120 will be described.

The coil 2120 may be disposed on the bobbin 2110, may be coupled or connected to the bobbin 2110, or may be supported by the bobbin 2110.

For example, the coil 2120 may be disposed on the outer surface of the bobbin 2110 and may perform electromagnetic interaction with the magnet 2130 disposed on the housing 2140. That is, the coil 2120 may function as a coil for AF operation. Also, in order to generate electromagnetic force due to interaction with the magnet 2130, power may be provided to or a driving signal may be applied to the coil 2120.

In order to generate induced voltage (or induced current) due to mutual induction with the sensing coil 2170, the driving signal provided to the coil 2120 may include an alternating-current signal or may include an alternating-current signal and a direct-current signal.

For example, the alternating-current signal provided to the coil 2120 may be a sinusoidal signal or a pulse signal (for example, a pulse width modulation (PWM) signal). For example, the driving signal may have the form of current or voltage.

For example, the direct-current signal of the driving signal provided to the coil 2120 may move an AF operation unit in the optical-axis direction due to interaction with the magnet 2130, and the alternating-current signal of the driving signal may be provided to generate induced voltage (or induced current) due to interaction with the sensing coil 2170. However, the disclosure is not limited thereto.

The bobbin 2110 elastically supported by the upper and lower elastic members 2150 and 2160 may be moved in the optical-axis direction or the first direction by electromagnetic force due to electromagnetic interaction between the coil 2120 and the magnet 2130. The coil 2120 and the magnet 2130 may be a "lens moving unit" configured to move the lens.

The driving signal provided to the coil 2120 may be controlled, whereby movement of the bobbin 2110 in the first direction may be controlled, and therefore an autofocus function may be performed.

The coil 2120 may be disposed so as to wrap the outer surface of the bobbin 2110 so as to be rotated about the optical axis in the clockwise direction or the counterclockwise direction. For example, the coil 2120 may be disposed or wound in the recess 2105 provided in the outer surface of the bobbin 2110.

For example, the coil 2120 may have a closed-curved shape or a ring shape.

In another embodiment, the coil 2120 may be realized in the form of a coil ring wound about an axis perpendicular to the optical axis in the clockwise direction or the counterclockwise direction, and the number of coil rings may be equal to the number of magnets 2130. However, the disclosure is not limited thereto.

The coil 2120 may be connected to at least one of the upper and lower elastic members 2150 and 2160. A driving signal may be applied to the coil 2120 through at least one of the upper and lower elastic members 2150 and 2160. For example, a driving signal may be provided to the coil 2120 through two elastic members 2160-1 and 2160-2.

Referring to FIGS. 37A and 37B, the housing 2140 supports the magnet 2130, and receives the bobbin 2110 therein such that the bobbin 2110 can be moved in the first direction.

The housing 2140 may generally have a hollow pillar shape.

The housing 2140 may be provided with an opening (or a hollow portion) in which the bobbin 2110 is received, and the opening of the housing 2140 may be a through-hole formed through the housing 2130 in the optical-axis direction.

The housing 2140 may include side portions (or "first side portions") 2141-1 to 2141-4 and corner portions (or "second side portions") 2142-1 to 2142-4.

For example, the housing 2140 may include a plurality of side portions 2141-1 to 2141-4 and a plurality of corner portions 2142-1 to 2142-4 disposed so as to form a polygonal (e.g. quadrangular or octagonal) or circular opening. Here, the corner portions of the housing 2140 may also be referred to as "pillar portions."

For example, the side portions 2141-1 to 2141-4 of the housing 2140 may be disposed on positions corresponding to the side plates 2302 of the cover member 2300, and corresponding ones of the side portions of the housing 2140 and the side plates of the cover member 2300 may be parallel to each other.

For example, the side portions 2141-1 to 2141-4 of the housing 2140 may be portions corresponding to sides of the housing 2140, and the corner portions 2142-1 to 2142-4 of the housing 2140 may be portions corresponding to corners of the housing 2140.

The inner surface of each of the corner portions 2142-1 to 2142-4 of the housing 2140 may be a flat surface, a chamfered surface, or a curved surface.

The magnet 2130 may be disposed or installed at at least one of the side portions 2141-1 to 2141-4 of the housing 2140. For example, seating portions 2141a, in which magnets 2130-1 to 2130-4 are seated, disposed, or fixed, may be provided at the first to fourth side portions 2141-1 to 2141-4 of the housing 2140.

In FIG. 37A, the seating portions 2141a may be openings or through-holes formed through the side portions 2141-1 to 2141-4 of the housing 2140. However, the disclosure is not limited thereto. In another embodiment, the seating portions may be recesses or concave recesses.

The housing 2140 may include a supporting portion 2018 adjacent to the seating portion 2141a in order to support the edge of a first surface of the magnet 2130 opposite the coil 2120.

The supporting portion 2018 may be located adjacent to the inner surface of the housing 2140, and may protrude from the side surface of the seating portion 2141a in the horizontal direction. In addition, for example, the supporting portion 2018 may include a tapered portion or an inclined surface. In another embodiment, the housing 2140 may include no supporting portion 2018.

In addition, the housing 2140 may be provided in the lower portions of the outer surfaces of the corner portions 2142-1 to 2142-4 thereof with guide recesses 2148, into which bosses (e.g. 2216a to 2216d) of the base 2210 are inserted, fastened, or coupled.

The housing 2140 may be provided on the upper portion, the upper surface, or the upper end thereof with a stopper 2143 in order to prevent direct collision with the inner surface of the upper plate of the cover member 2300. Here, the stopper 2143 may also be referred to as a "boss" or a "protrusion."

For example, the stoppers 2143 may be provided at the corner portions of the housing 2140. However, the disclosure is not limited thereto. In another embodiment, the stoppers 2143 may be provided at at least one of the side portions and the corner portions of the housing 2140.

For example, the upper surface of the stopper 2143 of the housing 2140 may contact the inner surface of the upper plate 2301 of the cover member 2300. However, the disclosure is not limited thereto. In another embodiment, there may be no contact therebetween.

In addition, the housing 2140 may be provided on the upper surface, the upper end, or the upper portion thereof with at least one first coupling portion 2144 coupled to an outer frame 2152 of the upper elastic member 2150. In addition, the housing 2140 may be provided on the lower surface, the lower portion, or the lower end thereof with at least one second coupling portion 2147 coupled to an outer frame 2162 of the lower elastic member 2160.

In FIGS. 36A and 37B, each of the first and second coupling portions 2144 and 2147 of the housing 2140 is a protrusion. However, the disclosure is not limited thereto. In another embodiment, at least one of the first and second coupling portions 2144 and 2147 may be a recess or a flat surface.

For example, the guide recesses 2148 of the housing 2140 and the bosses (e.g. 2216a to 2216d) of the base 2210 may be coupled to each other using an adhesive (not shown), such as silicone or epoxy, whereby the housing 2140 may be coupled to the base 2210.

Next, the magnet 2130 will be described.

At an initial position of the AF operation unit (e.g. the bobbin 2110), the magnet 2130 may be disposed on the side portions 2141-1 to 2141-4 of the housing 2140 so as to correspond to or to be opposite the coil 2120 in a direction perpendicular to the optical axis OA. However, the disclosure is not limited thereto. In another embodiment, the magnet may be disposed on the corner portions 2142-1 to 2142-4 of the housing 2140.

Here, the initial position of the AF operation unit (e.g. the bobbin 2110) may be the original position of the AF operation unit in the state in which neither power nor a driving signal is applied to the coil 2120 or the position at which the AF operation unit is located as the result of the upper and lower elastic members 2150 and 2160 being elastically deformed due only to the weight of the AF operation unit.

In addition, the initial position of the AF operation unit (e.g. the bobbin 2110) may be the position at which the AF operation unit is located when gravity acts in the direction from the bobbin 2110 to the base 2210 or when gravity acts in the direction from the base 2210 to the bobbin 2110.

For example, the AF operation unit may include the bobbin 2110 and components coupled to the bobbin 2110. For example, the AF operation unit may include the bobbin 2110 and the coil 2120. In the case in which a lens or a lens barrel is mounted, the AF operation unit may include the lens or the lens barrel.

In the embodiment, bidirectional driving is possible such that the AF operation unit is movable forwards (or upwards) and rearwards (or downwards) from the initial position of the AF operation unit due to interaction between the coil 2120 and the magnet 2130. In another embodiment, unidirectional driving is possible such that the AF operation unit is movable forwards from the initial position.

At the initial position of the AF operation unit, the magnet 2130 may be disposed in the seating portion 2141a of the housing 2140 so as to overlap the coil 2120 in a direction perpendicular to the optical-axis direction.

In another embodiment, no seating portion 2141a may be formed in the side portions 2141-1 to 2141-4 of the housing 2140, and the magnet 2130 may be disposed on the outer surfaces or the inner surfaces of the side portions 2141-1 to 2141-4 of the housing 2140.

In the embodiment, the magnet 2130 includes first to fourth magnets 2130-1 to 2130-4 disposed on the first to fourth side portions 2141-1 to 2141-4 of the housing 2140. However, the disclosure is not limited thereto. The number of magnets 2130 may be two or more. In another embodiment, two magnets may be disposed on two opposite side portions of the housing 2140.

Each of the magnets 2130-1 to 2130-4 may have a shape corresponding to the outer surface of a corresponding one of the side portions 2141-1 to 2141-4 of the housing 2140, for example a polyhedral shape (e.g. a hexahedral shape or a rectangular parallelepiped shape). However, the disclosure is not limited thereto.

Each of the magnets 2130-1 to 2130-4 may be a monopolar magnetized magnet having two different polarities and a border surface naturally formed between the different polarities.

For example, each of the magnets 2130-1 to 2130-4 may be a monopolar magnetized magnet disposed such that a first surface thereof facing the coil 2120 has an N pole and a second surface opposite the first surface has an S pole. However, the disclosure is not limited thereto. The N pole and the S pole may be reversely disposed.

In another embodiment, in order to increase electromagnetic force, each of the magnets 2130-1 to 2130-4 may be a bipolar magnetized magnet divided into two parts in a direction perpendicular to the optical axis. Here, each of the magnets 2130-1 to 2130-4 may be realized by a ferrite, alnico, or rare-earth magnet. However, the disclosure is not limited thereto.

In the case in which each of the magnets 2130-1 to 2130-4 is a bipolar magnetized magnet, each of the magnets 2130-1 to 2130-4 may include a first magnet portion, a second magnet portion, and a partition disposed between the first magnet portion and the second magnet portion.

The first magnet portion may include an N pole, an S pole, and a first border surface between the N pole and the S pole. Here, the first border surface may be a portion having substantially no magnetism, may include a section having little polarity, and may be a portion that is naturally generated in order to form a magnet including a single N pole and a single S pole.

The second magnet portion may include an N pole, an S pole, and a second border surface between the N pole and the S pole. Here, the second border surface may be a portion having substantially no magnetism, may include a section having little polarity, and may be a portion that is naturally generated in order to form a magnet including a single N pole and a single S pole.

The partition may be a portion that separates or isolates the first magnet portion and the second magnet portion, may be a portion having substantially no magnetism, and may be a portion having little polarity. For example, the partition may be a nonmagnetic material or air. For example, the nonmagnetic partition may also be referred to as a "neutral zone."

The partition is a portion that is artificially formed when the first magnet portion and the second magnet portion are magnetized, and the width of the partition may be greater than the width of each of the first border surface and the second border surface. Here, the width of the partition may be the length of the partition in the direction from the first magnet portion to the second magnet portion.

The first surface of each of the magnets 2130-1 to 2130-4 may be a flat surface. However, the disclosure is not limited thereto. The first surface of each of the magnets 2130-1 to 2130-4 may include a curved surface, an inclined surface, or a tapered portion. For example, the first surface of each of the magnets 2130-1 to 2130-4 may be a surface opposite the outer surface of the bobbin 2110 and/or the coil 2120.

Next, the base 2210, the upper elastic member 2150, the lower elastic member 2160, the sensing coil 2170, and the circuit board 2180 will be described.

Figure 38:
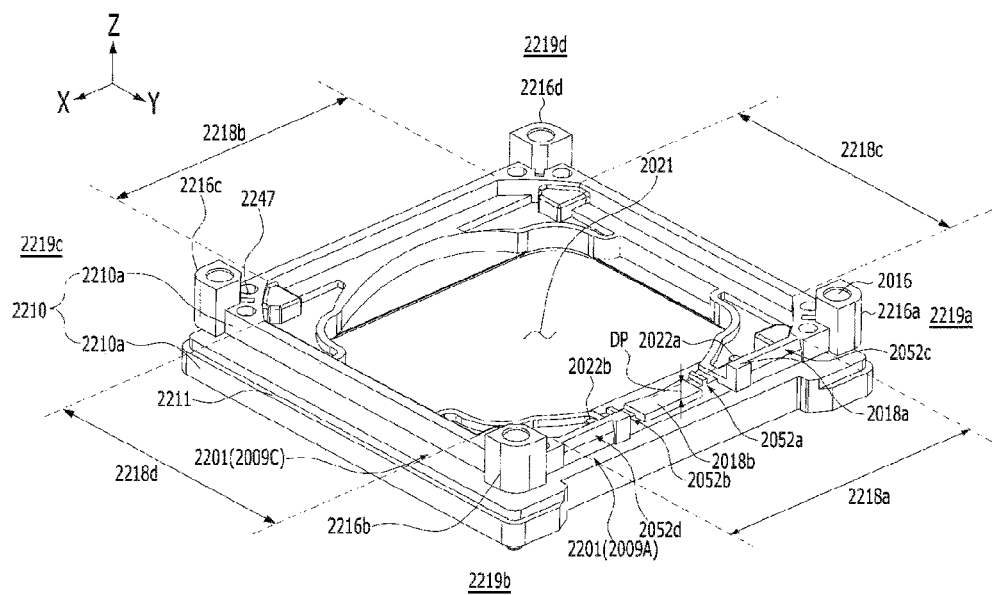
FIG. 38 is a perspective view of a base of FIG. 34.
Figure 39:
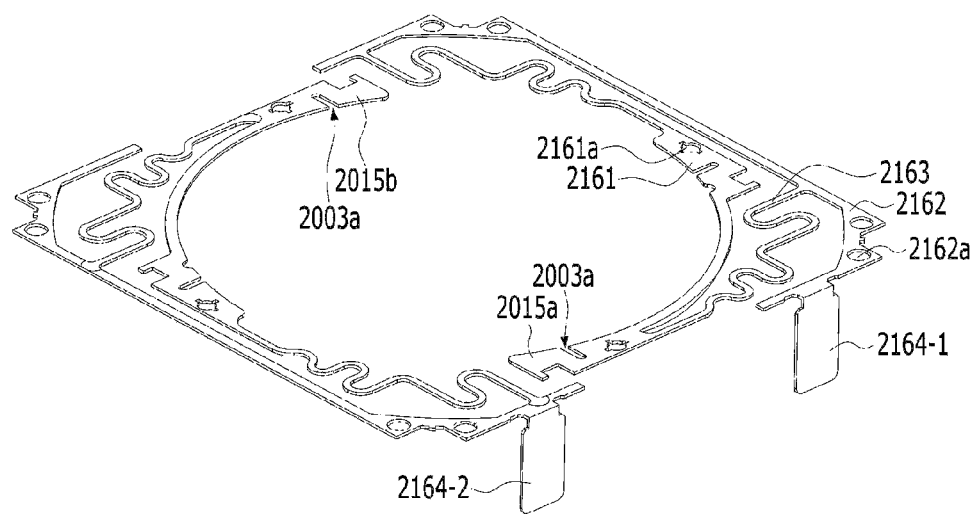
FIG. 39 is a perspective view of a lower elastic member.
Figure 40A:
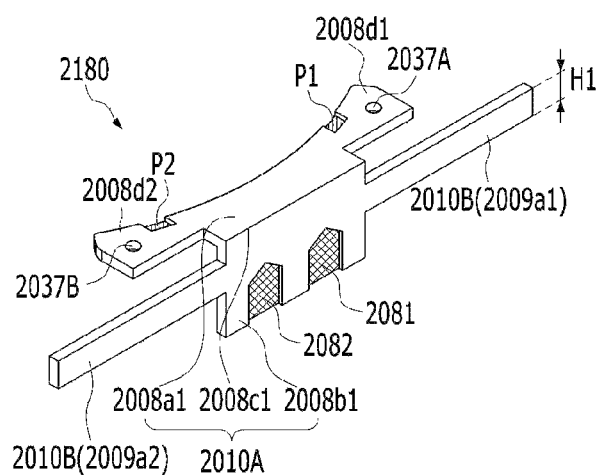
FIG. 40A is an enlarged perspective view of a circuit board of FIG. 34.
Figure 41:
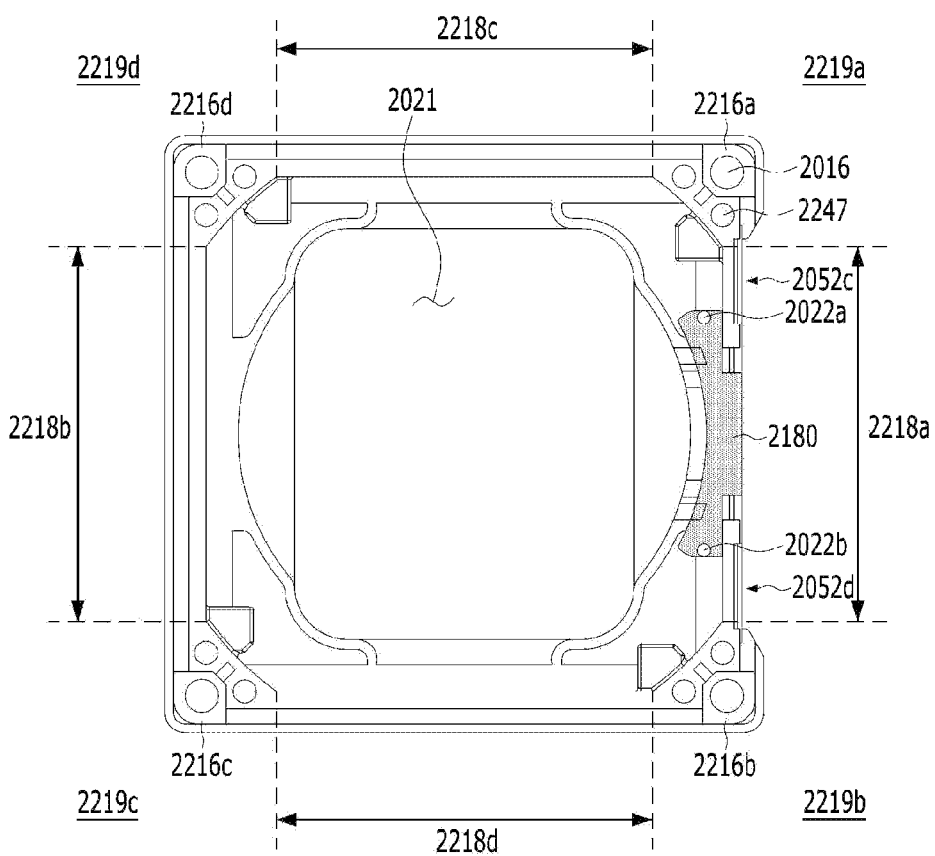
FIG. 41 is a plan view of the base and the circuit board of FIG. 34.
Figure 42:
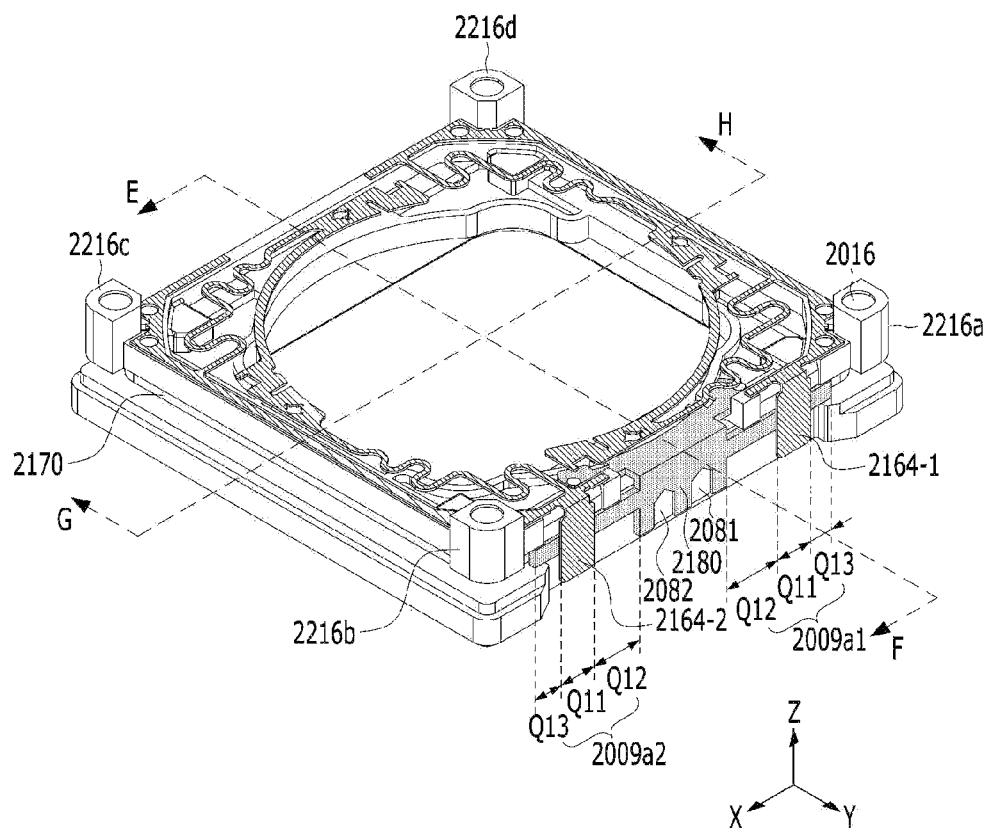
FIG. 42 is a perspective view of the base, the lower elastic member, a sensing coil, and the circuit board of FIG. 34.
Figure 43A:
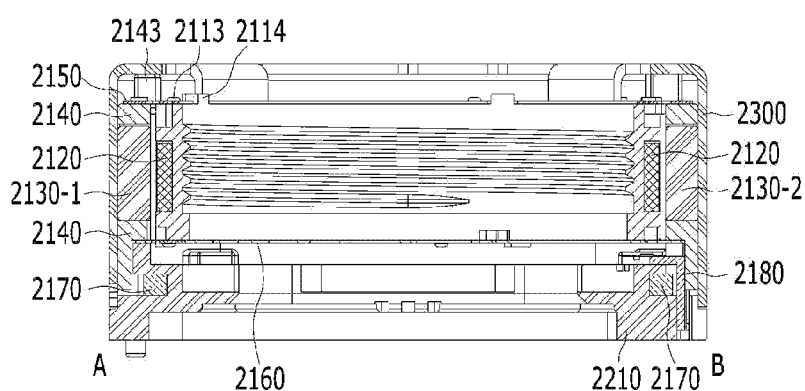
FIG. 43A is a sectional view of FIG. 35 in an AB direction.
Figure 43B:
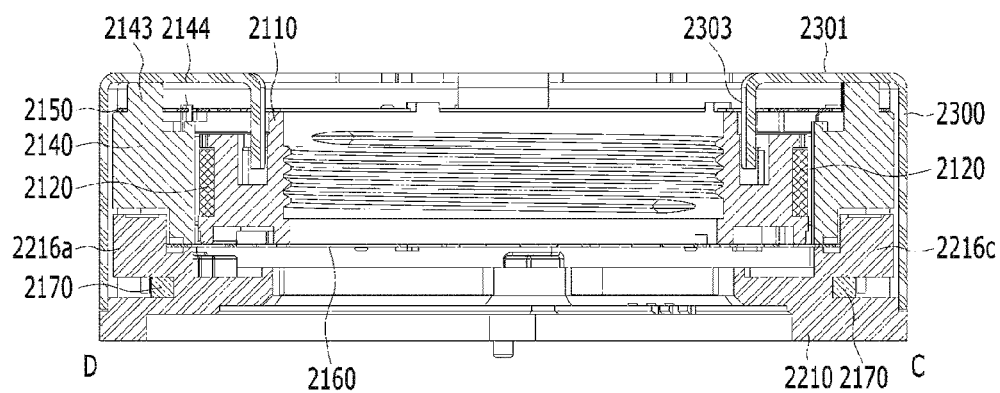
FIG. 43B is a sectional view of FIG. 35 in a CD direction.
Figure 44A:
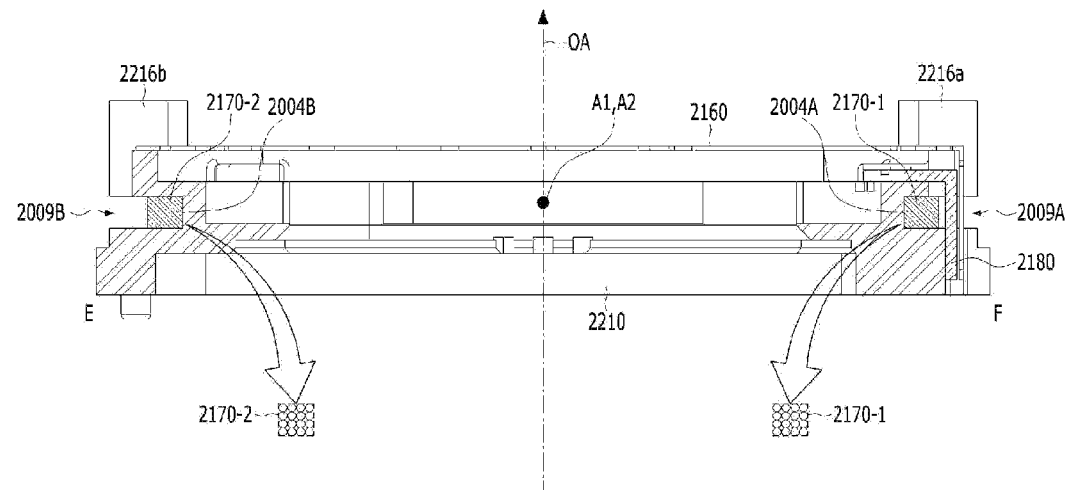
FIG. 44A is a sectional view of FIG. 42 in an EF direction.
Figure 44B:
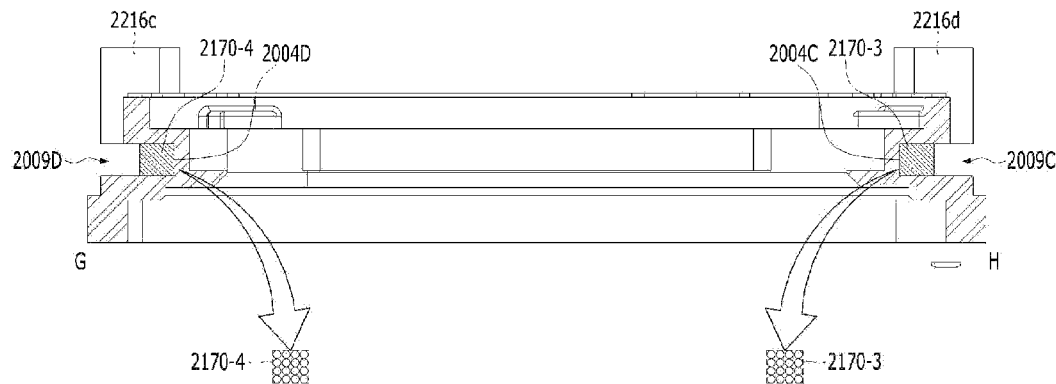
FIG. 44B is a sectional view of FIG. 42 in a GH direction.
Figure 45:
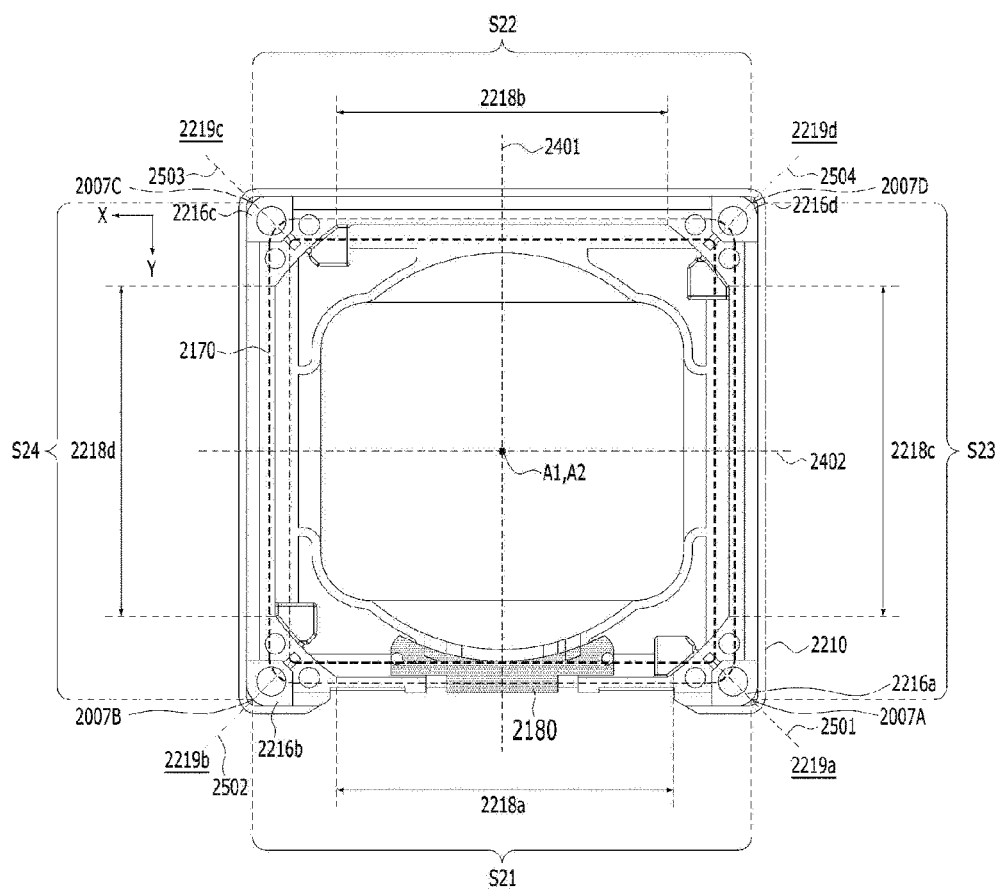
FIG. 45 is a plan view of the base, the sensing coil, and the circuit board of FIG. 34.

FIG. 38 is a perspective view of the base 2210, FIG. 39 is a perspective view of the lower elastic member 2160, FIG. 40A is an enlarged perspective view of the circuit board 2180, FIG. 41 is a plan view of the base 2210 and the circuit board 2180, FIG. 42 is a perspective view of the base 2210, the lower elastic member 2160, the sensing coil 2170, and the circuit board 2180, FIG. 43A is a sectional view of FIG. 35 in an AB direction, FIG. 43B is a sectional view of FIG. 35 in a CD direction, FIG. 44A is a sectional view of FIG. 42 in an EF direction, FIG. 44B is a sectional view of FIG. 42 in a GH direction, and FIG. 45 is a plan view of the base 2210, the sensing coil 2170, and the circuit board 2180. The sensing coil 2170 is shown as being visible in FIG. 45.

Referring to FIGS. 38 to 45, the base 2210 may be coupled to the housing 2140, and may form a receiving space configured to receive the bobbin 2110 and the housing 2140 together with the cover member 2300.

The base 2210 may have an opening 2021 corresponding to the opening of the bobbin 2110 and/or the opening of the housing 2140, and may be configured in a shape coinciding with or corresponding to the shape of the cover member 2300, such as a quadrangular shape.

The base 2210 may be provided at the lower end of the outer surface thereof with a stair 2211, which may be coated with an adhesive when fixing the cover member 2300 by adhesion. In this case, the stair 2211 may guide the cover member 2300 coupled to the upper side thereof, and may be opposite the lower end of the side plate 2302 of the cover member 2300. An adhesive member and/or a sealing member may be disposed or coated between the lower end of the side plate 2302 of the 2210 and the stair 2211 of the base 2210.

The base 2210 may be disposed under the bobbin 2110 and the housing 2140.

For example, the base 2210 may be disposed under the lower elastic member 2160.

The base 2210 may include side portions 2218a to 2218d corresponding to or opposite the side portions 2141-1 to 2141-4 of the housing 2140 and corner portions 2219a to 2219d corresponding to or aligned with the corner portions 2142-1 to 2142-4 of the housing 2140 in the optical-axis (OA) direction.

For example, the side portion 2218a of the base 2210 may include a flat outer surface, and the corner portion 2219a of the base 2210 may include a curved outer surface.

The corner portion (e.g. 2219a) of the base 2210 may connect two adjacent side portions (e.g. 2218a and 2218c) of the base 2210 to each other, and may be located at a corner of the base.

At least one boss 2216a to 2216d protruding toward the housing 2140 may be formed on the upper surface of the base 2210. The at least one boss may be disposed on at least one of the corner portions of the base 2210.

For example, the base 2210 may include bosses 2216a to 2216d protruding from the four corners or corner portions 2219a to 2219d thereof by a predetermined height in the upward direction. Here, the bosses 2216a to 2216d of the base 2210 may also be referred to as "pillar portions" or "guide members."

For example, each of the bosses 2216a to 2216d of the base 2210 may have a multilateral pillar shape protruding from an upper surface 2211a of the base 2210 so as to be perpendicular to the upper surface 2211a of the base 2210. However, the disclosure is not limited thereto.

The bosses 2216a to 2216d of the base 2210 may be inserted, fastened, or coupled to the guide recesses 2148 of the housing 2140 using an adhesive member, such as epoxy or silicone. For example, a recess 2016, in which an adhesive member is coated, may be formed in the upper surface of each of the bosses 2216a to 2216d. In another embodiment, the recess 2016 may be omitted.

In addition, a recess 2247, in which the second coupling portion 2147 of the housing 2140 formed in the shape of a protrusion is seated, inserted, or coupled, may be provided in the upper surface of the base 2210. For example, the recess 2247 may correspond to or may be opposite the second coupling portion 2147 of the housing 2140 in the optical-axis direction, and may be formed in a corner region of the upper surface of the base 2210.

A seating recess 2201 or a recess, in which the sensing coil 2170 is disposed, may be formed in the outer surface of the base 2210.

The seating recess 2201 of the base 2210 may have a structure depressed from the outer surface of the base 2210. The seating recess 2201 of the base 2210 may be formed so as to be spaced apart from each of the upper surface and the lower surface of the base 2210. As a result, the sensing coil 2170 disposed or wound in the seating recess 2201 of the base 2210 may be inhibited from being separated from the base 2210.

For example, the depth of the seating recess 2201 of the base 2210 may be greater than the length of the sensing coil 2170 in a direction perpendicular to the optical axis. However, the disclosure is not limited thereto. In another embodiment, the two may be equal to each other. As a result, the sensing coil 2170 may be inhibited from being separated from the base 2210.

For example, a first length of the sensing coil 2170 disposed in the seating recess 2201 of the base 2210 in the optical-axis direction may be less than a second length of the sensing coil in a direction from the inner circumferential surface to the outer circumferential surface of the base 2210 and perpendicular to the optical axis OA. As a result, it is possible to reduce the height or length of the lens moving apparatus 2100 in the optical-axis direction. In another embodiment, the first length of the sensing coil may be equal to or greater than the second length of the sensing coil.

The seating recess 2201 of the base 2210 may be depressed from the outer surface of the side portion 2218a and the outer surface of the corner portion 2219a, and may have a ring shape.

Referring to FIGS. 38, 44A, 44B, and 45, the seating recess 2201 of the base 2210 may include a first recess 2009A formed in a first outer surface S21 of the base 2210, a second recess 2009B formed in a second outer surface S22 of the base 2210, a third recess 2009C formed in a third outer surface S23 of the base 2210, and a fourth recess 2009D formed in a fourth outer surface S24 of the base 2210.

For example, the first recess 2009A may be formed in the outer surface of the first side portion 2218a of the base 2210, the second recess 2009B may be formed in the outer surface of the second side portion 2218b of the base 2210, the third recess 2009C may be formed in the outer surface of the third side portion 2218c of the base 2210, and the fourth recess 2009D may be formed in the outer surface of the fourth side portion 2218d of the base 2210.

In addition, the seating recess 2201 may further include corner recesses formed in the outer surfaces of the corner portions 2219a to 2219d of the base 2210 in order to dispose the sensing coil 2170 at the corner parts of the base.

For example, the seating recess 2201 of the base 2210 may extend along the outer surfaces S21 to S24 of the base 2210 in a closed-curved shape or a ring shape.

In addition, the base 2210 may include a first portion 2210a or a lower end portion disposed under the seating recess 2201 and a second portion 2210b disposed above the seating recess 2201.

First and second depressed portions 2052a and 2052b, in which the first and second terminals 2081 and 2082 are disposed, may be formed in the outer surface of one 2218a of the side portions of the base 2210.

In addition, third and fourth depressed portions 2052c and 2052d, in which terminals 2164-1 and 2164-2 of the first and second elastic members 2160-1 and 2160-2 are disposed, may be formed in the outer surface of one 2218a of the side portions of the base 2210. For example, the first to fourth depressed portions 2052a to 2052d may be formed in the first portion 2210a and the second portion 2210b of the base 2210.

The first to fourth depressed portions 2052a to 2052d may be formed in the first outer surface S21 of the base 2210. For example, the first to fourth depressed portions 2052a to 2052d may be formed in the outer surface of the first side portion 2218a of the base 2210.

For example, at least one of the first to fourth depressed portions 2052a to 2052d may include an upper opening that is open to the upper surface of the base 2210 and a lower opening that is open to the lower surface of the base 2210.

Referring to FIGS. 35 and 39 to 45, the upper elastic member 2150 and the lower elastic member 2160 are coupled to the bobbin 2110 and to the housing 2140, and flexibly support the bobbin 2110.

For example, the upper elastic member 2150 may be coupled to the upper portion (or the upper surface or the upper end) of the bobbin 2110 and/or to the upper portion (or the upper surface or the upper end) of the housing 2140.

The lower elastic member 2160 may be coupled to the lower portion (or the lower surface or the lower end) of the bobbin 2110 and/or to the upper portion (or the lower surface or the lower end) of the housing 2140.

In FIG. 35, the upper elastic member 2150 is not divided into a plurality of parts. However, the disclosure is not limited thereto. In another embodiment, the upper elastic member 2150 may include a plurality of elastic members spaced apart from each other.

Referring to FIG. 35, the upper elastic member 2150 may include a first inner frame 2151 coupled to the upper portion of the bobbin 2110, a first outer frame 2152 coupled to the upper portion of the housing 2140, and a first frame connection portion 1153 configured to connect the first inner frame 2151 and the first outer frame 2152 to each other. In the following description, the inner frame may also be referred to as an "inner portion," the outer frame may also be referred to as an "outer portion," and the frame connection portion may also be referred to as a "connection portion."

A hole 2151a, to which the first coupling portion 2113 of the bobbin 2110 is coupled, may be provided in the first inner frame 2151 of the upper elastic member 2150, and a hole 2152a, to which the first coupling portion 2144 of the housing 2140 is coupled, may be provided in the first outer frame 2152.

Referring to FIG. 38, the lower elastic member 2160 may include a plurality of divided or separated elastic members, for example two or more elastic members, and may be coupled to the bobbin 2110. For example, the elastic members may also be referred to as "elastic units" or "springs."

For example, the lower elastic member 2160 may include first and second elastic members 2160-1 and 2160-2 spaced apart from each other, and the first and second elastic members 2160-1 and 2160-2 may be separated from each other.

The coil 2120 may be connected to the first and second elastic members 2160-1 and 2160-2. For example, one end (or the first end) of the coil 2120 may be coupled to the first elastic member 2160-1, and the other end (or the second end) of the coil 2120 may be coupled to the second elastic member 2160-2, by soldering or using a conductive adhesive.

Each of the first and second elastic members 2160-1 and 2160-2 may include a second inner frame 2161 coupled to the lower portion of the bobbin 2110, a second outer frame 2162 coupled to the lower portion of the housing 2140, and a second frame connection portion 2163 configured to connect the second inner frame 2161 and the second outer frame 2162 to each other.

A hole 2161a, to which the second coupling portion 2117 of the bobbin 2110 is coupled, may be provided in the second inner frame 2161 of the lower elastic member 2160, and a hole 2162a, to which the second coupling portion 2147 of the housing 2140 is coupled, may be provided in the second outer frame 2162.

For example, a first bonding portion (or a "first boding region") 2015a, to which one end of the coil 2120 is coupled, may be provided at one end of the second inner frame 2161 of the first elastic member 2160-1, and a second bonding portion (or a "second boding region") 2015b, to which the other end of the coil 2120 is coupled, may be provided at one end of the second inner frame 2161 of the second elastic member 2160-2.

For example, one end of the coil 2120 may be coupled to the first bonding portion 2015a of the inner frame 2161 of the first elastic member 2160-1, and the other end of the coil 2120 may be coupled to the second bonding portion 2015b of the inner frame 2161 of the second elastic member 2160-2, by soldering or using a conductive adhesive member.

The reason that the first and second bonding portions 2015a and 2015b are provided at the second inner frame 2161 is that, since the second inner frame 2161 is closer to the bobbin 2110 than the second outer frame 2162, bonding with the coil 2120 can be more easily performed.

For example, guide recesses 2003a configured to guide one end and the other end of the coil 2120 may be provided in the first and second bonding portions 2015a and 2015b.

For the first and second bonding portions 2015a and 2015b, the "bonding portions" may also be referred to as pad portions, connection terminal portions, solder portions, or electrode portions.

Each of the upper elastic member 2150 and the lower elastic member 2160 may be realized as a leaf spring; however, the disclosure is not limited thereto. Each elastic member may be realized as a coil spring or a suspension wire.

Each of the first and second frame connection portions 2153 and 2163 may be formed so as to be bent or curved at least once in order to form a predetermined pattern. Upward and/or downward movement of the bobbin 2110 in the first direction may be flexibly (or elastically) supported through displacement and microscopic deformation of the first and second frame connection portions 2153 and 2163.

For example, in order to prevent an oscillation phenomenon when the bobbin 2110 is moved, a damper may be disposed between the first frame connection portion 2153 of the upper elastic member 2150 and the upper surface of the bobbin 2110 (e.g. the first escape recess 2112a).

Alternatively, a damper (not shown) may also be disposed between the second frame connection portion 2163 of the lower elastic member 2160 and the lower surface of the bobbin 2110 (e.g. the second escape recess 2112b).

Alternatively, for example, a damper may be coated on a coupling portion between the upper elastic member 2150 and each of the bobbin 2110 and the housing 2140 or on a coupling portion between the lower elastic member 2160 and each of the bobbin 2110 and the housing 2140. For example, the damper may be gel-type silicone.

For example, the first and second elastic members 2160-1 and 2160-2 may be separated or spaced apart from each other at the first side portion 2141-1 and the second side portion 2141-2 of the housing 2140. However, the disclosure is not limited thereto.

The first elastic member 2160-1 may include a first terminal 2164-1 connected to the outer surface of the second outer frame 2162 of the first elastic member 2160-1, bent from the second outer frame 2162 of the first elastic member 2160-1 in a direction toward the base 2210, and extending toward the base.

In addition, the second elastic member 2160-2 may include a second terminal 2164-2 connected to the outer surface of the second outer frame 2162 of the second elastic member 2160-2, bent from the second outer frame 2162 of the second elastic member 2160-2 in a direction toward the base 1210, and extending toward the base.

For example, the first terminal 2164-1 of the first elastic member 2160-1 may extend or may be bent from the second outer frame 2162 of the first elastic member 2160-1 to the first outer surface S21 of the base 2210 or to the outer surface of the first side portion 2218a of the base 2210.

In addition, the second terminal 2164-2 of the second elastic member 2160-2 may extend from the second outer frame 2162 of the second elastic member 2160-2 to the first outer S21 surface of the base 2210 or to the outer surface of the first side portion 2218a of the base 2210.

For example, the first and second terminals 2164-1 and 2164-2 of the first and second elastic members 2160-1 and 2160-2 may be disposed on the first outer surface S21 of the base 2210 (or the outer surface of the first side portion 2218a) so as to be spaced apart from each other. The first and second terminals 2164-1 and 2164-2 of the first and second elastic members 2160-1 and 2160-2 may be spaced apart from the first outer surface S21 of the base 2210. However, the disclosure is not limited thereto. The first and second terminals may abut the first outer surface S21.

For example, the first terminal 2164-1 of the first elastic member 2160-1 may be disposed, seated, or inserted in the third depressed portion 2052c of the base 2210. In addition, the second terminal 2164-2 of the second elastic member 2160-2 may be disposed, seated, or inserted in the fourth depressed portion 2052d of the base 2210. Here, the terminal 2164-1 or 2164-2 may also be referred to as a "connection terminal," a "coupling terminal," an "extension portion," a "pad portion," a "bonding portion," a "solder portion," or an "electrode portion," and the depressed portion 2052c or 2052d may also be referred to as a "recess."

The first and second terminals 2164-1 and 2164-2 of the first and second elastic members 2160-1 and 2160-2 may be exposed from the base 2210, and the first and second terminals 2164-1 and 2164-2 may be separated from each other.

For example, the inner surface of the first terminal 2164-1 of the first elastic member 2160-1 disposed in the third depressed portion 2052c of the base 2210 may be opposite one surface (e.g. the bottom surface) of the third depressed portion 2052c, and the outer surface of the first terminal 2164-1 of the first elastic member 2160-1 may be exposed from the first outer surface S21 of the base 2210. The outer surface of the first terminal 2164-1 of the first elastic member 2160-1 may be the surface opposite the inner surface of the first terminal 2164-1.

In addition, the inner surface of the second terminal 2164-2 of the second elastic member 2160-2 disposed in the fourth depressed portion 2052d of the base 2210 may be opposite one surface (e.g. the bottom surface) of the fourth depressed portion 2052d, and the outer surface of the second terminal 2164-2 of the second elastic member 2160-2 may be exposed from the first outer surface of the base 2210. The outer surface of the second terminal 2164-2 of the second elastic member 2160-2 may be the surface opposite the inner surface of the second terminal 2164-2.

For example, the lower end of each of the first and second terminals 2164-1 and 2164-2 of the lower elastic member 2160 may be exposed from the lower surface of the base 2210. However, the disclosure is not limited thereto. In another embodiment, the lower end of each of the first and second terminals 2164-1 and 2164-2 of the lower elastic member 2160 may not be exposed from the lower surface of the base 2210.

The depth of the third and fourth depressed portions 2052c and 2052d may be greater than the thickness of the terminals 2164-1 and 2164-2 of the lower elastic member 2160, and the outer surfaces of the terminals 2164-1 and 2164-2 of the lower elastic member 2160 disposed in the third and fourth depressed portions 2052c and 2052d may not protrude out of the depressed portions 2052c and 2052d. However, the disclosure is not limited thereto. In another embodiment, the outer surfaces of the terminals 2164-1 and 2164-2 of the lower elastic member 2160 may protrude out of the depressed portions 2052c and 2052d.

Referring to FIGS. 38 and 42, the first elastic member 2160-1 and the second elastic member 2160-2 may be disposed so as to be opposite each other in the first-axis direction (e.g. the X-axis direction).

For example, the first elastic member 2160-1 may be disposed on one side of the first side portion 2218a of the base 2210, the first corner portion of the base 2210, the third side portion 2218c of the base 2210, the fourth corner portion 2219d of the base 2210, and one side of the second side portion 2218b of the base 2210.

For example, the second side portion 2218b of the base 2210 may be opposite the first side portion 2218a of the base 2210 in the second-axis direction (e.g. the Y-axis direction), the third side portion 2218c of the base 2210 may be disposed between the first side portion 2218a and the second side portion 2218b of the base 2210, the first corner portion 2219a of the base 1210 may connect the first side portion 2218a and the third side portion 2218c of the base 2210 to each other, and the third corner portion 2219c of the base 2210 may connect the second side portion 2218b of the base 2210 and the fourth side portion 2218d of the base 2210 to each other. The second-axis direction may be perpendicular to the first-axis direction.

For example, the second elastic member 2160-2 may be disposed on the other side of the first side portion 2218a of the base 2210, the second corner portion 2219b of the base 2210, the fourth side portion 2218d of the base 2210, the third corner portion 2219c of the base 2210, and the other side of the second side portion 2218b of the base 2210.

For example, the fourth side portion 2218d of the base 2210 may be opposite the third side portion 2218c of the base 2210 in the first-axis (X-axis) direction, the second corner portion 2219b of the base 2210 may connect the first side portion 2218a of the base 2210 and the fourth side portion 2218d of the base 2210 to each other, and the fourth corner portion 2219d of the base 2210 may connect the second side portion 2218b of the base 2210 and the third side portion 2218c of the base 2210 to each other.

For example, the first and second terminals 2164-1 and 2164-2 of the lower elastic member 2160 and the circuit board 2180 may be disposed on the first side portion 2218a of the base 2210.

For example, the circuit board 2180 may include a portion 2008b1 disposed on the first outer surface S21 of the base 2210 or the outer surface of the first side portion 2218a of the base 2210.

The circuit board 2180 may include a portion 2008c1 disposed so as to extend to the first corner portion 2219a of the base 2210. In addition, the circuit board 2180 may include a portion 2008c2 disposed so as to extend to the second corner portion 2219b of the base 2210.

The first and second terminals 2164-1 and 2164-2 of the lower elastic member 2160 may be connected to external wires or external elements using a conductive adhesive member (e.g. solder) such that power or a driving signal is received from the outside.

In the case in which the solder bonded to the first and second terminals 2164-1 and 2164-2 of the lower elastic member 2160 protrudes out of the outer surface of the base 2210, contact or collision between the solder bonded to the first and second terminals 2164-1 and 2164-2 of the lower elastic member 2160 and the cover member 2300 may be prevented, whereby electrical short circuit or open circuit may occur. In the embodiment, the depth of the depressed portions 2052c and 2052d is sufficiently secured such that the solder bonded to the first and second terminals 2164-1 and 2164-2 of the lower elastic member 2160 does not protrude out of the outer surface of the base 2210, whereby it is possible to prevent the occurrence of electrical short circuit or open circuit.

In addition, the first and second terminals 2164-1 and 2164-2 of the lower elastic member 2160 may be disposed on the second outer frames 2162 of the first and second elastic members 2160-1 and 2160-2 disposed under the first side portion 2141-1 of the housing 2140 and/or the corner portions 2142-1 and 2142-2 of the housing 2140 adjacent to the first side portion 2141-1.

The first and second terminals 2164-1 and 2164-2 of the first and second elastic members 2160-1 and 2160-2 may be connected to the coil 2120, and power or a driving signal for driving the coil 2120 may be provided to the first and second terminals 2164-1 and 2164-2 of the first and second elastic members 2160-1 and 2160-2.

In FIG. 39, the first terminal 2164-1 of the lower elastic member 2160 is formed integrally with the first elastic member 2160-1, and the second terminal 2164-2 of the lower elastic member 2160 is formed integrally with the second elastic member 2160-2. However, the disclosure is not limited thereto. In another embodiment, a separate first terminal may be formed independently of the first elastic member and disposed on the first outer surface S21 of the base 2210, a separate second terminal may be formed independently of the second elastic member and disposed on the first outer surface S21 of the base 2210, the first elastic member (e.g. the second outer frame) and the separate first terminal may be connected to each other using a conductive adhesive (e.g. solder), and the second elastic member (e.g. the second outer frame) and the separate second terminal may be connected to each other using a conductive adhesive (e.g. solder).

Next, the circuit board 2180 will be described.

Referring to FIGS. 40A to 42, the circuit board 2180 may be disposed on the base 2210, may be coupled or connected to the base 2210, or may be supported by the base 2210. For example, the circuit board 2180 may be disposed on the first side portion 2218a of the base 2210. Alternatively, for example, the circuit board 2180 may be disposed on the first side portion 2218a, the first corner portion 2219a, and the second corner portion 2219b of the base 2210.

In addition, the circuit board 2180 may include portions 2008b1, 2009a1, and 2009a2 disposed on the first outer surface S21 of the base 2210.

The circuit board 2180 may be a printed circuit board (PCB) or a flexible printed circuit board (FPCB).

Referring to FIG. 40A, the circuit board 2180 may include a body 2010A and an extension portion 2010B. The body 2010A may include first and second pads P1 and P2, to which the sensing coil 2170 is connected, and first and second terminals 2081 and 2082, which are terminals for connection with the outside. Each of the first and second pads P1 and P2 may be connected to a corresponding one of the first and second terminals 2081 and 2082. For example, a circuit pattern or wiring configured to connect the first and second pads P1 and P2 and the first and second terminals 2081 and 2082 to each other may be formed at the body 2010A of the circuit board 2180.

For example, the circuit board 2180 may include a body 2010A disposed on the first side portion 2218a of the base 2210 and an extension portion 2010B extending from the body 2010A.

A portion 2008a1 of the body 2010A of the circuit board 2180 may be exposed from the upper surface of the base 2210, and may include first and second pads P1 and P2.

In addition, another portion 2008b1 of the body 2010A may be bent from a portion of the body 2010A to the first outer surface S21 of the base 2210 or the outer surface of the first side portion 2218a of the base 2210, and at least a region of the other portion 2008b1 of the body 2010A may be exposed to the outer surface of the first side portion 2218a or the first outer surface S21 of the base 2210. In addition, the other portion 2008b1 of the body 2010A may include first and second pads P1 and P2.

In addition, the extension portion 2010B may extend from the other portion 2008b1 of the body 2010A of the circuit board 2180 toward the corner portion 2219a and/or 2219b of the base 2210.

The body 2010A of the circuit board 2180 may include a first portion 2008a1 and a second portion 2008b1.

The first portion 2008a1 of the body 2010A may be exposed from the upper surface of the base 2210.

In another embodiment, at least a portion of the first portion 2008a1 of the body 2010A may not be exposed from the upper surface of the base 2210, and may be disposed in the base 2210.

The second portion 2008b1 of the body 2010A may be connected to one end of the first portion 2008a1, and may be bent from one end of the first portion 2008a1 in a direction toward the lower surface of the base 2210 or toward the first outer surface S21 of the base 2210.

For example, the second portion 2008b1 of the body 2010A may be bent and may extend toward the first outer surface S21 of the base 2210 or the outer surface of the first side portion 2218a of the base 2210.

The first and second terminals 2081 and 2082 may be provided at the second portion 2008b1 of the body 2010A. For example, the first and second terminals 2081 and 2082 of the circuit board 2180 may be disposed on the first outer surface S21 of the base 2210 or the outer surface of the first side portion 2218a of the base 2210.

For example, the body 2010A may include a bent portion 2008c1 configured to connect the first portion 2008a1 and the second portion 2008b1 to each other. In FIG. 40A, the bent portion 2008c1 may be angled. However, the disclosure is not limited thereto. In another embodiment, the bent portion may be round.

For example, the interior angle between the first portion 2008a1 and the second portion 2008b1 may be a right angle. However, the disclosure is not limited thereto. In another embodiment, the interior angle may be an acute angle or an obtuse angle.

For example, the second portion 2008b1 of the body 2010A may be bent and extend from a region of the first portion 2008a1 in the downward direction.

The body 2010A may include an extension portion 2008d1 extending from one side of the first portion 2008a1 in a direction toward the first corner portion 2219a of the base 2210, and may include an extension portion 2008d2 extending from the other side of the first portion 2008a1 in a direction toward the second corner portion 2219b of the base 2210. For example, the extension portions 2008d1 and 2008d2 of the first portion 2008a1 may extend in opposite directions.

The extension portions 2008d1 and 2008d2 of the first portion 2008a1 may be exposed from the upper surface of the base 2210.

For example, the extension portions 2008d1 and 2008d2 of the first portion 2008a1 may be disposed on the upper surface of the first side portion 2218a of the base 2210. However, the disclosure is not limited thereto. In another embodiment, the extension portions 2008d1 and 2008d2 may be disposed on the upper surface of the first side portion 2218a of the base 2210 and the upper surfaces of the first and second corner portions 2219a and 2219b.

The first and second pads P1 and P2 may be provided at the first portion 2008a1 of the body 2010A of the circuit board 2180. For example, the first and second pads P1 and P2 may be disposed on the upper surface of the first side portion 2218a of the base 2210.

For example, the first pad P1 may be disposed on the extension portion 2008d1 of the first portion 2008a1 of the body 2010A, and the second pad P2 may be disposed on the extension portion 2008d2 of the first portion 2008a1 of the body 2010A.

One end of the sensing coil 2170 may be coupled to the first pad P1 of the circuit board 2180, and the other end of the sensing coil 2170 may be coupled to the second pad P2 of the circuit board 2180, by soldering or using a conductive adhesive member.

At least one through-hole 2037A and 2037B, to which the base 2210 is coupled, may be formed in the first portion 2008a1 of the body 2010A of the circuit board 2180.

For example, the body 2010A may be provided with through-holes 2037A and 2037B formed through the extension portions 2008d1 and 2008d2 of the first portion 2008a1. The through-holes 2037A and 2037B may be coupled to protrusions 2022a and 2022b formed on the first side portion 2218a of the base 2210.

In another embodiment, each of the first and second terminals 2081 and 2082 may be provided with a recess-shaped coupling portion for coupling with the base 2210 instead of a corresponding one of the first and second through-holes 2037A and 2037B.

The extension portions 2009a1 and 2009a2 of the circuit board 2180 may extend to the second portion 2008b1 of the body 2010A, and may be disposed on the first outer surface S21 of the base 2210 or the outer surface of the first side portion 2218a of the base 2210.

Referring to FIG. 42, at least a portion of each of the extension portions 2009a1 and 2009a2 of the circuit board 2180 may be disposed between a corresponding one of the first and second terminals 2164-1 and 2164-2 of the lower elastic member 2160 and the first portion 2170-1 of the sensing coil 2170 disposed on the outer surface of the first side portion 2218a (or the first outer surface S21) of the base 2210.

Neither a circuit pattern nor wiring may be formed at the extension portions 2009a1 and 2009a2 of the circuit board 2180, and the extension portions serve to prevent the first and second terminals 2164-1 and 2164-2 of the lower elastic member 2160 and the first portion 2170-1 of the sensing coil 2170 from contacting each other. As a result, it is possible to prevent the occurrence of electrical short circuit between the first and second terminals 2164-1 and 2164-2 of the lower elastic member 2160 and the sensing coil 2170.

That is, the extension portions 2009a1 and 2009a2 may be an insulating portion configured to insulate the first and second terminals 2164-1 and 2164-2 of the lower elastic member 2160 and the first portion 2170-1 of the sensing coil 2170 from each other. Consequently, each of the extension portions 2009a1 and 2009a2 may be made of an insulating material.

At least a portion of each of the extension portions 2009a1 and 2009a2 of the circuit board 2180 may be disposed in the recess 2201 of the base 2210. In this case, it is possible to increase force of coupling between the extension portions 2009a1 and 2009a2 and the base 2210, and to inhibit movement of the extension portions 2009a1 and 2009a2 due to impact.

In another embodiment, the extension portions 2009a1 and 2009a2 of the circuit board 2180 may not be disposed in the recess 2201 of the base 2210 but may be disposed on the first outer surface S21 of the base 2210 so as to cover a portion of the recess 2201 of the base 2210 or a portion of the first recess 2009A.

The length H1 (see FIG. 40A) of the extension portions 2009a1 and 2009a2 of the circuit board 2180 in the optical-axis direction may be equal to or less than the length H2 of the first recess 2009A of the base 2210 in the optical-axis direction (H1≤H2). Alternatively, in another embodiment, the length of the extension portions 2009a1 and 2009a2 of the circuit board 2180 in the optical-axis direction may be greater than the length of the first recess 2009A of the base 2210 in the optical-axis direction.

For example, the extension portions 2009a1 and 2009a2 of the circuit board 2180 may be disposed in the first recess 2009A of the base 2210, or may be disposed outside the first portion 2170-1 of the sensing coil 2170.

The extension portions 2009a1 and 2009a2 of the circuit board 2180 may overlap the sensing coil 2170 and the first and second terminals 2164-1 and 2164-2 of the first and second elastic members 2160-1 and 2160-2 in a direction perpendicular to the optical axis.

For example, the extension portions 2009a1 and 2009a2 of the circuit board 2180 may be located lower than the upper surface of the base 2210 and higher than the lower surface of the base 2210.

In addition, for example, the extension portions 2009a1 and 2009a2 of the circuit board 2180 may be located lower than the upper ends of the first and second terminals 2164-1 and 2164-2 of the first and second elastic members 2160-1 and 2160-2 and higher than the lower surfaces of the first and second terminals 2164-1 and 2164-2. Here, the upper ends of the first and second terminals 2164-1 and 2164-2 may be portions that abut the second outer frames 2162 of the first and second elastic members 2160-1 and 2160-2.

Each of the extension portions 2009a1 and 2009a2 may include a first region Q11 disposed between the first portion 2170-1 of the sensing coil 2170 and a corresponding one of the first and second terminals 2164-1 and 2164-2 of the first and second elastic members 2160-1 and 2160-2, a second region Q12 configured to connect one side of the first region Q11 and the second portion 2008b1 of the body 2010A of the circuit board 2180 to each other, and a third region Q13 extending from the other side of the first region Q11.

For example, the first regions Q11 of the extension portions 2009a1 and 2009a2 may overlap the first portion 2170-1 of the second coil 2170 and the first and second terminals 2164-1 and 2164-2 of the first and second elastic members 2160-1 and 2160-2 in the first horizontal direction.

For example, the first horizontal direction (e.g. the Y-axis direction) may be a direction perpendicular to the optical axis and perpendicular to the first outer surface S21 of the base 2210 or a direction perpendicular to the optical axis OA and from the first outer surface S21 to the second outer surface S22 of the base 2210.

In addition, for example, the second region Q12 and the third region Q13 of the extension portions 2009a1 and 2009a2 may not overlap the first and second terminals 2164-1 and 2164-2 of the first and second elastic members 2160-1 and 2160-2 in the first horizontal direction.

The length of each of the extension portions 2009a1 and 2009a2 in the second horizontal direction (e.g. the X-axis direction) may be greater than the length of a corresponding one of the first and second terminals 2164-1 and 2164-2 of the first and second elastic members 2160-1 and 2160-2 in the second horizontal direction. However, the disclosure is not limited thereto.

For example, the second horizontal direction may be a direction perpendicular to the optical axis and parallel to the first outer surface S21 of the base 2210 or a direction perpendicular to the optical axis OA and from the third outer surface S23 to the fourth outer surface S24 of the base 2210. Alternatively, the second horizontal direction may be a direction perpendicular to the first horizontal direction.

The circuit board 2180 may include a first extension portion 2009a1 extending from one side of the second portion 2008b1 of the body 2010A and a second extension portion 2009a2 extending from the other side of the second portion 2008b1 of the body 2010A.

For example, the first extension portion 2009a1 may extend from one side of the second portion 2008b1 of the body 2010A to the first corner portion 2219a of the base 2210, and the second extension portion 2009a2 may extend from the other side of the second portion 2008b1 of the body 2010A to the second corner portion 2219b of the base 2210. For example, the first extension portion 2009a1 and the second extension portion 2009a2 may extend in opposite directions based on the body 2010A. However, the disclosure is not limited thereto.

For example, the first extension portion 2009a1 and the second extension portion 2009a2 may have shapes symmetric with respect to the body 2010A. However, the disclosure is not limited thereto. In addition, the first extension portion 2009a1 and the second extension portion 2009a2 may be disposed so as to be symmetric with respect to the body 2010A. However, the disclosure is not limited thereto.

The first and second terminals 2164-1 and 2164-2 of the elastic member 2160 may be disposed on opposite sides of the first side portion 2218a of the base 2210. The first and second terminals 2081 and 2082 of the circuit board 2180 may be disposed on the outer surface of the first side portion 2218a of the base 2210, and may be disposed between the first and second terminals 2164-1 and 2164-2 of the lower elastic member 2160.

A description of FIG. 18 is applicable or adaptable to the embodiment 2100 of FIG. 34. That is, the first and second terminals 2164-1 and 2164-2 of the elastic member 2160 and the first and second terminals 2081 and 2082 of the circuit board 2180 may be located inside a reference line. Here, the reference line may be the reference line 207 of FIG. 18.

In addition, the first portion 2008a1 of the circuit board 2180 and the extension portions 2008d1 and 2008d2 of the first portion 2008a1 may be located at the upper side of the sensing coil 2170.

Referring to FIGS. 38 and 42, the outer frames 2162 of the first and second elastic members 2160-1 and 2160-2 may be disposed on a first surface 2018a of the upper surface of the base 2210, and the first portion 2008a1 of the circuit board 2180 and the extension portions 2008d1 and 2008d2 of the first portion 2008a1 may be disposed on a second surface 2018b of the upper surface of the base 2210.

The first surface 2018a and the second surface 2018b of the upper surface of the base 2210 may have a stair DP in the optical-axis direction. For example, the first surface 2018a of the upper surface of the base 2210 may be located higher than the second surface 2018b. For example, the height of the first surface 2018a of the upper surface of the base 2210 may be greater than the height of the second surface 2018b based on the lower surface of the base 2210.

For example, the first portion 2008a1 of the circuit board 2180 and the extension portions 2008d1 and 2008d2 of the first portion 2008a1 may be located lower than the upper surfaces of the outer frames 2162 of the first and second elastic members 2160-1 and 2160-2. As a result, it is possible to avoid spatial interference therebetween and to prevent electrical short circuit therebetween due to soldering.

In addition, the first portion 2008a1 and the first and second extension portions 2008d1 and 2008d2 of the circuit board 2180 may not overlap the sensing coil 2170 (or a ring-shaped portion of the sensing coil 2170) in a direction perpendicular to the optical axis.

In addition, at least one of the first portion 2008a1 and the first and second extension portions 2008d1 and 2008d2 of the circuit board 2180 may overlap the sensing coil 2170 (or the ring-shaped portion of the sensing coil 2170) in the optical-axis direction. However, the disclosure is not limited thereto. In another embodiment, at least one of the first portion 2008a1 and the first and second extension portions 2008d1 and 2008d2 of the circuit board 2180 may not overlap the sensing coil 2170 (or the ring-shaped portion of the sensing coil 2170) in the optical-axis direction.

In addition, the first and second terminals 2164-1 and 2164-2 of the lower elastic member 2160 and the first and second terminals 2081 and 2082 of the circuit board 2180 may not overlap the sensing coil 2170 (or the ring-shaped portion of the sensing coil 2170) in the optical-axis direction.

For example, the second portion 2008b1 of the circuit board 2180 and the first and second terminals 2164-1 and 2164-2 of the lower elastic member 2160 may be located outside the sensing coil 2170. Here, the outside of the sensing coil 2170 may be the side opposite the side at which the center A1 of the base 2210 is located based on the second coil 2170.

In addition, for the first and second terminals 2081 and 2082, the terminals may also be referred to as "pads," "pad portions," "connection terminal portions," "solder portions," or "electrode portions."

The first terminal 2164-1 of the first elastic member 2160-1, the second terminal 2164-2 of the second elastic member 2160-2, and the second portion 2008b1 of the circuit board 2180 may be disposed on one side portion (e.g. 2218a) of the base 2210 or one outer surface (e.g. S21) of the base 2210. Consequently, at the time of soldering for connection between the first and second terminals 2164-1 and 2164-2 of the lower elastic member 2160, the first and second terminals 2081 and 2082 of the circuit board 2180, and an external device (e.g. a circuit board), soldering work may be easily and simply performed.

For example, the first and second terminals 2081 and 2082 of the circuit board 2180 may be disposed or arranged in a space between the first terminal 2164-1 and the second terminal 2164-2 of the lower elastic member 2160.

For example, when the first outer surface S21 of the base 2210 is viewed from the front, the first terminal 2164-1 of the first elastic member 2160-1, the first terminal 2081 of the circuit board 2180, the second terminal 2082 of the circuit board 2180, and the second terminal 2164-2 of the second elastic member 2160-2 may be sequentially disposed in a direction from the first corner portion 2219a to the second corner portion 2219b of the base 2210. However, the disclosure is not limited thereto. In another embodiment, arrangement may be performed in order different from the above order.

Next, the cover member 2300 will be described.

The cover member 2300 receives the bobbin 2110, the coil 2120, the magnet 2130, the housing 2140, the upper elastic member 2150, the lower elastic member 2160, the sensing coil 2170, and the circuit board 2180 in a receiving space formed together with the base 2210.

The cover member 2300 may be formed in the shape of a box, the lower portion of which is open and which includes an upper plate 2301 and side plates 2302. The lower ends of the side plates 2302 of the cover member 2300 may be coupled to stairs 2211 of the base 2210. When viewed from above, the shape of the upper plate 2301 of the cover member 2300 may be polygonal, for example, quadrangular or octagonal.

The cover member 2300 may be provided in the upper plate 2301 thereof with an opening (or a hollow portion), through which a lens (not shown) coupled to the bobbin 2110 is exposed to external light.

The cover member 2300 may be made of a nonmagnetic material, such as SUS, in order to prevent a phenomenon in which the magnet 2130 attracts the cover member. Alternatively, the cover member may be made of a magnetic material so as to perform the function of a yoke.

The cover member 2300 may be provided with at least one boss 2303 extending from a region adjacent to the opening formed in the upper plate 2301 in a direction toward the upper surface of the bobbin 2110.

The at least one boss 2303 of the cover member 2300 may be disposed or inserted in a recess 2119 provided in the upper surface of the bobbin 2110. At the time of AF driving, the boss 2303 of the cover member 2300 may abut the bottom surface of the recess 2119 of the bobbin 2110. As a result, the boss 2303 may serve as a stopper configured to limit upward movement of the bobbin 2110 within a predetermined range. A description of the boss 2303 of the cover member 2300 is applicable to the cover member 300 or 1300, and a description of the recess 2119 of the bobbin 2110 is applicable to the bobbin 110 or 1110.

Alternatively, in another embodiment in which the magnet is disposed on the corner portion of the housing, the at least one boss of the cover member 2300 may perform the function of a yoke.

Next, the sensing coil 2170 will be described.

The sensing coil 2170 may be disposed under the lower elastic member 2160, and may be disposed on the base 2210.

For example, the sensing coil 2170 may be disposed so as to be wound around the outer surface of the base 2210 in the clockwise direction or the counterclockwise direction based on the optical axis OA. The sensing coil 2170 is configured to sense displacement of the AF operation unit, and the coil 2120 and the sensing coil 2170 may constitute a "sensing unit" configured to sense displacement of the AF operation unit.

For example, the sensing coil 2170 may be disposed in the seating recess 2201 provided in the outer surface of the base 2210. For example, the sensing coil 2170 may be disposed between the upper surface and the lower surface of the base 2210.

For example, the sensing coil 2170 may be disposed so as to be spaced apart from the first and second terminals 2164-1 and 2164-2 of the lower elastic member 2160 and the first and second terminals 2081 and 2082 of the circuit board 2180.

In addition, for example, the sensing coil 2170 may be spaced apart from the circuit board 2180, and may be spaced apart from the cover member 2300. However, the disclosure is not limited thereto. In another embodiment, the sensing coil 2170 may contact the circuit board 2180

The circuit board 2180 may be spaced apart from the cover member 2300. However, the disclosure is not limited thereto. In another embodiment, the circuit board 2180 and the cover member 2300 may contact each other. Alternatively, an adhesive member or a shielding member may be disposed between the circuit board 2180 and the cover member 2300 or between the circuit board 2180 and the sensing coil 2170.

The sensing coil 2170 may generate induced voltage due to mutual induction with the coil 2120.

For example, at least a portion of the ring portion of the sensing coil 2170 may overlap the ring portion of the coil 2120 in the optical-axis direction. However, the disclosure is not limited thereto. In another embodiment, the ring portion of the sensing coil may not overlap the ring portion of the coil 2120 in the optical-axis direction.

The sensing coil 2170 may have a closed-curved shape, such as a ring shape, wrapping the outer surface of the base 2210. For example, the sensing coil 2170 may have a ring shape wound so as to be rotated in the clockwise direction or the counterclockwise direction based on the optical axis OA.

At least a portion of the sensing coil 2170 may overlap the magnet 2130 in the optical-axis direction. However, the disclosure is not limited thereto. In another embodiment, the two may not overlap each other in the optical-axis direction.

The sensing coil 2170 may be an induction coil configured to sense the position or displacement of the AF operation unit, e.g. the bobbin 2110. For example, the sensing coil 2170 may be a wire. However, the disclosure is not limited thereto. In another embodiment, the sensing coil may be an FPCB or a fine pattern (FP) coil.

For example, when the AF operation unit is moved due to interaction between the coil 2120 to which a driving signal is provided and the magnet 2130, induced voltage (or induced current) due to interaction between the coil 2120 and the sensing coil 2170 may be generated. The magnitude of the induced voltage (or the induced current) may be based on displacement of the AF operation unit, and the induced voltage (or the induced current) of the sensing coil 2170 may be output through the first terminal 2081 and the second terminal 2082 of the circuit board 2180.

The controller 410 of the camera module 200 or the controller 780 of an optical instrument 200A may sense displacement of the AF operation unit using the induced voltage (or the induced current) provided through the first and second terminals 2081 and 2082 of the circuit board 2180 of the lens moving apparatus 2100.

The coil 2120 may be connected to the first and second elastic members 2160-1 and 2160-2 in order to receive a driving signal or power through the first and second terminals 2164-1 and 2164-2 of the first and second elastic members 2160-1 and 2160-2.

Also, in order to prevent a decrease in output and to reduce the effect due to noise, the sensing coil 2170 may be connected to the first and second pads P1 and P2 of the circuit board 2180, and may output the induced voltage (or the induced current) through the first and second terminals 2081 and 2082 of the circuit board 2180. The reason for this is that resistance of each of the first and second terminals 2081 and 2082 of the circuit board 2180 may be lower than resistance of a corresponding one of the first and second elastic members 2160-1 and 2160-2 and that an electrical signal transmission path of the circuit board 2180 is shorter than that of the first and second elastic members 2160-1 and 2160-2.

In another embodiment, the sensing coil 2170 may be connected to the first and second elastic members 2160-1 and 2160-2, induced voltage (or induced current) of the sensing coil 2170 may be output through the first and second terminals 2164-1 and 2164-2 of the first and second elastic members 2160-1 and 2160-2, the coil 2120 may be connected to the first and second pads P1 and P2 of the circuit board 2180, and a driving signal or power may be provided to the coil 2120 through the first and second terminals 2081 and 2082 of the circuit board 2180.

Figure 40B:
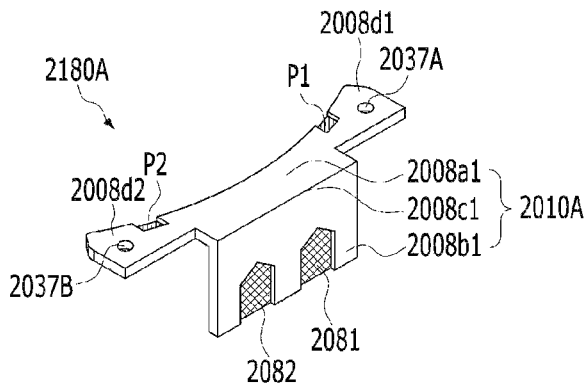
FIG. 40B is a perspective view of a circuit board according to another embodiment.

FIG. 40B is a perspective view of a circuit board 2180A according to another embodiment.

Reference numerals identical to those of FIG. 40A denote the same components, and a description of the same components will be briefly given or omitted.

The circuit board 2180A of FIG. 40B may have a structure in which the first and second extension portions 2009a1 and 2009a2 are omitted from the circuit board 2180 of FIG. 40A.

Since the circuit board 2180A is coated with an insulating material excluding the first and second pads P1 and P2 coupled to the sensing coil 2170 or the coil 2120 by soldering or using a conductive adhesive member and the first and second terminals 2081 and 2082 for connection with the outside, as shown in FIG. 40B, it is possible to prevent the occurrence of electrical short circuit with the lower elastic member 2160. This effect is equally applicable to the circuit board 2180 according to the embodiment of FIG. 40A.

In FIG. 45, the center A1 of the base 2210 and the center A2 of the sensing coil 2170 disposed on the base 2210 are shown.

Referring to FIGS. 44A and 45, the center A2 of the ring portion of the sensing coil 2170 may be aligned with the center A1 of the base 2210. However, the disclosure is not limited thereto.

The first outer surface S21 of the base 2210 may be an outer surface between a first corner 2007A of the outer surface of the first corner portion 2216a of the base 2210 and a second corner 2007B of the outer surface of the second corner portion 2216b of the base 2210.

The second outer surface S22 of the base 2210 may be an outer surface between a third corner 2007C of the outer surface of the third corner portion 2219c of the base 2210 and a fourth corner 2007D of the outer surface of the fourth corner portion 2219d of the base 2210.

The third outer surface S23 of the base 2210 may be an outer surface between the first corner 2007A of the outer surface of the first corner portion 2219a of the base 2210 and the fourth corner 2007D of the outer surface of the fourth corner portion 2219d of the base 2210.

The fourth outer surface S24 of the base 2210 may be an outer surface between the second corner 2007B of the outer surface of the second corner 2219b of the base 2210 and the third corner 2007C of the outer surface of the third corner portion 2219c of the base 2210.

For example, the first outer surface S21 of the base 2210 may be an outer surface between a first reference line 2501 and a second reference line 2502, the second outer surface S22 of the base 2210 may be an outer surface between a third reference line 2503 and a fourth reference line 2504, the third outer surface S23 of the base 2210 may be an outer surface between the first reference line 2501 and the fourth reference line 2504, and the fourth outer surface S24 of the base 2210 may be an outer surface between the second reference line 2502 and the third reference line 2503.

For example, the first reference line 2501 may be a straight line passing through the corner 2007A of the outer surface of the first corner portion of the base 2210 and the center A1 of the base 2210, the second reference line 2502 may be a straight line passing through the corner 2007B of the outer surface of the second corner portion 2219b of the base 2210 and the center A1 of the base 2210, the third reference line 2503 may be a straight line passing through the corner 2007C of the outer surface of the third corner portion 2219c of the base 2210 and the center A1 of the base 2210, and the fourth reference line 2504 may be a straight line passing through the corner 2007D of the outer surface of the fourth corner portion 2219d of the base 2210 and the center A1 of the base 2210.

The first outer surface S21 and the second outer surface S22 of the base 2210 may be located opposite each other, and the third outer surface S23 and the fourth outer surface S24 of the base 2210 may be located opposite each other.

For example, the center A1 of the base 2210 may be the spatial middle of the base 2210 in a two-dimensional plane perpendicular to the optical axis OA.

For example, the center A1 of the base 2210 may be the center or the spatial middle of the base 2210 in the optical-axis (OA) direction, and may overlap the side portions 2218a to 2218d of the base 2210 and/or the sensing coil 2170 in a direction perpendicular to the optical axis.

Alternatively, for example, the center A1 of the base 2210 may be the spatial middle of the opening 2021 of the base 2210 in a two-dimensional plane perpendicular to the optical axis OA. Alternatively, the center A1 of the base 2210 may be the center or the spatial middle of the opening 2021 of the base 2210 in the optical-axis (OA) direction.

The center A1 of the base 2210 may be a point at which a first center line 2401 and a second center line 2402 are linked to each other.

For example, the first center line 2401 may be a straight line that is parallel to the second-axis direction (e.g. the Y-axis direction) and that passes through the center A1 of the base 2210. For example, the first center line 2401 may be a straight line that is parallel to the outer surface of the third side portion 2218c or the fourth side portion 2218d of the base 2210.

For example, the second center line 2402 may be a straight line that is parallel to the first-axis direction (e.g. the X-axis direction) and that passes through the center A1 of the base 2210. For example, the second center line 2402 may be a straight line that is parallel to the outer surface of the first side portion 2218a or the outer surface of the second side portion 2218b of the base 2210.

The center A2 of the ring portion of the sensing coil 2170 may be the spatial center or the spatial middle of the sensing coil 2170 in a two-dimensional plane perpendicular to the optical axis OA. Hereinafter, the center of the ring portion of the sensing coil 2170 will be referred to as the "center A2 of the sensing coil."

For example, the center A2 of the sensing coil 2170 may be the center or the spatial middle of the sensing coil 2170 in the optical-axis (OA) direction, and may overlap the side portions 2218a to 2218d of the base 2210 and the sensing coil 2170 in a direction perpendicular to the optical axis OA.

Alternatively, for example, the center A2 of the sensing coil 2170 may be the middle of a ring formed by a coil line (or strand) that is located at the innermost side. Alternatively, the center A2 of the sensing coil 2170 may be the middle of a ring formed by a coil line (or strand) that is located at the outermost side.

The center A2 of the sensing coil 2170 may coincide with the center A1 of the base 2210.

Alternatively, for example, the center A2 of the sensing coil 2170 may overlap the center A1 of the base 2210 in the optical-axis direction.

Figure 46:
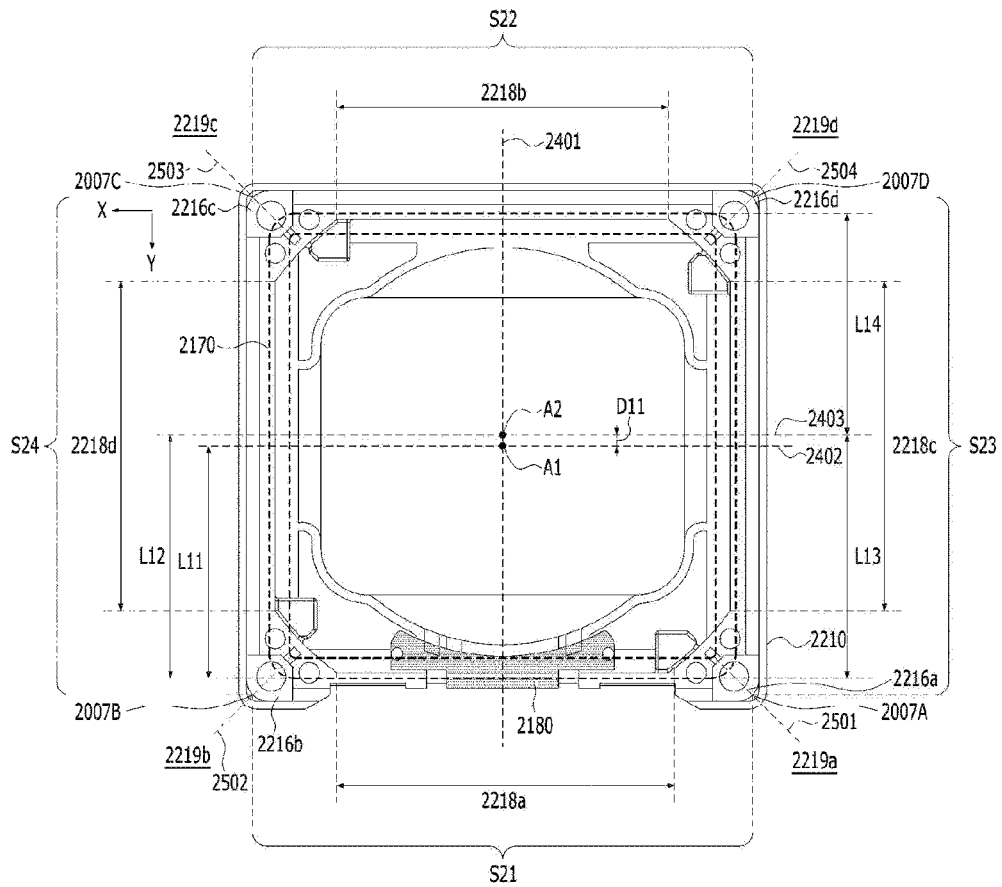
FIG. 46 shows disposition of a base, a sensing coil, and a circuit board according to another embodiment.
Figure 47:
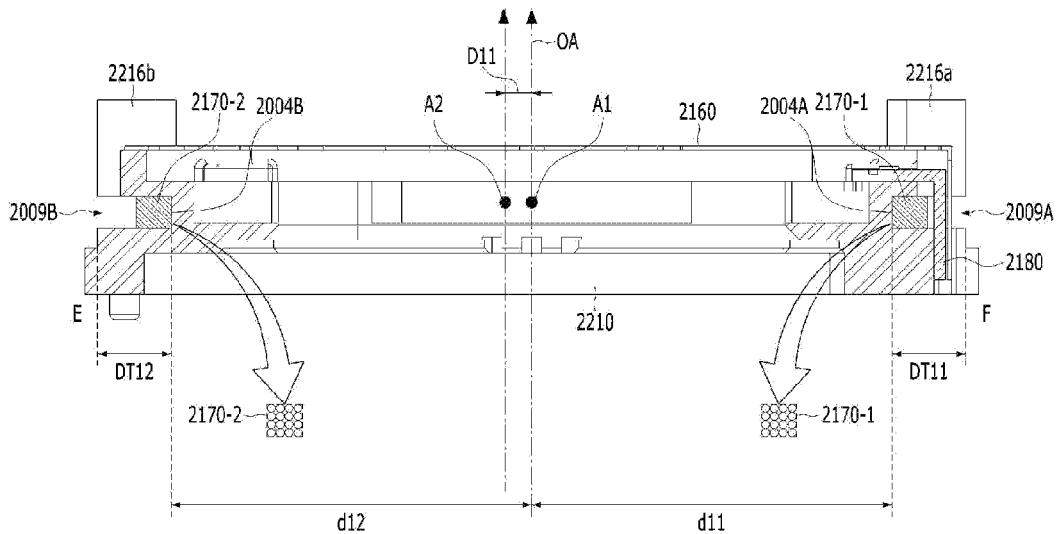
FIG. 47 is a sectional view of FIG. 42 in the EF direction according to the embodiment of FIG. 46.
Figure 48:
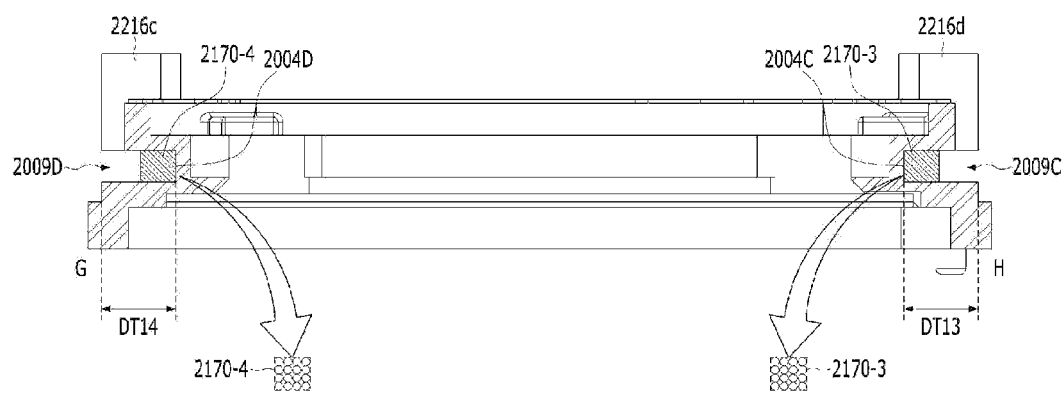
FIG. 48 is a sectional view of FIG. 42 in the GH direction according to the embodiment of FIG. 46.

FIG. 46 shows disposition of a base 2210, a sensing coil 2170, and a circuit board 2180 according to another embodiment, FIG. 47 is a sectional view of FIG. 42 in the EF direction according to the embodiment of FIG. 46, and FIG. 48 is a sectional view of FIG. 42 in the GH direction according to the embodiment of FIG. 46.

Referring to FIGS. 46 to 48, a third center line 2403 may be located between the first center line 2401 and the second side portion 2218b of the base 2210. The third center line 2403 may be a straight line that is parallel to the first-axis direction (e.g. the X-axis direction) and that passes through the center A2 of the sensing coil 2170. For example, the third center line 2403 may be a straight line that is parallel to the outer surface of the first side portion 3218a or the outer surface of the second side portion 2218b of the base 2210.

In addition, for example, an axis that is parallel to the optical axis and that passes through the center A1 of the base 2210 may pass through at least one of the center of the bobbin 2110, the center of the housing 2140, and the optical axis.

The center A2 of the sensing coil 2170 may be spaced apart from the center A1 of the base 2210 by a predetermined distance D11 in the second-axis direction (the Y-axis direction).

The center A1 of the base 2210 may be located between the center A2 of the sensing coil 2170 and the first side portion 2218a of the base 2210. For example, A1 may be located between A2 and the outer surface of the first side portion 2218a of the base 2210 (or the first outer surface S21).

The distance L11 from the outer surface of the first side portion 2218a of the base 2210 to the center A1 of the base 2210 is less than the distance L12 from the first outer surface S21 of the base 2210 (or the outer surface of the first side portion 2218a of the base 2210) to the center A2 of the sensing coil 2170 (L11<L12).

Alternatively, the center A2 of the sensing coil 2170 may be located between the second side portion 2218b of the base 2210 and the center A1 of the base 2210. For example, A2 may be located between the second outer surface of the base 2210 (or the outer surface of the second side portion 2218b of the base 2210) and A1.

The distance L13 from the center A2 of the sensing coil 2170 to the first outer surface S21 of the base 2210 (or the outer surface of the first side portion 2218a of the base 2210) may be greater than the distance L14 from the center A2 of the sensing coil 2170 to the second outer surface of the base 2210 (or the outer surface of the second side portion 2218b of the base 2210) (L13>L14).

In addition, the distance from the third outer surface of the base 2210 (or the outer surface of the third side portion 2218c of the base 2210) to the center A1 of the base 2210 may be equal to the distance from the third outer surface of the base 2210 (or the outer surface of the third side portion 2218c of the base 2210) to the center A2 of the sensing coil 2170. However, the disclosure is not limited thereto. In another embodiment, the two may be different from each other.

In addition, the distance from the fourth outer surface S24 of the base 2210 (or the outer surface of the fourth side portion 2218d of the base 2210) to the center A1 of the base 2210 may be equal to the distance from the fourth outer surface S24 of the base 2210 (or the outer surface of the fourth side portion 2218d of the base 2210) to the center A2 of the sensing coil. However, the disclosure is not limited thereto. In another embodiment, the two may be different from each other.

Referring to FIG. 47, the depth DT11 of the first recess 2009A formed in the first outer surface S21 of the base 2210 or the outer surface of the first side portion 2218a of the base 2210 may be greater than the depth DT12 of the second recess 2009B formed in the second outer surface S22 of the base 2210 or the outer surface of the second side portion 2218b of the base 2210 (DT11>DT12).

Hereinafter, the depth DT11 of the first recess may be the distance from the first outer surface of the base 2210 (or the outer surface of the first side portion 2218a of the base 2210) to the bottom surface 2004A of the first recess 2009A, and the depth DT12 of the second recess 2009B may be the distance from the second outer surface S22 of the base 2210 (or the outer surface of the second side portion 2218b of the base 2210) to the bottom surface 2004B of the second recess 2009B.

For example, the distance d11 from the center A1 of the base 2210 to a first portion 2170-1 of the sensing coil 2170 (or the bottom surface 2004A of the first recess 2009A) may be less than the distance d12 from the center A1 of the base 2210 to a second portion 2170-2 of the sensing coil 2170 (or the bottom surface 2004B of the second recess 2009B) (d11<d12).

For example, d11 (or d12) may be the distance from A1 to the innermost strand of the first portion 2170-1 (or the second portion 2170-2 of the sensing coil 2170. For example, the innermost strand may be the strand that abuts the bottom surface 2004A of the first recess 2009A or the bottom surface 2004B of the second recess 2009B and that is the closest to A1.

Referring to FIG. 48, the depth DT13 of the third recess 2009C formed in the third outer surface S23 of the base 2210 or the outer surface of the third side portion 2218c of the base 2210 may be equal to the depth DT14 of the fourth recess 2009D formed in the fourth outer surface S24 of the base 2210 or the outer surface of the fourth side portion 2218d of the base 2210 (DT13=DT14).

The depth DT13 of the third recess 2009C may be the distance from third outer surface S23 of the base 2210 (or the outer surface of the third side portion 2218c of the base 2210) to the bottom surface 2004C of the third recess 2009C, and the depth DT14 of the fourth recess 2009D may be the distance from fourth outer surface S24 of the base 2210 (or the outer surface of the fourth side portion 2218d of the base 2210) to the bottom surface 2004D of the fourth recess 2009D.

In addition, each of DT13 and DT14 may be less than DT11. However, the disclosure is not limited thereto. In another embodiment, each of the depth of the third recess and the depth of the fourth recess may be equal to or greater than the depth of the first recess.

The number of windings of the first portion 2170-1 of the sensing coil 2170 disposed in the first recess 2009A of the base 2210 may be equal to the number of windings of the second portion 2170-2 of the sensing coil 2170 disposed in the second recess 2009B of the base 2210.

In addition, the number of windings of the third portion 2170-3 of the sensing coil 2170 disposed in the third recess 2009C of the base 2210 may be equal to the number of windings of the fourth portion 2170-4 of the sensing coil 2170 disposed in the fourth recess 2009D of the base 2210.

For example, the numbers of windings of the first to fourth portions 2170-1 to 2170-4 of the sensing coil 2170 disposed in the first to fourth recesses 2009A to 2009D may be equal to each other. For example, the numbers of windings of the first to fourth portions 2170-1 to 2170-4 of the sensing coil 2170 disposed in the first to fourth recesses 2009A to 2009D of the base 2210 in a direction perpendicular to the optical axis OA may be equal to each other. However, the disclosure is not limited thereto. In another embodiment, the number of windings of at least one of the first to fourth portions 2170-1 to 2170-4 in the direction perpendicular to the optical axis OA may be different from the numbers of windings of the other portions.

In addition, for example, the numbers of windings of the first to fourth portions 2170-1 to 2170-4 of the sensing coil 2170 disposed in the first to fourth recesses 2009A to 2009D of the base 2210 in the optical-axis (OA) direction may be equal to each other. However, the disclosure is not limited thereto. In another embodiment, the number of windings of at least one of the first to fourth portions 2170-1 to 2170-4 in the optical-axis (OA) direction may be different from the numbers of windings of the other portions.

Generally, in a structure in which a sensing coil is disposed or wound in a recess formed in the outer surface of a base and terminals for connection with the outside are disposed on a portion of the outer surface of the base, the number of windings of the sensing coil may be limited due to spatial interference between the sensing coil and the terminals for connection with the outside, whereby induced voltage generated in the sensing coil may be reduced and sensing sensitivity and sensing accuracy may be deteriorated.

In the embodiment, however, the center A2 of the sensing coil 2170 disposed in the recess 2201 of the base 2210 is biased to the second outer surface S22, located opposite the first outer surface S21 of the base 2210 at which the terminals 2081 and 2082 of the circuit board 2180 are disposed, more than the center A1 of the base 2210, whereby it is possible to prevent the number of turns of the sensing coil 2170 from being limited due to spatial interference with the terminals 2081 and 2082 of the circuit board 2180.

That is, as described with reference to FIG. 47, the depth DT11 of the first recess 2009A formed in the first outer surface S21 of the base 2210 is greater than the depth DT12 of the second recess 2009B formed in the second outer surface S22 of the base 2210 (DT11>DT12), whereby it is possible to prevent the number of turns of the sensing coil 2170 from being limited due to spatial interference with the terminals 2081 and 2082 of the circuit board 2180.

Figure 49:
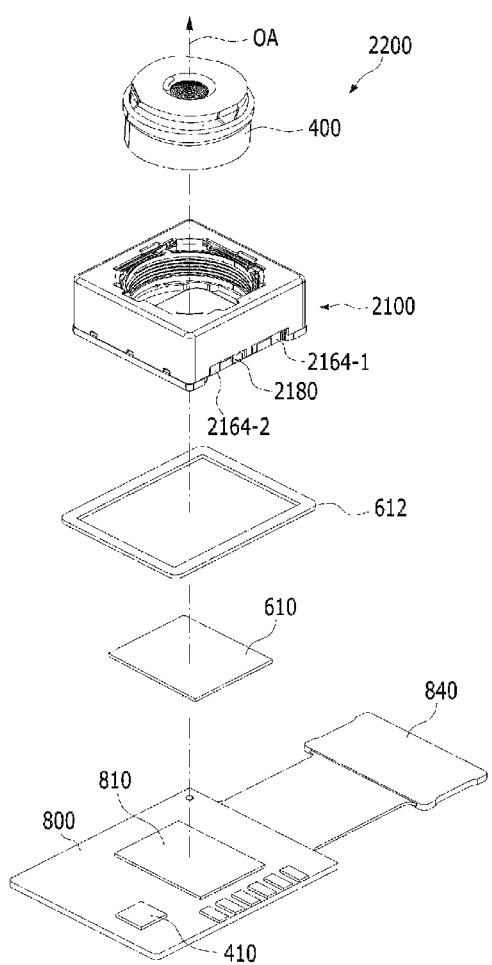
FIG. 49 is an exploded perspective view of a camera module according to a further embodiment.

FIG. 49 is an exploded perspective view of a camera module 2200 according to a further embodiment.

Reference numerals of FIG. 49 identical to those of FIG. 19 denote the same components, and a description of the same components will be briefly given or omitted.

Referring to FIG. 49, the camera module 2200 may include a lens module 400, a lens moving apparatus 2100, an adhesive member 612, a filter 610, a circuit board 800, an image sensor 810, a controller 410, and a connector 840.

The circuit board 800 may be connected to a coil 2120 and a sensing coil 2170 of the lens moving apparatus 2100.

For example, the circuit board 800 may be provided with terminals connected to first and second terminals 2164-1 and 2164-2 of a lower elastic member 2160 and first and second terminals 2081 and 2082 of the lens moving apparatus 2100.

Meanwhile, the lens moving apparatuses according to the above embodiments may be used in various fields, such as a camera module or an optical instrument.

For example, the lens moving apparatus 100 according to the embodiment may be included in an optical instrument configured to form an image of an object in a space using reflection, refraction, absorption, interference, diffraction, etc., which are characteristics of light, to increase the visual power of the eyes, to record or reproduce an image formed by a lens, to perform optical measurement, or to propagate or transfer an image. For example, an optical instrument according to an embodiment may be a cellular phone, a mobile phone, a smartphone, a portable smart device, a digital camera, a laptop computer, a digital broadcasting terminal, a personal digital assistant (PDA), a portable multimedia player (PMP), a navigation device, etc. However, the disclosure is not limited thereto. Any device capable of capturing an image or taking a photograph may be used.

Figure 50:
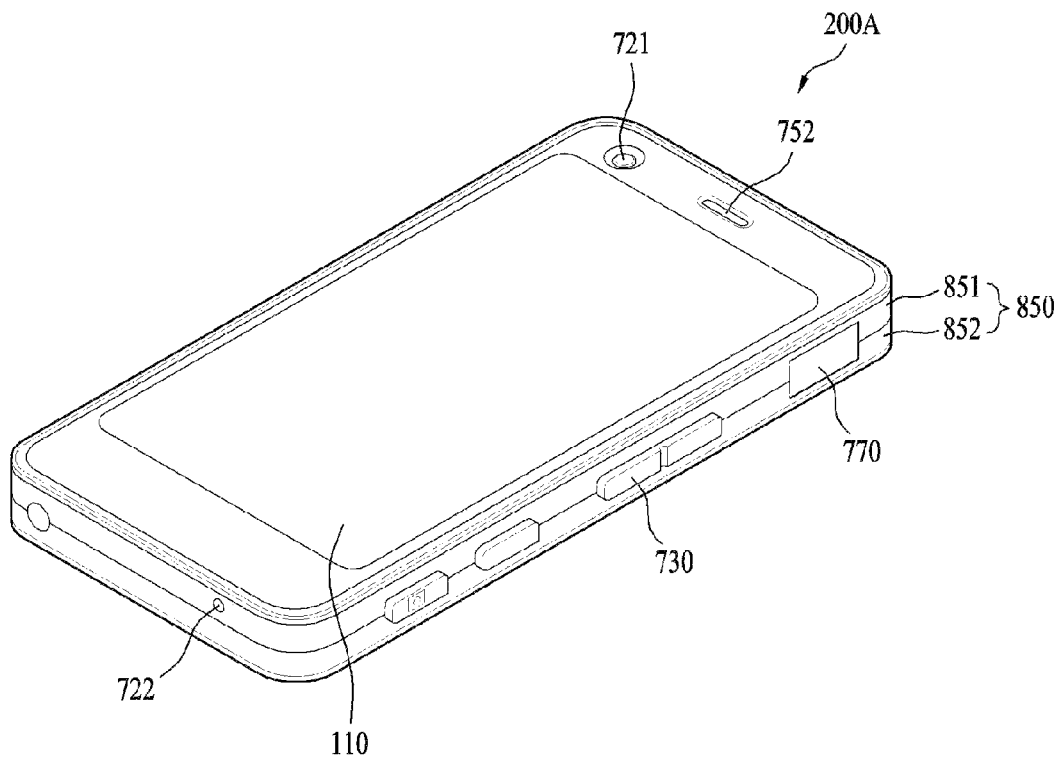
FIG. 50 is a perspective view of a portable terminal according to an embodiment.
Figure 51:
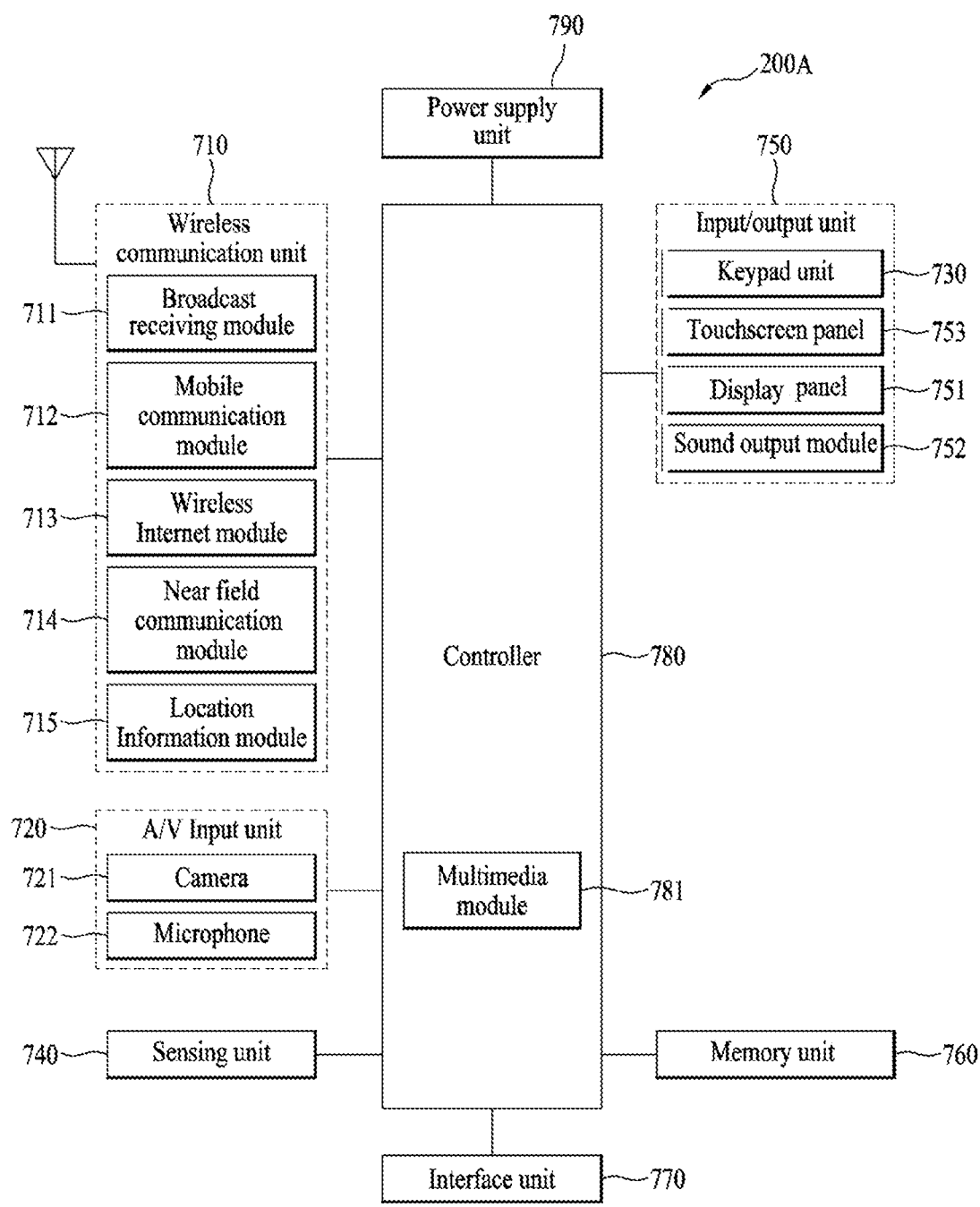
FIG. 51 is a view showing construction of the portable terminal shown in FIG. 50.

FIG. 50 is a perspective view of a portable terminal 200A according to an embodiment, and FIG. 51 shows construction of the portable terminal shown in FIG. 50.

Referring to FIGS. 50 and 51, the portable terminal 200A (hereinafter referred to as a "terminal") may include a body 850, a wireless communication unit 710, an A/V input unit 720, a sensing unit 740, an input/output unit 750, a memory unit 760, an interface unit 770, a controller 780, and a power supply unit 790.

The body 850 shown in FIG. 50 has a bar shape; however, the disclosure is not limited thereto. The body may have any of various structures, such as a slide type structure, a folder type structure, a swing type structure, and a swivel type structure, in which two or more sub-bodies are coupled so as to be movable relative to each other.

The body 850 may include a case (casing, housing, cover, etc.) that defines the external appearance thereof. For example, the body 850 may be divided into a front case 851 and a rear case 852. Various electronic parts of the terminal may be mounted in a space defined between the front case 851 and the rear case 852.

The wireless communication unit 710 may include one or more modules that enable wireless communication between the terminal 200A and a wireless communication system or between the terminal 200A and a network in which the terminal 200A is located. For example, the wireless communication unit 710 may include a broadcast reception module 711, a mobile communication module 712, a wireless Internet module 713, a nearfield communication module 714, and a location information module 715.

The A/V (audio/video) input unit 720, which is provided to input an audio signal or a video signal, may include a camera 721 and a microphone 722.

The camera 721 may include the camera module 200, 1200, or 2200 according to the embodiment shown in FIG. 19, 33, or 49.

The sensing unit 740 may sense the current state of the terminal 200A, such as the opening and closing state of the terminal 200A, the position of the terminal 200A, whether a user contacts the terminal, the orientation of the terminal 200A, or acceleration/deceleration of the terminal 200A, in order to generate a sensing signal for controlling the operation of the terminal 200A. For example, in the case in which the terminal 200A is a slide phone, the sensing unit may sense whether the slide phone is open or closed. In addition, the sensing unit senses whether power is supplied from the power supply unit 790 and whether the interface unit 770 is coupled to an external instrument.

The input/output unit 750 is provided to generate input or output related to visual sensation, audible sensation, or tactile sensation. The input/output unit 750 may generate input data for controlling the operation of the terminal 200A, and may display information processed by the terminal 200A.

The input/output unit 750 may include a keypad unit 730, a display panel 751, a sound output module 752, and a touchscreen panel 753. The keypad unit 730 may generate input data through keypad input.

The display panel 751 may include a plurality of pixels, the color of which is changed according to an electrical signal. For example, the display panel 751 may include at least one of a liquid crystal display, a thin film transistor-liquid crystal display, an organic light-emitting diode, a flexible display, or a three-dimensional (3D) display.

The sound output module 752 may output audio data received from the wireless communication unit 710 in a call signal reception mode, a telephone communication mode, a recording mode, a voice recognition mode, or a broadcast reception mode, or may output audio data stored in the memory unit 760.

The touchscreen panel 753 may convert a change in capacitance due to a user's touch on a specific region of the touchscreen into an electrical input signal.

The memory unit 760 may store a program for processing and control of the controller 780, and may temporarily store input/output data (for example, a telephone directory, messages, audio, still images, photographs, and video). For example, the memory unit 760 may store images, such as photographs or video, captured by the camera 721.

The interface unit 770 functions as a path for connection between the terminal 200A and an external instrument. The interface unit 770 may receive data from the external instrument, may receive electric power and transmit the received electric power to internal components of the terminal 200A, or may transfer data in the terminal 200A to the external instrument. For example, the interface unit 770 may include a wired/wireless headset port, an external charger port, a wired/wireless data port, a memory card port, a port for connection with an apparatus having an identification module, an audio input/output (I/O) port, a video input/output (I/O) port, and an earphone port.

The controller 780 may control the overall operation of the terminal 200A. For example, the controller 780 may perform related control and processing for voice communication, data communication, and video communication.

The controller 780 may have a multimedia module 781 for multimedia reproduction. The multimedia module 781 may be realized in the controller 780 or may be realized separately from the controller 780.

The controller 780 may perform pattern recognition processing to recognize writing input or drawing input performed on the touchscreen as text or an image, respectively.

The power supply unit 790 may receive external power and internal power and supply required power to respective components under control of the controller 780.

The features, structures, and effects described in the above embodiments are included in at least one embodiment, but are not limited only to one embodiment. Furthermore, features, structures, and effects illustrated in each embodiment may be combined or modified in other embodiments by those skilled in the art to which the embodiments pertain. Therefore, it is to be understood that such combinations and modifications fall within the scope of the present disclosure.

INDUSTRIAL APPLICABILITY

Embodiments may be used in a lens moving apparatus, a camera module, and an optical instrument capable of improving convenience in soldering and inhibiting deformation of an elastic member, preventing the occurrence of electrical short circuit between a terminal of a lower elastic member and a sensing coil, and preventing the number of turns of a sensing coil from being limited by spatial interference with terminals disposed on a base.

The invention claimed is:
1. A lens moving apparatus comprising:
a bobbin;
a first coil coupled to the bobbin;
a magnet opposite the first coil;
a base disposed spaced apart from the bobbin;
a lower elastic member coupled to the bobbin, the lower elastic member comprising a first elastic member and a second elastic member disposed on the base;
a second coil disposed on the base, the second coil being configured to generate induced voltage through interaction with the first coil; and
a first terminal and a second terminal coupled to the base, the first terminal and the second terminal being spaced apart from the first and second elastic members,
wherein a first portion of the first coil is coupled to the first elastic member and a second portion of the first coil is coupled to the second elastic member,
wherein each of the first and second terminals comprises:
a first portion exposed from an upper surface of the base; and
a second portion connected to the first portion, the second portion being bent in a lateral direction of the base, and wherein a first portion of the second coil is coupled to the first portion of the first terminal and a second portion of the second coil is coupled to the first portion of the second terminal.

2. The lens moving apparatus according to claim 1, wherein each of the first and second elastic members comprises:
an inner portion coupled to a lower portion of the bobbin;
an outer portion coupled to a lower portion of the housing;
a connection portion configured to connect the inner portion and the outer portion to each other; and
a connection terminal connected to the outer portion, the connection terminal being disposed on a first outer surface of the base.

3. The lens moving apparatus according to claim 2, wherein the second portion of the first terminal and the second portion of the second terminal are disposed on the first outer surface of the base.

4. The lens moving apparatus according to claim 3, wherein the second portion of the first terminal and the second portion of the second terminal are disposed between the connection terminal of the first elastic member and the connection terminal of the second elastic member.

5. The lens moving apparatus according to claim 1, wherein the second coil is disposed between the base and the lower elastic member.

6. The lens moving apparatus according to claim 1, wherein
the base is provided in an outer surface thereof with a recess, and
the second coil is disposed in the recess of the base.

7. The lens moving apparatus according to claim 1, wherein the first portion of each of the first and second terminals comprises:
a first region overlapping the second coil in an optical-axis direction; and
a second region not overlapping the second coil in the optical-axis direction.

8. The lens moving apparatus according to claim 7, further comprising:
a first solder configured to couple the second region of the first terminal and the first portion of the second coil to each other; and
a second solder configured to couple the second region of the second terminal and the second portion of the second coil to each other.

9. The lens moving apparatus according claim 1, wherein each of the first and second terminals further comprises a bent portion configured to connect the first portion and the second portion to each other, and
the bent portion is disposed in the base.

10. A lens moving apparatus comprising:
a bobbin;
a first coil coupled to the bobbin;
a magnet opposite the first coil;
a base disposed to be spaced apart from the bobbin;
a lower elastic member comprising first and second elastic members coupled to the bobbin;
a second coil coupled to the base; and
first and second terminals disposed on a first side portion of the base and spaced apart from the first and second elastic members,
wherein a first portion of the first coil is coupled to the first elastic member and a second portion of the first coil is coupled to the second elastic member, and a first portion of the second coil is coupled to the first terminal and a second portion of the second coil is coupled to the second terminal, wherein the first elastic member comprises a first connection terminal disposed on the first side portion of the base and the second elastic member comprises a second connection terminal disposed on the first side portion of the base, wherein each of the first and second terminals comprises:
- a first portion exposed from an upper surface of the base; and
- a second portion bent from the first portion and disposed on an outer surface of the first side portion of the base, and wherein the first portion of the second coil is coupled to the first portion of the first terminal and the second portion of the second coil is coupled to the first portion of the second terminal.

11. The lens moving apparatus according to claim 10, wherein the second coil comprise a shape corresponding to a shape of the first coil.

12. The lens moving apparatus according to claim 10, wherein the second coil is larger than an outer diameter of the bobbin and disposed under the bobbin.

13. The lens moving apparatus according to claim 10, wherein the second coil is configured to generate induced voltage through interaction with the first coil.

14. The lens moving apparatus according to claim 10, wherein the second portion of the first terminal and the second portion of the second terminal are disposed between the first connection terminal and the second connection terminal.

15. The lens moving apparatus according to claim 10, wherein the first portion of the base is overlapped with the second coil in an optical-axis direction.

16. The lens moving apparatus according to claim 10, wherein the base comprises a first depressed portion and a second depressed portion formed in an outer surface of the first side portion, and wherein the first connection terminal is disposed in the first depressed portion and the second connection terminal is disposed in the second depressed portion.

17. A lens moving apparatus comprising:
a base;
a bobbin disposed on the base;
a first coil coupled to the bobbin;
a magnet opposite the first coil;
a second coil disposed on the base and configured to generate induced voltage through interaction with the first coil; and
a first terminal and a second terminal coupled to the base,
wherein each of the first and second terminals comprises:
- a first portion exposed from an upper surface of the base; and
- a second portion connected to the first portion, the second portion being bent in a lateral direction of the base, and wherein a first portion of the second coil is coupled to the first portion of the first terminal and a second portion of the second coil is coupled to the first portion of the second terminal.

18. A camera module comprising:
a lens;
the lens moving apparatus according to claim 1; and
an image sensor.

* * * * *